(12) United States Patent
Haneda et al.

(10) Patent No.: US 8,168,532 B2
(45) Date of Patent: May 1, 2012

(54) METHOD OF MANUFACTURING A MULTILAYER INTERCONNECTION STRUCTURE IN A SEMICONDUCTOR DEVICE

(75) Inventors: Masaki Haneda, Kawasaki (JP); Michie Sunayama, Kawasaki (JP); Noriyoshi Shimizu, Kawasaki (JP); Nobuyuki Ohtsuka, Kawasaki (JP); Yoshiyuki Nakao, Kawasaki (JP); Takahiro Tabira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 203 days.

(21) Appl. No.: 12/267,970

(22) Filed: Nov. 10, 2008

(65) Prior Publication Data
US 2009/0121355 A1 May 14, 2009

(30) Foreign Application Priority Data

Nov. 14, 2007 (JP) ................................ 2007-295778
Jun. 23, 2008 (JP) ................................ 2008-163798

(51) Int. Cl.
*H01L 21/768* (2006.01)
*H01L 23/538* (2006.01)
*H01L 23/532* (2006.01)

(52) U.S. Cl. .. 438/653; 438/675; 257/751; 257/E21.584
(58) Field of Classification Search .......... 438/652–654, 438/656, 674, 675, 677, 687; 257/751, E23.142, 257/E21.409, E21.584
See application file for complete search history.

(56) References Cited

U.S. PATENT DOCUMENTS

| | | | |
|---|---|---|---|
| 6,136,707 A | 10/2000 | Cohen | |
| 6,664,179 B2 | 12/2003 | Akbar et al. | |
| 6,805,138 B2 | 10/2004 | Akbar et al. | |
| 2002/0129879 A1 | 9/2002 | DeHaven et al. | |
| 2004/0082169 A1 | 4/2004 | Chooi et al. | |
| 2004/0175936 A1 | 9/2004 | Hirao et al. | |
| 2005/0023703 A1* | 2/2005 | Sebesta et al. | 257/780 |
| 2005/0218519 A1* | 10/2005 | Koike et al. | 257/756 |
| 2006/0157857 A1 | 7/2006 | Lane et al. | |
| 2006/0270233 A1* | 11/2006 | Xia et al. | 438/690 |
| 2007/0020931 A1 | 1/2007 | Koura et al. | |
| 2007/0238294 A1 | 10/2007 | Beyer et al. | |

(Continued)

FOREIGN PATENT DOCUMENTS

JP 2000-91271 A 3/2000

(Continued)

OTHER PUBLICATIONS

Chinese Office Action dated Nov. 6, 2009, issued in corresponding Chinese Patent Application No. 200810176660.

(Continued)

*Primary Examiner* — Ha Tran T Nguyen
*Assistant Examiner* — Raj R Gupta
(74) *Attorney, Agent, or Firm* — Westerman, Hattori, Daniels & Adrian, LLP

(57) ABSTRACT

A semiconductor device includes a semiconductor substrate, an oxygen-containing insulating film disposed above the above-described semiconductor substrate, a concave portion disposed in the above-described insulating film, a copper-containing first film disposed on an inner wall of the above-described concave portion, a copper-containing second film disposed above the above-described first film and filled in the above-described concave portion, and a manganese-containing oxide layer disposed between the above-described first film and the above-described second film. Furthermore, a copper interconnection is formed on the above-described structure by an electroplating method and, subsequently, a short-time heat treatment is conducted at a temperature of 80° C. to 120° C.

13 Claims, 47 Drawing Sheets

U.S. PATENT DOCUMENTS

| | | |
|---|---|---|
| 2008/0142974 A1 | 6/2008 | Arakawa et al. |
| 2009/0101495 A1 | 4/2009 | Aoki et al. |

FOREIGN PATENT DOCUMENTS

| | | |
|---|---|---|
| JP | 2001-160590 A | 6/2001 |
| JP | 2003-218198 A | 7/2003 |
| JP | 2004-111926 A | 4/2004 |
| JP | 2004-153274 A | 5/2004 |
| JP | 2005-51185 A | 2/2005 |
| JP | 2006-24943 A | 1/2006 |
| JP | 2007-27259 A | 2/2007 |
| JP | 2007-059660 A | 3/2007 |
| JP | 2007-141927 A | 6/2007 |
| JP | 2007-142236 A | 6/2007 |
| JP | 2007-173511 A | 7/2007 |
| JP | 2007-281485 A | 10/2007 |
| WO | 2007/020981 A1 | 2/2007 |

OTHER PUBLICATIONS

Korean office Action dated Sep. 17, 2010, issued in corresponding Korean Patent Application No. 10-2008-0111995.
Chinese Office Action dated Nov. 9, 2010, issued in corresponding Chinese Patent Application No. 200810176660.X.

* cited by examiner

PRIOR ART

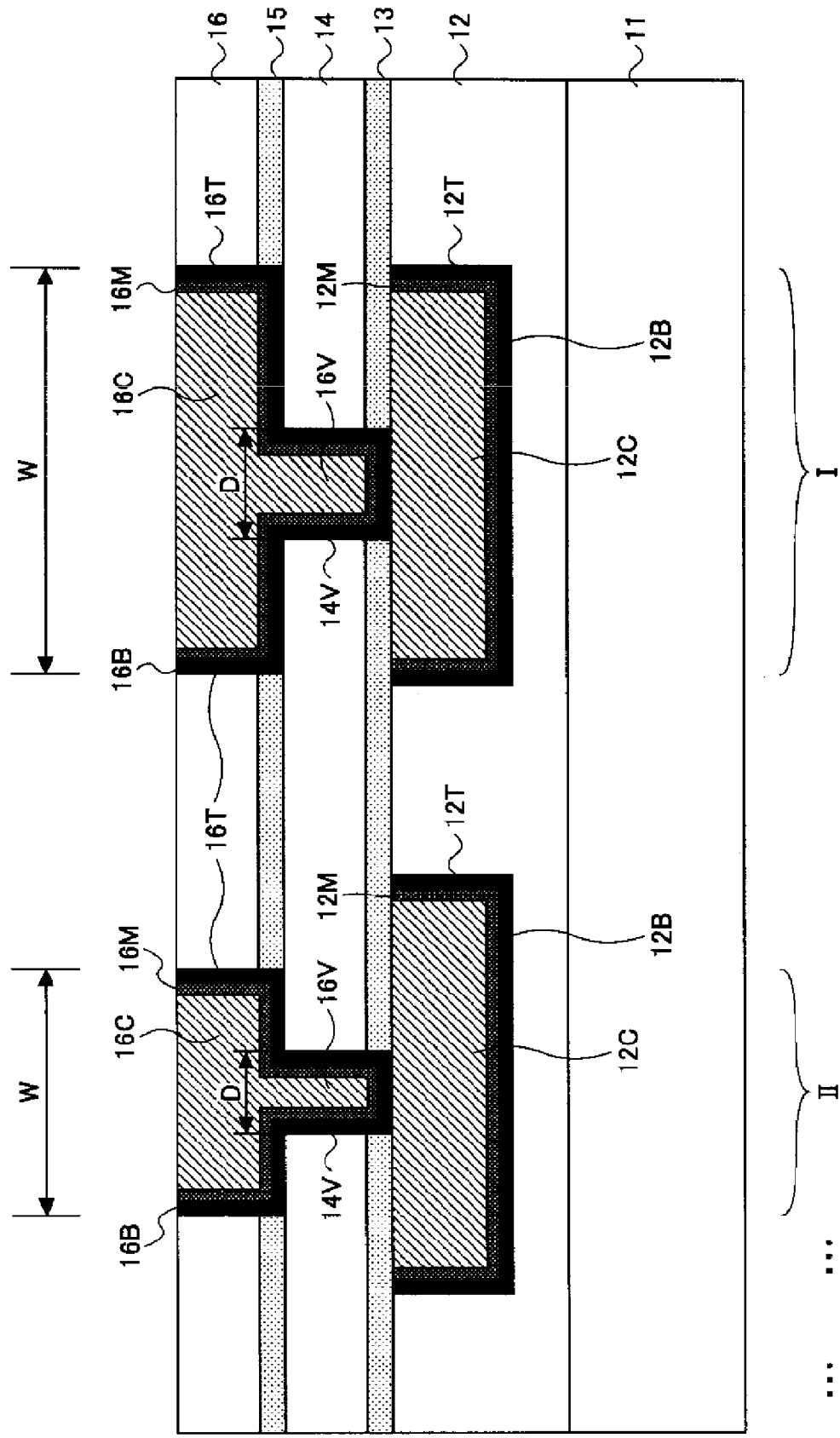

Cu interconnection pattern after electroplating

Cu interconnection pattern void after heat treatment

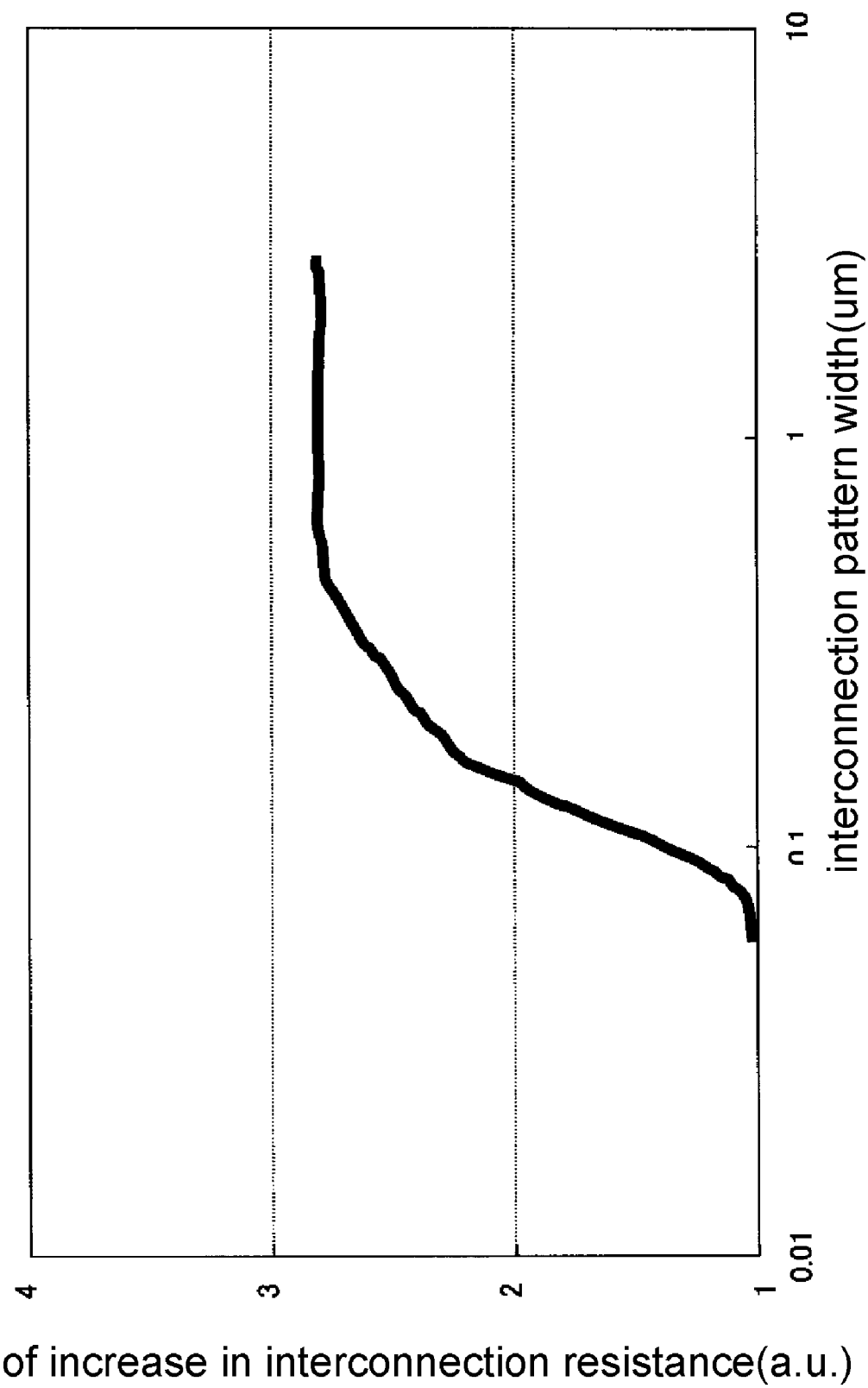

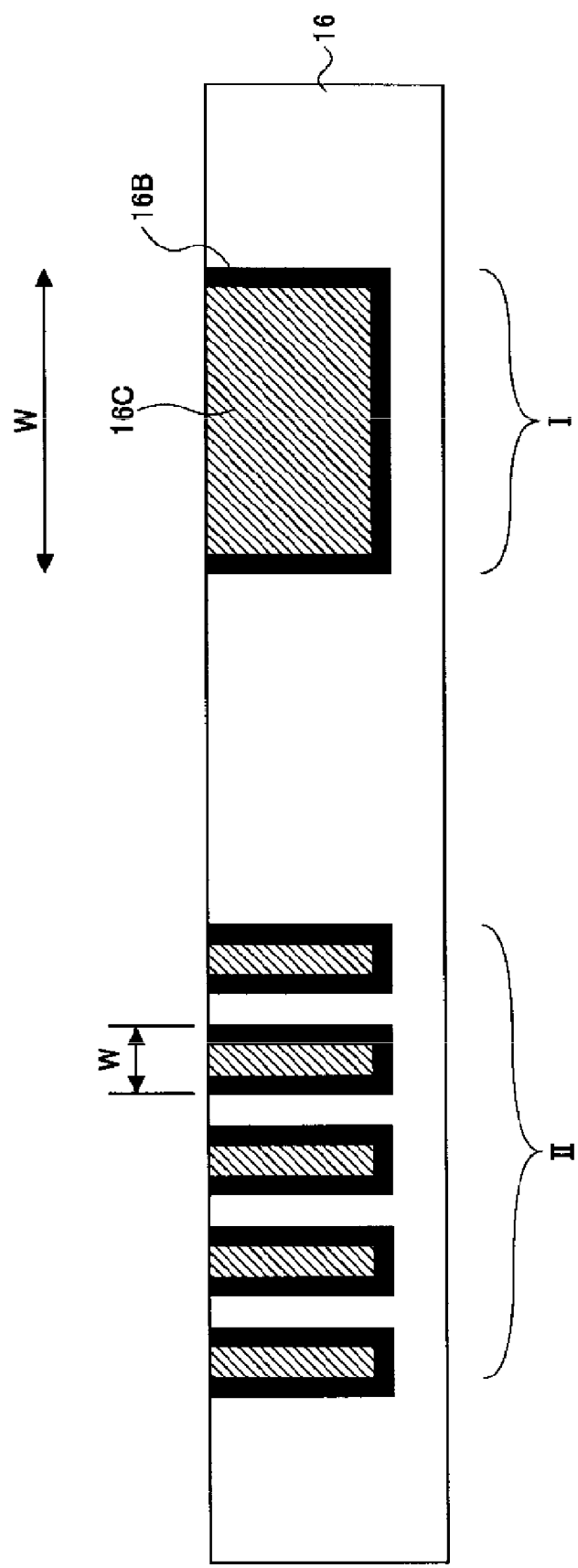

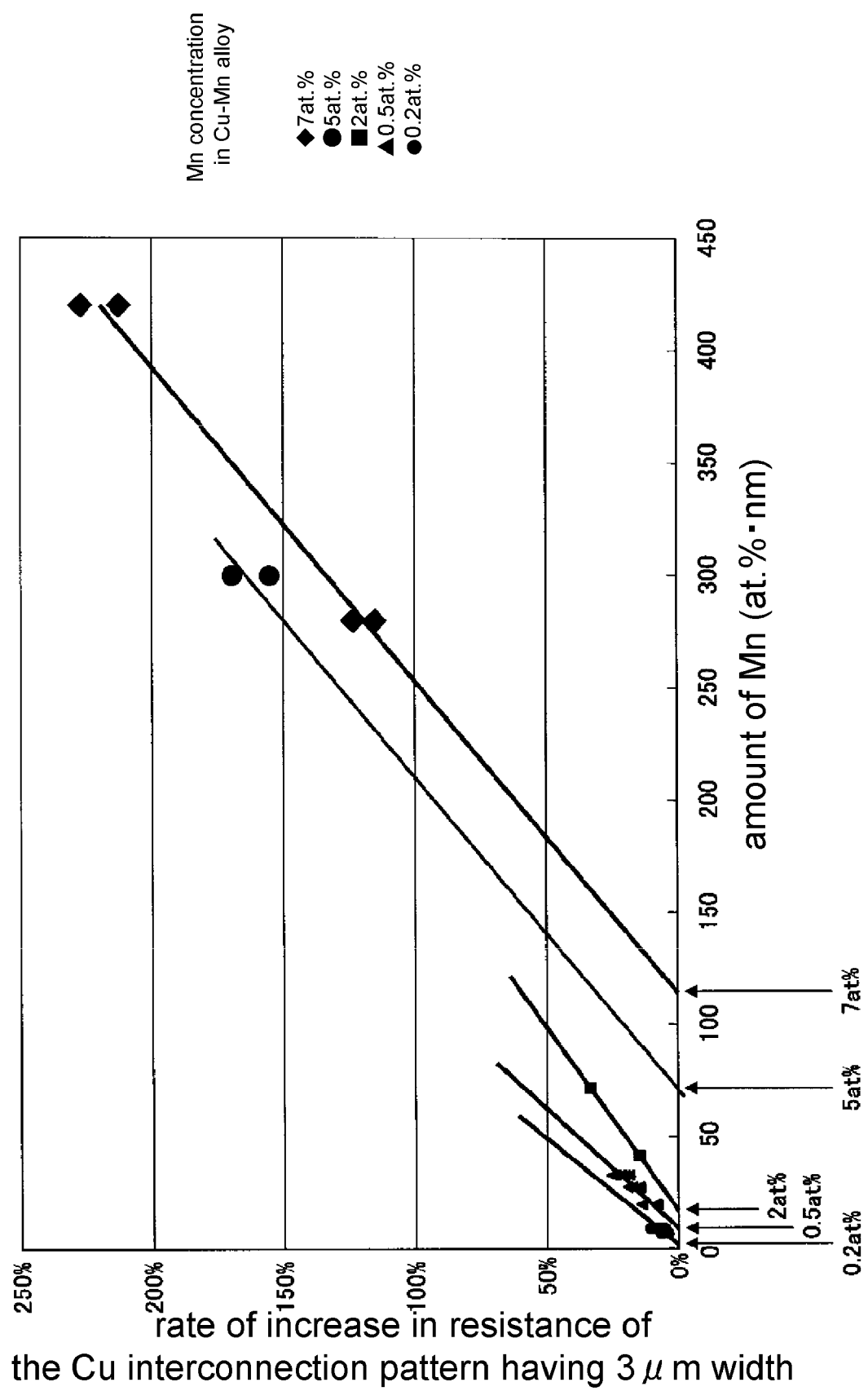

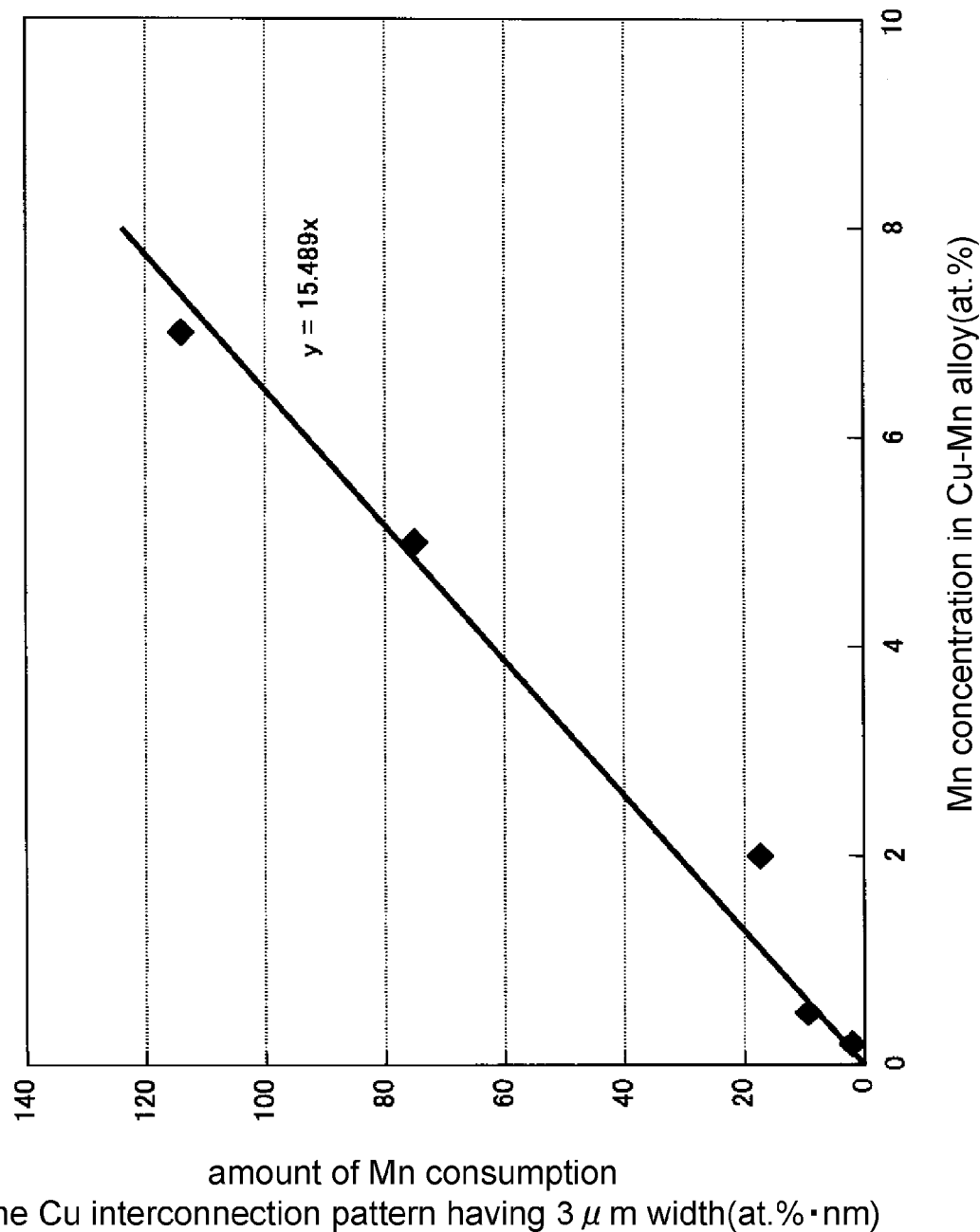

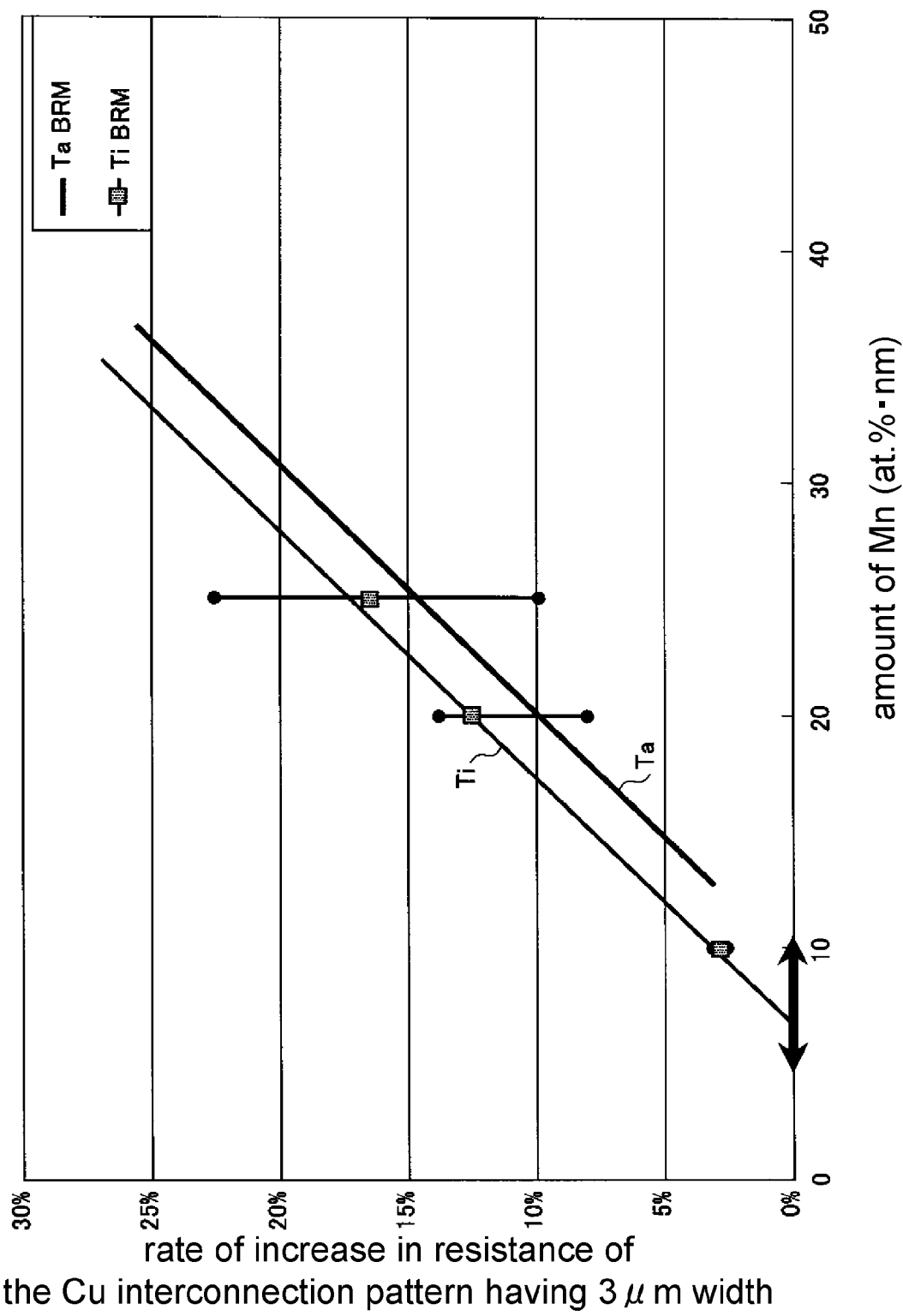

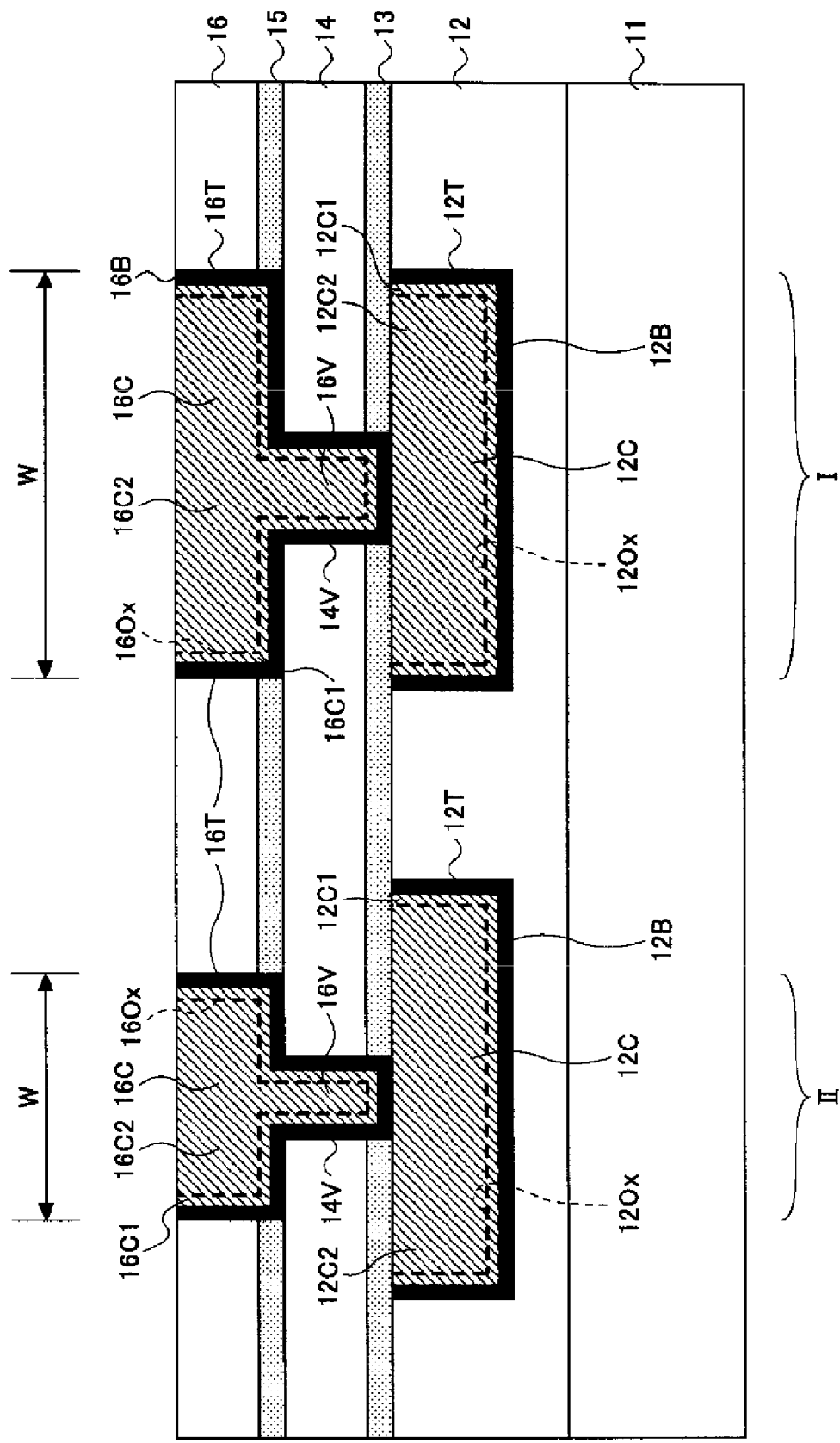

METHOD OF MANUFACTURING A MULTILAYER INTERCONNECTION STRUCTURE IN A SEMICONDUCTOR DEVICE

CROSS REFERENCE TO RELATED APPLICATION

This application is based upon and claims the benefit of priority from the prior Japanese Patent Application NO. 2008-163798 filed on Jun. 23, 2008, and the prior Japanese Patent Application NO. 2007-295778 filed on Nov. 14, 2007, the entire contents of which are incorporated herein by reference.

BACKGROUND

1. Field

The present invention relates to a semiconductor device. In particular, the present invention relates to a semiconductor device having a multilayer interconnection structure and a method for manufacturing the same.

2. Description of the Related Art

In a present-day semiconductor integrated circuit device, a number of semiconductor elements are disposed on a common substrate and a multilayer interconnection structure is used for mutually connecting them.

In the multilayer interconnection structure, interlayer insulating films, in which an interconnection pattern for constituting an interconnection layer is embedded, are laminated. In the above-described multilayer interconnection structure, a lower interconnection layer and an upper interconnection layer are connected through a via contact disposed in the interlayer insulating film.

In particular, regarding a recent ultrafine, very high speed semiconductor device, a low dielectric constant film (so-called low-k film) is used as an interlayer insulating film in order to reduce a signal delay (RC delay:resister-capacitor delay) problem in the multilayer interconnection structure. In addition to this, a low resistance copper (Cu) pattern is used as an interconnection pattern.

Regarding the multilayer interconnection structure in which the Cu interconnection pattern is embedded in the low dielectric constant interlayer insulating film, as described above, since patterning of the Cu layer through dry etching is difficult, a so-called damascene process or dual damascene process is employed, in which an interconnection groove or a via hole is formed in the interlayer insulating film in advance. In the damascene process or the dual damascene process, the thus formed interconnection groove or via hole is filled with a Cu layer and, thereafter, an excess Cu layer on the interlayer insulating film is removed by chemical mechanical polishing (CMP).

At that time, if the Cu interconnection pattern contacts the interlayer insulating film directly, Cu atoms diffuse into the interlayer insulating film so as to cause a short-circuit problem and the like. Therefore, in general, the side wall surface and the bottom surface of the interconnection groove or the via hole, in which the Cu interconnection pattern is disposed, are covered with an electrically conductive diffusion barrier, i.e. a so-called barrier metal film, and a Cu layer is deposited on such a barrier metal film. As for the barrier metal film, generally, high melting point metals, e.g., tantalum (Ta), titanium (Ti), and tungsten (W), or electrically conductive nitrides of these high melting point metals are used.

On the other hand, regarding recent 45-nm-generation and later ultrafine, very high speed semiconductor devices, the sizes of the interconnection grooves or the via holes formed in the interlayer insulating films have been reduced significantly along with miniaturization.

Consequently, in the case where a desired reduction of interconnection resistance by using the above-described barrier metal film having a large resistivity is intended, it is necessary to minimize the film thickness of the barrier metal film formed in the fine interconnection groove or via hole.

On the other hand, it is necessary that the side wall surface and the bottom surface of the interconnection groove or the via hole are continuously covered with the barrier metal film.

Under such circumstances, in Japanese Laid-open Patent Publication No. 2003-218198, an interconnection groove or a via hole formed in an interlayer insulating film is covered directly with a copper manganese alloy layer (Cu—Mn alloy layer).

Japanese Laid-open Patent Publication No. 2003-218198 describes a technology of forming a manganese silicon oxide layer having a thickness of 2 nm to 3 nm and a composition of $MnSi_xO_y$ as a diffusion barrier film at an interface between the above-described Cu—Mn alloy layer and the interlayer insulating film through a self-organization reaction between Mn in the above-described Cu—Mn alloy layer and Si and oxygen in the interlayer insulating film.

However, regarding this technology, a problem is recognized in that the self-organized layer has a composition of $MnSi_xO_y$, the concentration of metal element, i.e. manganese (Mn), contained in the film is low and, for this reason, the adhesion to the Cu film is insufficient.

Therefore, Japanese Laid-open Patent Publication No. 2007-27259 describes a barrier metal structure having a configuration in which a Cu—Mn alloy layer and a high melting point barrier metal, e.g., Ta and Ti, are combined.

The above-described barrier metal structure, in which the Cu—Mn alloy layer and the barrier metal film of the high melting point metal, e.g., Ta and Ti, are combined, has also a favorable feature in that the oxidation resistance is improved because of the circumstances described below.

In recent years, for the purpose of avoiding a signal delay, use of a porous low dielectric constant film as a low dielectric constant material constituting the interlayer insulating film has been proposed. However, there are problems in that such a porous low dielectric constant material has a low density and is susceptible to damage due to plasma during production. The surface and the inside of the damaged film adsorbs moisture easily. Consequently, a barrier metal film formed on this porous low dielectric constant film is easy to oxidize under the influence of moisture adsorbed in the porous dielectric film and the performance as a diffusion barrier and the adhesion to a Cu interconnection layer or a via plug easily deteriorates.

However, if the above-described Cu—Mn alloy layer is used as a seed layer in such a structure, Mn in the Cu—Mn alloy layer reacts with an oxidizable portion of the barrier metal film and, thereby, the performance as the diffusion barrier and high adhesion to the Cu interconnection layer or the via plug can be maintained.

By the way, in the case where the Cu interconnection layer is formed by an electroplating method, it is necessary that the seed layer is formed in such a way that the seed layer covers the side wall surface and the bottom surface of the interconnection groove or the via hole continuously. If the seed layer is discontinuous, a void may occur in the interconnection or the via plug during electroplating. In the case where such a seed layer is formed by a sputtering method, it is thought of that the seed layer having a sufficient film thickness is formed on the side wall surface and the bottom of the interconnection groove or the via hole through resputtering or the like and, thereby, the resulting seed layer reliably continuously cover the side wall surface of the interconnection groove or the via hole. However, if this method is employed, overhang of the seed layer formed on upper portion of the interconnection groove or the via hole becomes significant. If the overhang becomes significant, a margin for filling with electroplating conducted thereafter is reduced significantly, so that voids tend to occur during the electroplating.

On the other hand, as a result of miniaturization of the semiconductor device, the width of the interconnection groove or the diameter of the via hole is reduced. Along with this, film thickness reduction of the seed layer is required. However, in particular, insofar as the seed layer is formed by a sputtering method, it is very difficult to cover the side wall surface and the bottom surface of the interconnection groove or the via hole with a film having a sufficient thickness regarding particularly a highly miniaturized semiconductor device. Furthermore, in the case where a low-k material having a low modulus of elasticity is used as the interlayer insulating film, bowing may occur in a cross-sectional shape of the interconnection groove or the via hole after etching. In particular, regarding the side wall portion of the interconnection groove having a large surface area, even when the seed layer is a continuous film, the film thickness may be reduced locally as a result of fluctuation in the film thickness.

If the film thickness of the seed layer is reduced locally in the side wall portion of the interconnection groove, as described above, the above-described thin film portion of the above-described seed layer may be dissolved at an initial stage of a copper interconnection formation step by the electroplating method. In the case where an electroplating step is conducted by using such a partly dissolved seed layer, a problem may occur in that a void occurs at a place corresponding to the local thin film portion of the seed layer in a heat treatment step conducted thereafter.

An occurrence of void due to such a little dissolution of the seed layer is characterized in that in general, faulty filling is not observed just after plating, but a void occurs only after the heat treatment step is conducted. The reason for this is believed to be that the interconnection pattern itself is formed through a bottom-up fill mechanism in the electroplating, a Cu plating film is formed without void apparently, but in the place at which the seed layer has dissolved, the adhesion between the Cu plating film and the barrier metal film is insufficient and, thereby, a void occurs at such a place by a rapid change in stress due to the heat treatment conducted thereafter. Examples of documents in related art further includes Japanese Laid-open Patent Publication No. 2007-141927, Japanese Laid-open Patent Publication No. 2007-142236, Japanese Laid-open Patent Publication No. 2007-173511, U.S. Pat. No. 6,136,707, Japanese Laid-open Patent Publication No. 2007-281485, Japanese Laid-open Patent Publication No. 2004-111926, Japanese Laid-open Patent Publication No. 2006-24943, Japanese Laid-open Patent Publication No. 2000-91271, Japanese Laid-open Patent Publication No. 2004-153274, Japanese Laid-open Patent Publication No. 2005-51185, and Japanese Laid-open Patent Publication No. 2001-160590.

SUMMARY

According to an aspect of the embodiments, a semiconductor device including a semiconductor substrate, an oxygen-containing insulating film disposed above the above-described semiconductor substrate, a concave portion disposed in the insulating film, a copper-containing first film disposed on an inner wall of the above-described concave portion, a copper-containing second film disposed above the above-described first film and filled in the above-described concave portion, and a manganese-containing oxide layer disposed between the above-described first film and the above-described second film is provided.

BRIEF DESCRIPTION OF THE DRAWINGS

FIG. 1B is a diagram showing the structure of a test piece used in the present invention;

FIG. 2 is a diagram for explaining the principle of the present invention;

FIG. 3 is another diagram for explaining the principle of the present invention;

FIG. 6 is another diagram for explaining the principle of the present invention;

FIG. 7 is another diagram for explaining the principle of the present invention;

FIG. 8 is another diagram for explaining the principle of the present invention;

FIG. 11 is another diagram for explaining the principle of the present invention;

DESCRIPTION OF THE PREFERRED EMBODIMENTS

Incidentally, regarding the Cu—Mn alloy layer for constituting the barrier metal structure by being combined with the above-described high melting point barrier metal film, the reliability of the interconnection is improved as the Mn concentration in the above-described Cu—Mn alloy layer becomes higher.

Figure 1A:
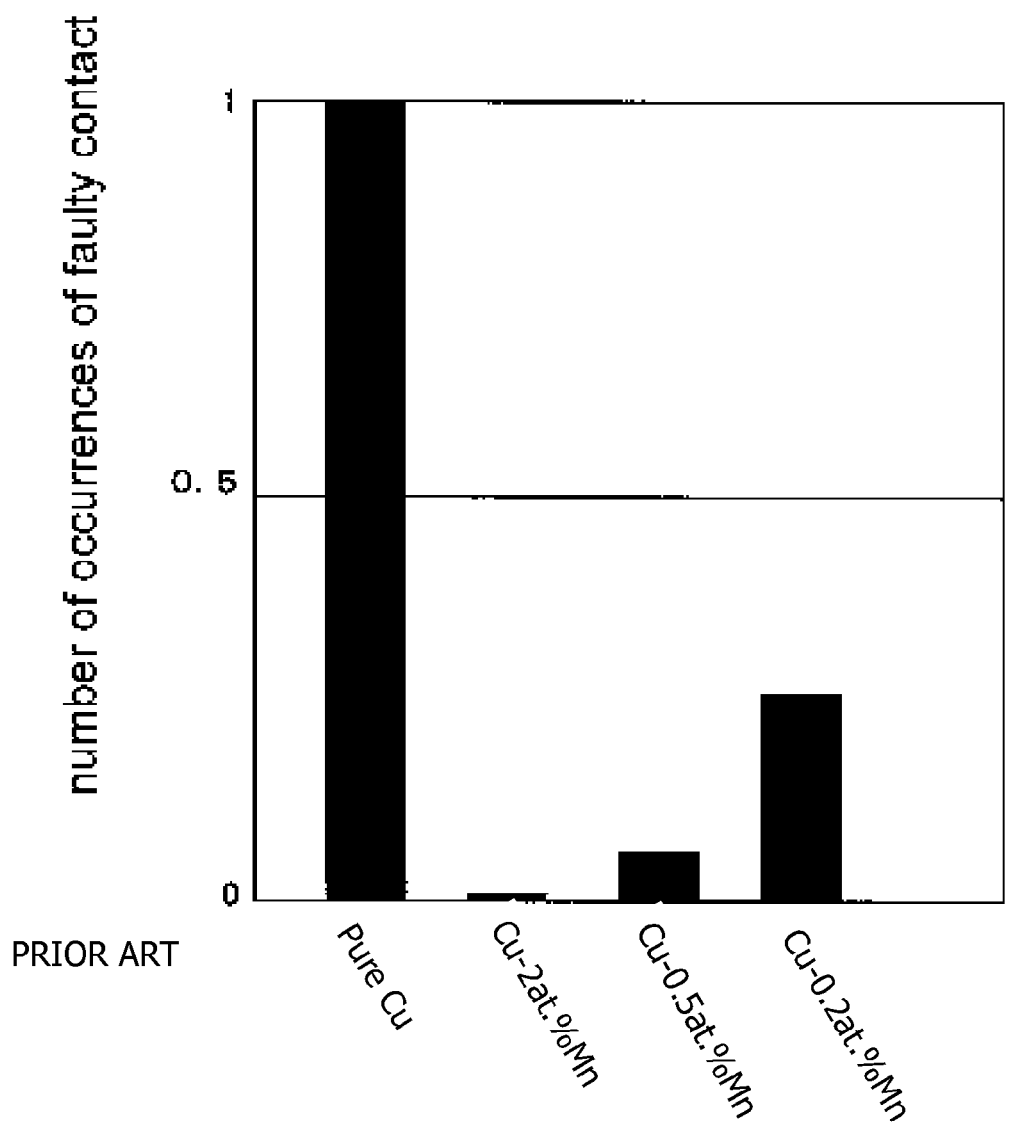
FIG. 1A is a diagram showing an effect of a Cu—Mn alloy layer in a known barrier metal structure.

FIG. 1A shows the results of examination of the stress migration resistance on the basis of a heat treatment of a test structure shown in FIG. 1B in the air at a temperature of 150° C. to 200° C. for 500 hours.

First, as shown in FIG. 1B, a low-k film 12 of SiOC or the like is disposed on a substrate 11. In the above-described low-k film 12 of SiOC or the like, an interconnection groove 12T having a width of 65 nm to 10 μm and a depth of about 150 nm is disposed. Furthermore, the above-described interconnection grooves 12T is filled with a Cu interconnection pattern 12C with Ta barrier metal film 12B therebetween, the Ta barrier metal film covering the side wall surface and the bottom surface of the interconnection groove 12T and having a thickness of 3 nm to 15 nm.

Furthermore, another low-k film 14 of SiOC or the like having a film thickness of 50 to 150 nm is disposed on the above-described low-k film 12 of SiOC or the like with a silicon carbide film (SiC film) 13 having a thickness of 10 to 100 nm therebetween. Another low-k film 16 of SiOC or the like having a film thickness of 120 to 180 nm is disposed on the above-described low-k film 14 of SiOC or the like with a SiC film 15 having a thickness of 10 to 100 nm therebetween.

In the above-described low-k film 16 of SIOC or the like, an interconnection groove 16T having a width of 65 nm to 10 μm and a depth of 120 to 180 nm is disposed while penetrating the above-described SiC film 15 in such a way that the above-described low-k film 14 of SIOC or the like is exposed. In the above-described interconnection groove 16T, a via hole 14V having a diameter of 70 nm is disposed while penetrating the above-described low-k film 14 of SiOC or the like and SiC film 13 to expose the above-described Cu interconnection pattern 12C.

Furthermore, the above-described interconnection groove 12T is filled with a Cu interconnection pattern 12C with a Ta barrier metal film 12B between interconnection pattern 12C and interconnection groove 12T. The above-described interconnection groove 16T is filled with a Cu interconnection pattern 16C with a Ta barrier metal film 16B therebetween, the Ta barrier metal film covering the side wall surface and the bottom surface of the interconnection groove 16T and having a thickness of 3 to 15 nm. A portion, which fills the above-described via hole 14V, of the above-described Cu interconnection pattern 16C constitutes a Cu via plug 16V.

A plurality of test structures having the above-described configuration are disposed in respective regions I, II, and the like on the above-described silicon substrate 11 while the widths of the above-described interconnection patterns 12C or 16C are changed variously within the above-described range.

At that time, in the test structure shown in FIG. 1B, a Cu—Mn alloy layer 12M or 16M having a thickness of 60 nm is interposed between the above-described barrier metal film 12B or 16B and the above-described Cu interconnection pattern 12C or 16C or the Cu via plug 16V.

In the test structure shown in FIG. 1B, the Cu interconnection pattern 12C is formed by a damascene process including seed layer formation, electroplating, and chemical mechanical polishing (CMP). The Cu interconnection pattern 16C and the via plug 16V are formed by a dual damascene process including seed layer formation, electroplating, and CMP. Furthermore, the barrier metal films 12B and 16B and the Cu—Mn alloy layers 12M and 16M are formed by a sputtering method, in which a Cu—Mn alloy is used as a target, at a temperature lower than or equal to room temperature.

FIG. 1A shows the results of examination of the stress migration resistance under the above-described condition by using the test structure shown in FIG. 1B.

In FIG. 1A, the sample indicated by "Pure Cu" is a sample having the above-described structure shown in FIG. 1B except that the Cu—Mn alloy layers 12M and 16M were not disposed and serves as a reference standard. In FIG. 1A, the vertical axis indicates the number of faulty contact detected and the value has been normalized by the above-described reference standard sample.

In FIG. 1A, the sample indicated by "Cu-0.2 at. % Mn" shows the case where a Cu—Mn alloy containing 0.2 atomic percent of Mn was used as the Cu—Mn alloy layers 12M and 16M in the structure shown in FIG. 1B. The sample indicated by "Cu-0.5 at. % Mn" shows the case where a Cu—Mn alloy containing 0.5 atomic percent of Mn was used as the Cu—Mn alloy layers 12M and 16M in the structure shown in FIG. 1B. The sample indicated by "Cu-2 at. % Mn" shows the case where a Cu—Mn alloy containing 2 atomic percent of Mn was used as the Cu—Mn alloy layers 12M and 16M in the structure shown in FIG. 1B.

As is clear from FIG. 1A, in the case where the above-described Cu—Mn alloy layers 12M and 16M are disposed, the number of occurrences of faulty contact is reduced to one-quarter or less of that in the case where the Cu—Mn alloy layers 12M and 16M are not disposed. In particular, it is clear that the number of occurrences of faulty contact can be further reduced by increasing the Mn concentration in the above-described Cu—Mn alloy layers 12M and 16M.

However, in the case where the Cu—Mn alloy layers 12M and 16M are disposed adjacently to the high-melting point barrier metal films 12B and 16B and, in addition, the Mn concentration in the Cu—Mn alloy layer 12M and 16M is allowed to increase, the Cu interconnection pattern 12C or 16C or the Cu via plug 16V contains Mn. Since the Cu via plug 16V contains Mn, a problem occurs in that the resistance value of the Cu interconnection pattern 12C or 16C or the Cu via plug 16V increases.

Incidentally, in order to form a good copper interconnection through electroplating in the interconnection pattern 12C or 16C shown in FIG. 1B, it is required that a seed layer (a Cu seed layer not shown in the drawing or the Cu—Mn alloy layer 12M or 16M) serving as an electrode in electroplating has a sufficient film thickness, a continuous layer is formed, and good step coverage is exhibited. However, as the interconnection width W of the interconnection groove 12T or 16T is reduced, it becomes very difficult to form the Cu seed layer not shown in the drawing or the Cu—Mn alloy layer 12M or 16M having a sufficient film thickness with good step coverage. In particular, in the case where the Cu seed layer not shown in the drawing or the Cu—Mn alloy layer 12M or 16M is formed by a sputtering method, if the interconnection width W becomes 90 nm or less, the film thickness of the side wall portion of the interconnection groove 12T or 16T is reduced locally so that fluctuation in the film thickness occurs.

If the film thickness of the Cu seed layer or the Cu—Mn alloy layer 12M or 16M is reduced locally in the side surface portion of the interconnection groove 12T or 16T, the above-described particularly infinitesimal, local thin film portion of the Cu seed layer not shown in the drawing or the Cu—Mn alloy layer 12M or 16M is dissolved at an initial stage of formation of a copper interconnection that will be the Cu interconnection pattern 12C or 16C, through electroplating conducted thereafter, and a problem may occur in that a void occurs at a place corresponding to the local thin film portion of the Cu seed layer not shown in the drawing or the Cu—Mn alloy layer 12M or 16M of the interconnection groove 12T or 16T side surface portion in a heat treatment step conducted thereafter.

Figure 1C:
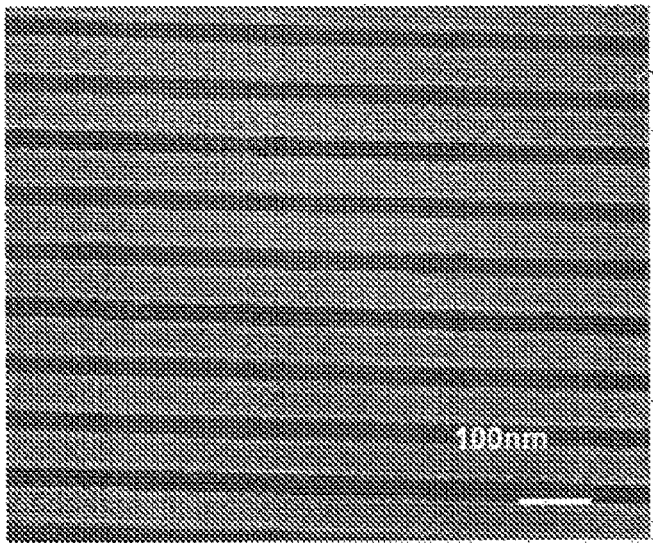
FIG. 1C is a diagram showing a copper interconnection just after electroplating.
Figure 1D:
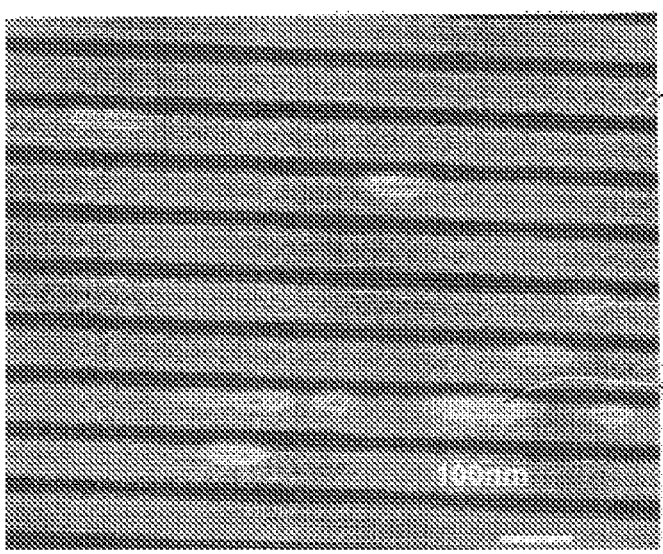
FIG. 1D is a diagram for explaining a phenomenon in the case where a known heat treatment is conducted just after electroplating.

An occurrence of void due to dissolution of the infinitesimal portion of the Cu seed layer not shown in the drawing or the Cu—Mn alloy layer 12M or 16M is characterized in that the interconnection pattern 12C or 16C is filled through a bottom-up fill mechanism in the electroplating, faulty filling is not observed as shown in FIG. 1C, but a void occurs only after the heat treatment is conducted as shown in FIG. 1D. The reason for this is believed to be that the adhesion between the plating film and the barrier metal film 12B or 16B is in an insufficient state in the infinitesimal dissolution place and, thereby, such a place undergoes a rapid change in stress due to the heat treatment conducted thereafter.

Principle

In the basic research of the present invention, the inventors of the present invention examined changes in interconnection resistance in the case where the sample described with reference to FIG. 1B was formed on a silicon substrate 11 and heat-treated while various pattern widths W were employed. It was found on the basis of this research that an interesting relationship held. That is, as shown in FIG. 2, the rate of increase in interconnection resistance was reduced as the interconnection pattern width W decreased. Here, the relationship shown in FIG. 2 was observed in the case where the above-described sample shown in FIG. 1B was subjected to a heat treatment in a nitrogen atmosphere at 400° C. for 30 minutes.

FIG. 3 show the outline of a sample used in the experiment shown in FIG. 2. In FIG. 3, the elements corresponding to the elements described above are indicated by the same reference numerals as those set forth above and further explanations thereof will not be provided. In FIG. 3, for the purpose of avoiding complication of the drawing, merely a part of the interconnection pattern 16B and the barrier metal film 16B, among the above-described elements shown in FIG. 1B, are shown in the drawing.

FIG. 3 is a sectional view showing the case where the width W of the Cu interconnection pattern 16C is small as shown in a region II.

It is clear that in this case, the ratio of the contact area between the Cu interconnection pattern 16C and the interlayer insulating film 16 to the total amount of Cu represented by the cross-sectional area of the Cu interconnection pattern 16C is larger than that in the case where the width W of the Cu interconnection pattern 16C is large as shown in a region I. Therefore, the above-described relationship shown in FIG. 2 is noted, wherein the rate of increase in interconnection resistance is reduced as the interconnection pattern width W decreases. It is estimated that some types of chemical reaction occurs in the interface regions between the above-described Cu interconnection pattern 16C and the interlayer insulating film 14 or 15 and between the via plug 16V not shown in the drawing and the interlayer insulating film 14 or 15.

Figure 4:
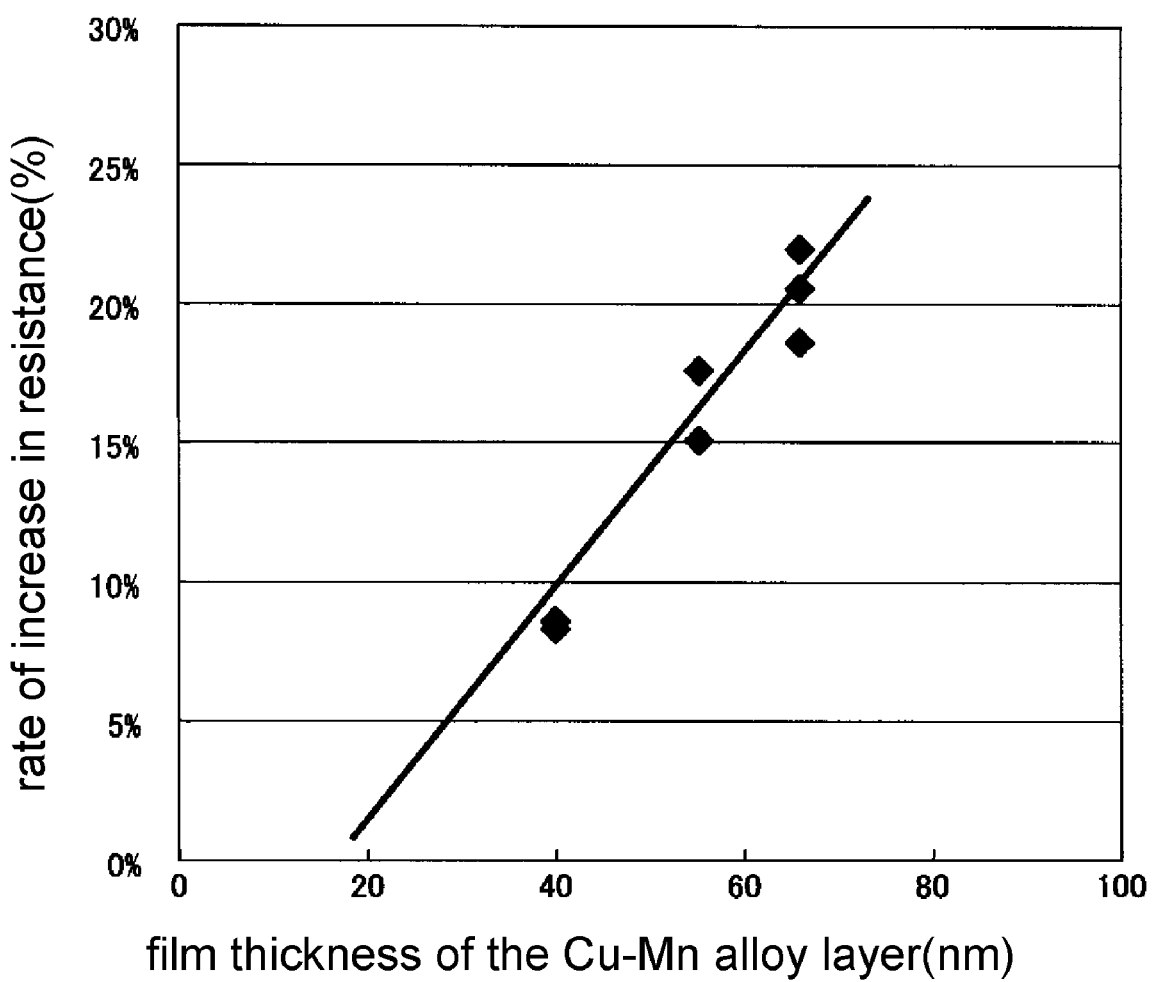
FIG. 4 is another diagram for explaining the principle of the present invention.

FIG. 4 is a diagram showing the relationship between the film thickness of the Cu—Mn alloy layer 16M and the rate of increase in resistance in the case where the interconnection width W is specified to be 3 μm in the above-described sample shown in FIG. 1B. Here, in FIG. 4, the film thickness of the Cu—Mn alloy layer 16M is measured on an upper surface of the above-described interlayer insulating film 16, that is, on a flat surface flattened by a CMP method. The reference (0%) of the above-described rate of increase in resistance is that in the case where the Cu—Mn alloy layer 16M is not disposed. Furthermore, in the experiment shown in FIG. 4 as well, the above-described sample shown in FIG. 1B is subjected to a heat treatment in a nitrogen atmosphere at a temperature of 400° C. for 30 minutes.

As is clear from FIG. 4, the Cu—Mn alloy layer 16M contains 0.5 atomic percent of Mn and the rate of increase in resistance of the Cu interconnection pattern 16C almost linearly increases as the film thickness of the Cu—Mn alloy layer 16M increases. This indicates that if the Cu—Mn alloy layer 16M having a large film thickness is interposed between the Cu interconnection pattern 16C and the barrier metal film 16B, the resistance of the Cu interconnection pattern 16C increases under the influence of Mn in the above-described Cu—Mn alloy layer 16M.

However, if the relationship shown in FIG. 4 is extrapolated in a direction of decrease in the film thickness of the above-described Cu—Mn alloy layer 16M, the film thickness of the Cu—Mn alloy layer 16M becomes equal to the film thickness of about 15.5 nm. In this case, it is clear that even when the Cu—Mn alloy layer 16M containing Mn is disposed between the above-described Cu interconnection pattern 16C or Cu via plug 16V and the Ta barrier metal film 16B, the rate of increase in resistance of the Cu interconnection pattern 16C is zero, that is, an increase in resistance does not occur. This refers to that an influence of Mn is not exerted on the resistance value of the Cu interconnection pattern 16C.

Consequently, in order to understand the meaning of the above-described relationship shown in FIG. 2 and the relationship shown in FIG. 4, the sample used in the experiment was subjected to an element analysis with a scanning transmission electron microscope (STEM) by using an energy dispersion spectrum (EDS).

Figure 5B:
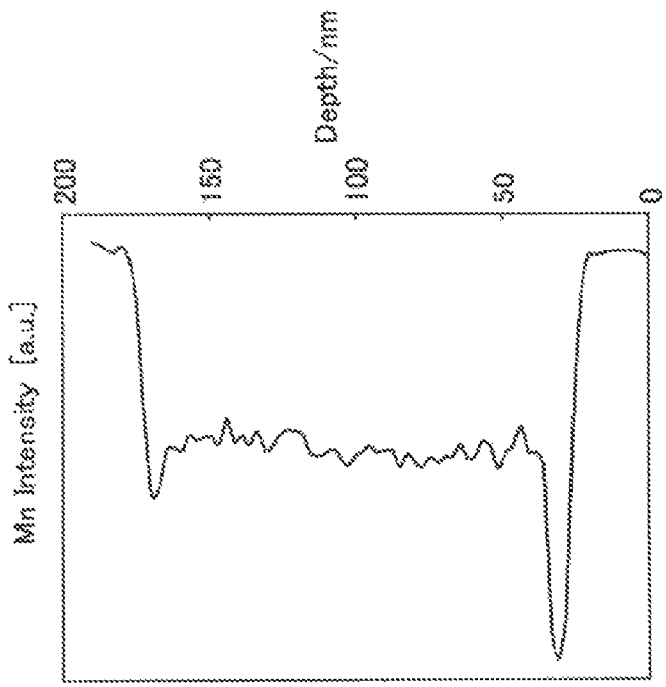
FIGS. 5A and B are other diagrams for explaining the principle of the present invention.
Figure 5A:
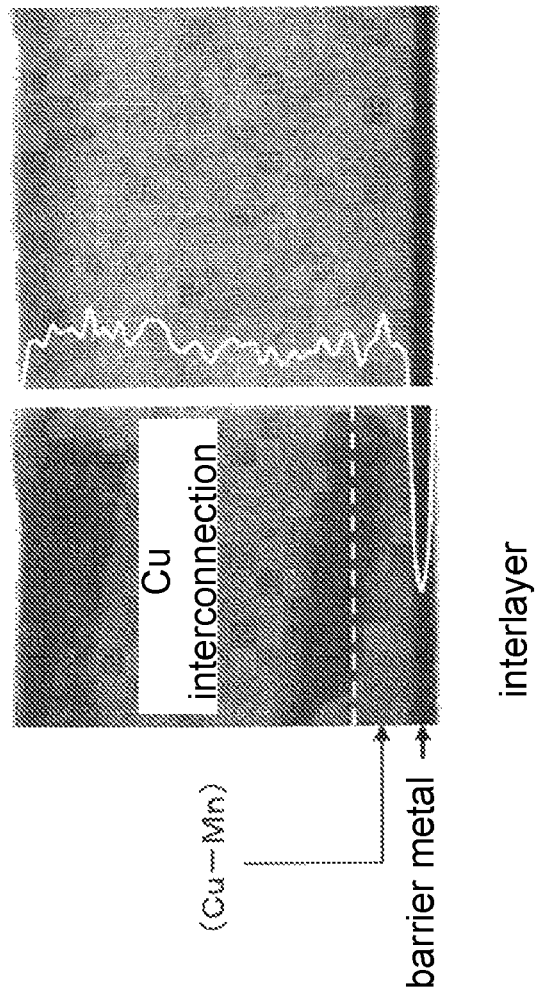

FIG. 5A shows a sectional image of the Cu interconnection pattern 16C on the basis of the above-described STEM. FIG. 5B shows a characteristic X ray intensity distribution obtained by scanning in the depth direction in FIG. 5A.

In FIG. 5A, "barrier metal" corresponds to the Ta barrier metal film 16B in the sample shown in FIG. 1B. The Cu—Mn alloy layer 16M having an initial film thickness of 15.5 nm is formed on the barrier metal while being held between the barrier metal and the Cu interconnection pattern 16C. It was found that manganese in the Cu—Mn alloy layer 16M was assimilated into the Cu interconnection pattern 16C by the above-described heat treatment in the nitrogen atmosphere at a temperature of 400° C. for 30 minutes. Furthermore, it was found that the Mn concentration in the barrier metal film 16B increased significantly along with this, as is clear from the EDS profile shown in FIG. 5B.

This refers to that as a result of application of the above-described heat treatment at 400° C. to the above-described structure shown in FIG. 1B, substantially all Mn atoms in the above-described Cu—Mn alloy layer 16M were transferred to the barrier metal film 16B, the Cu—Mn alloy layer 16M was changed to Cu layer containing substantially no Mn. Furthermore, this refers to that in the case where the Mn concentration in the above-described Cu—Mn alloy layer 16M is 0.5 atomic percent, substantially all Mn atoms in the film can be transferred to the Ta barrier metal film 16B by the above-described heat treatment until the film thickness of the above-described Cu—Mn alloy layer 16M becomes up to about 15.5 nm. Consequently, the Mn concentration in the Cu interconnection pattern 16C can be reduced to the concentration which does not have an influence on the interconnection resistance.

The Mn atoms transferred to the barrier metal film 16B, as described above, make solid solution with the above-described barrier metal film 16B. However, a part of the above-described Mn atoms react with oxygen from the oxygen-containing interlayer insulating film 14 or 16 present adjacent to the above-described barrier metal film 16B so as to form a Mn oxide. This Mn oxide is deposited in the inside of the above-described barrier metal film 16B, at the interface between the above-described barrier metal film 16B and the Cu interconnection pattern 16C, or at the interface between the barrier metal film 16B and the interlayer insulating film 14 or 16 and is kept stably.

The above-described results shown in FIG. 4 and FIGS. 5A and 5B are related to the case where the above-described Cu—Mn alloy layer 16M contains 0.5 atomic percent of Mn and the film thickness of the above-described Cu—Mn alloy layer 16M is 15 nm. It is believed that the film thickness of the Cu—Mn alloy layer 16M capable of transferring substantially all Mn atoms in the film to the barrier metal film 16B, i.e. the critical film thickness, also relates to the Mn concentration in the above-described Cu—Mn alloy layer 16M.

Therefore, the present inventors measured rates of increase in resistance of the Cu interconnection pattern 16C having a width W of 3 µm, where Cu—Mn alloy layers having various Mn concentrations were used as the above-described Cu—Mn alloy layer 16M in the sample having the structure shown in FIG. 3.

FIG. 6 shows measurement results of rates of increase in resistance of the Cu interconnection pattern 16C having a width W of 3 µm. In FIG. 6, the vertical axis indicates the rate of increase in resistance relative to the case where the above-described Cu—Mn alloy layer 16M was not disposed, and the horizontal axis indicates the amount given by multiplying the thickness of the above-described Cu—Mn alloy layer 16M by the Mn concentration in the film. This amount corresponds to the total amount of Mn atoms in the above-described Cu—Mn alloy layer 16M.

As shown in FIG. 6, the rate of increase in resistance of the above-described Cu interconnection pattern 16C substantially linearly increases as the total amount of Mn atoms in the above-described Cu—Mn alloy layer 16M increases. It is believed that the total amount of Mn atoms at the rate of increase in resistance of zero is the critical amount of Mn capable of transferring to the barrier metal film 16B at the related Mn concentration. If the amount of Mn in the above-described Cu—Mn alloy layer 16M exceeds this critical amount of Mn (hereafter referred to as "amount of Mn consumption"), the Cu—Mn alloy layer 16M remains on the above-described barrier metal film 16B after the heat treatment so as to cause an increase in the resistance of the Cu interconnection pattern 16C.

FIG. 7 shows the relationship between the amount of Mn consumption indicated by the horizontal axis intercept shown in FIG. 6 and the Mn concentration in the above-described Cu—Mn alloy layer 16M.

As is clear from FIG. 7, the proportionality represented by an expression, y=15.489x, where the slope is 15.489 holds between the above-described amount of Mn consumption (y axis) and the Mn concentration in the Cu—Mn alloy layer 16M (x axis). It should be noted that the slope shown in FIG. 7 has a dimension of thickness (nm).

That is, the relational expression, y=15.489x, shown in FIG. 7 indicates that the above-described amount of Mn consumption increase in proportion to the Mn concentration x in the film in the case where the thickness of the Cu—Mn alloy layer 16M is 15.489 nm. Furthermore, it is indicated that if the film thickness on a flat surface of the above-described Cu—Mn alloy layer 16M is specified to be 15.489 nm or less, substantially all Mn atoms in the film can be transferred to the Ta barrier metal film 16B through a heat treatment at any Mn concentration. This thickness of 15.489 nm agrees with the critical film thickness of the Cu—Mn alloy layer 16M of about 15.5 nm estimated on the basis of the relationship shown in FIG. 4, as described above.

FIG. 8 shows the relationship between the rate of increase in resistance and the amount of Mn consumption in the cases where a Ta barrier and a Ti barrier are used. As shown in the drawing, the presence of the critical amount of Mn consumption as shown in FIG. 6 is also observed in not only the case where the Ta film is used as the above-described barrier metal film 16B, but also in the case where the Ti film is used. As shown in the drawing, the difference in the amount of Mn consumption is within the range of experimental error indicated by an arrow in the vicinity of the horizontal axis intercept and, therefore, the two cases are very close. This results from the fact that the amount of oxygen generated from the interlayer insulating film does not depend on the type of barrier metal in the film formed on the interlayer insulating film. Consequently, it is made clear that the above-described conclusion is not limited to the Ta barrier film.

In FIG. 8, the line indicated by Ta BRM is an example shown in FIG. 6 in which the Ta barrier metal film was used as the barrier metal film 16B and which shows the case where the Mn concentration in the Cu—Mn alloy layer 16M was specified to be 0.5 atomic percent. On the other hand, the line indicated by Ti BRM is an example in which the Ti barrier metal film was used as the above-described barrier metal film 16B. In this case as well, the Mn concentration in the above-described Cu—Mn alloy layer 16M was specified to be the same 0.5 atomic percent.

As shown in FIG. 8, in the case where the Ti film is used as the above-described barrier metal film 16B as well, the rate of increase in resistance of the Cu interconnection pattern decrease as the amount of Mn in the Cu—Mn alloy layer 16M decreases. However it is clear that the presence of Mn does not appear in an increase in resistance within the range of the amount of Mn of 0 to about 7 atomic percent·nm.

The range of Mn concentration to which the relationship shown in FIG. 7 can be applied will be described with reference to a phase equilibrium diagram of a Cu—Mn binary system shown in FIG. 9.

Figure 9:
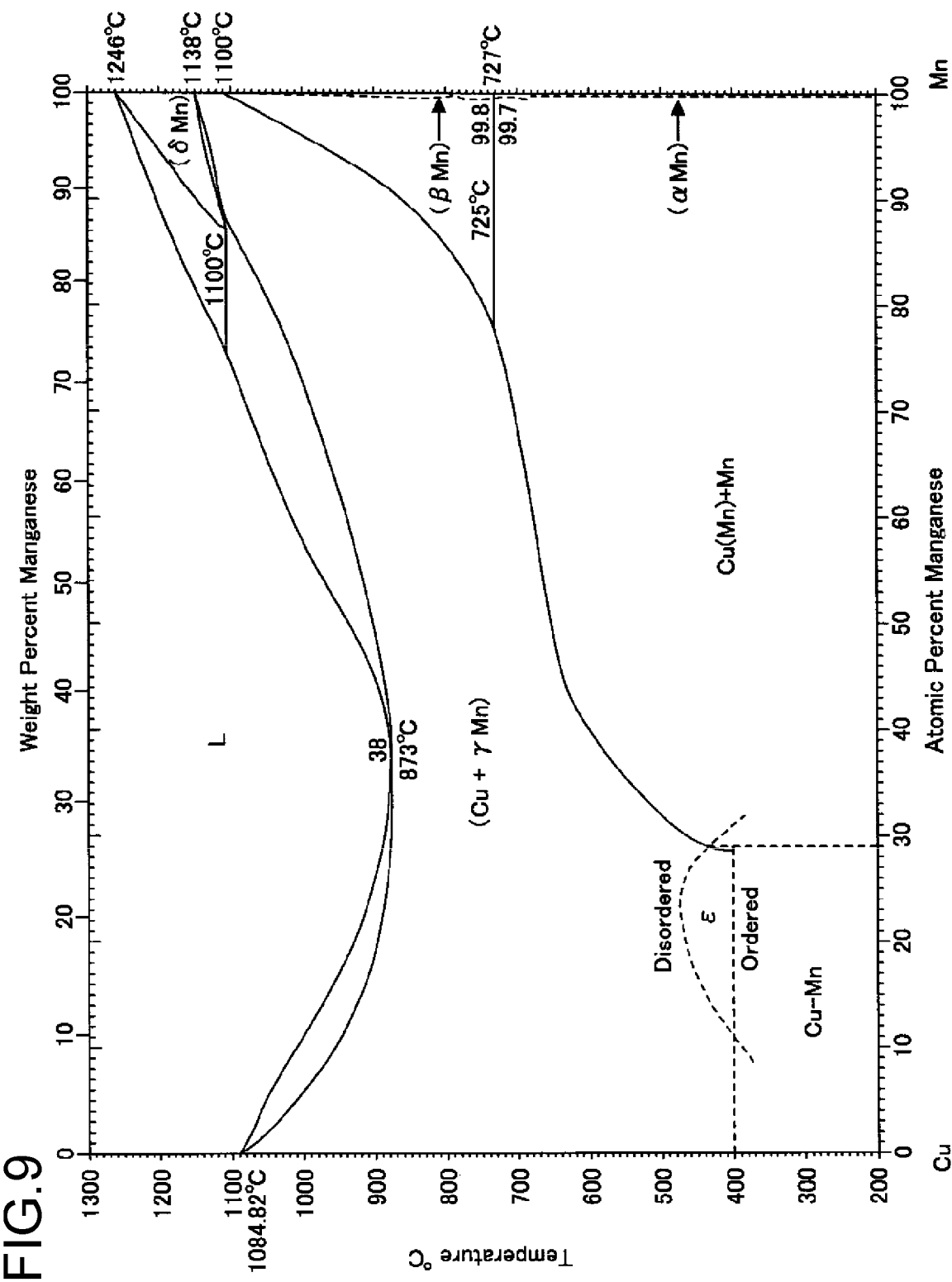
FIG. 9 is a phase equilibrium diagram of a Cu—Mn system.

As is clear from FIG. 9, the Cu—Mn alloy can exhibit a single phase in a temperature range of 400° C. and a composition range up to 30 atomic percent in terms of the Mn concentration in Cu—Mn alloy. However, if the Mn concentration in Cu—Mn alloy increases to 30 atomic percent or more, Mn begins to deposit and a two-phase state of a Cu—Mn alloy phase and Mn appears.

Figure 10A:
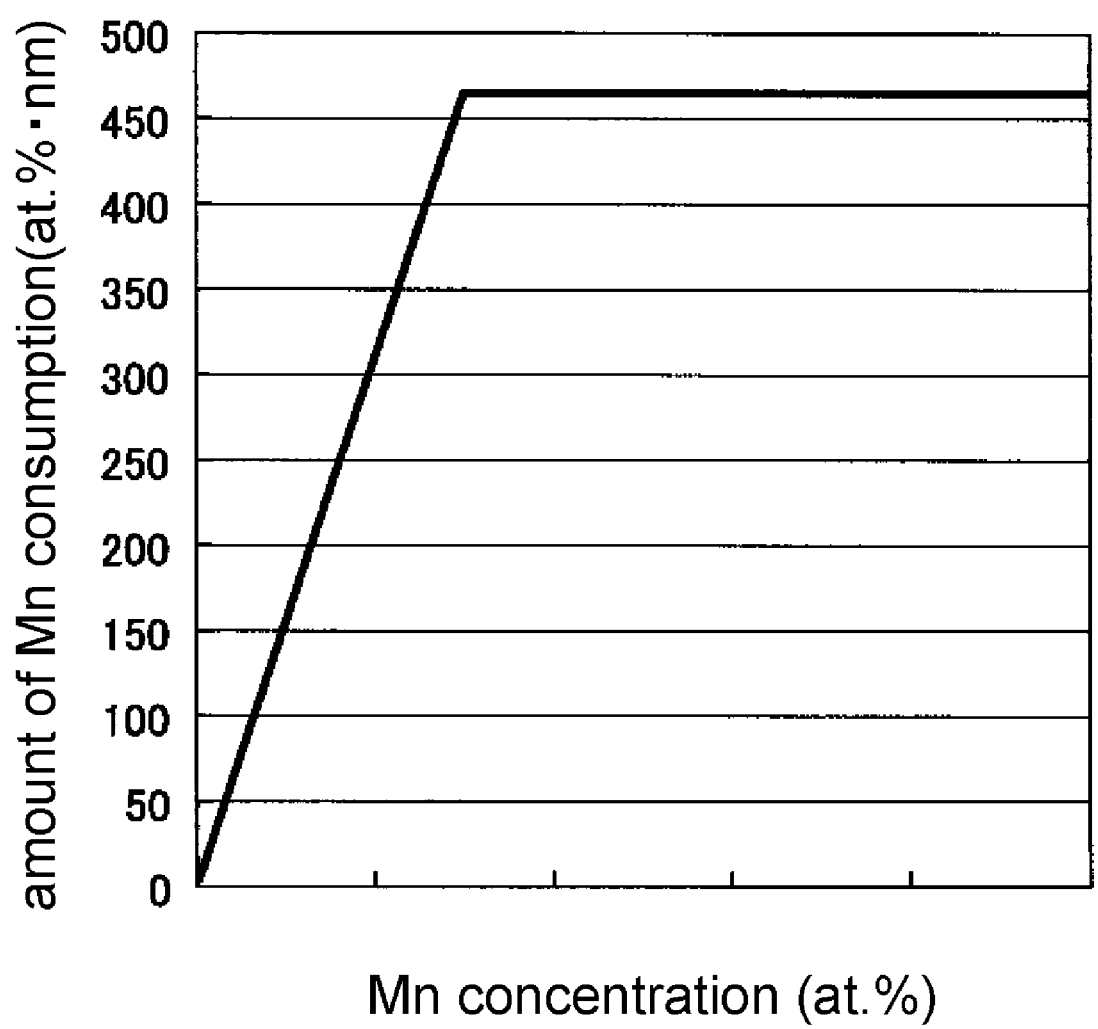
FIG. 10A is another diagram for explaining the principle of the present invention.

Therefore, as shown in FIG. 10A, the relationship shown in FIG. 7, in which the amount of Mn consumption increases with the Mn concentration in the above-described Cu—Mn alloy layer 16M, is effective in a concentration range until the Mn concentration in the above-described Cu—Mn alloy layer 16M reaches about 30 atomic percent and the value of amount of Mn consumption reaches a maximum value of 465 atomic percent·nm, and if this is exceeded, the value of amount of Mn consumption becomes constant at the above-described maximum value of 465 atomic percent·nm.

Figure 10B:
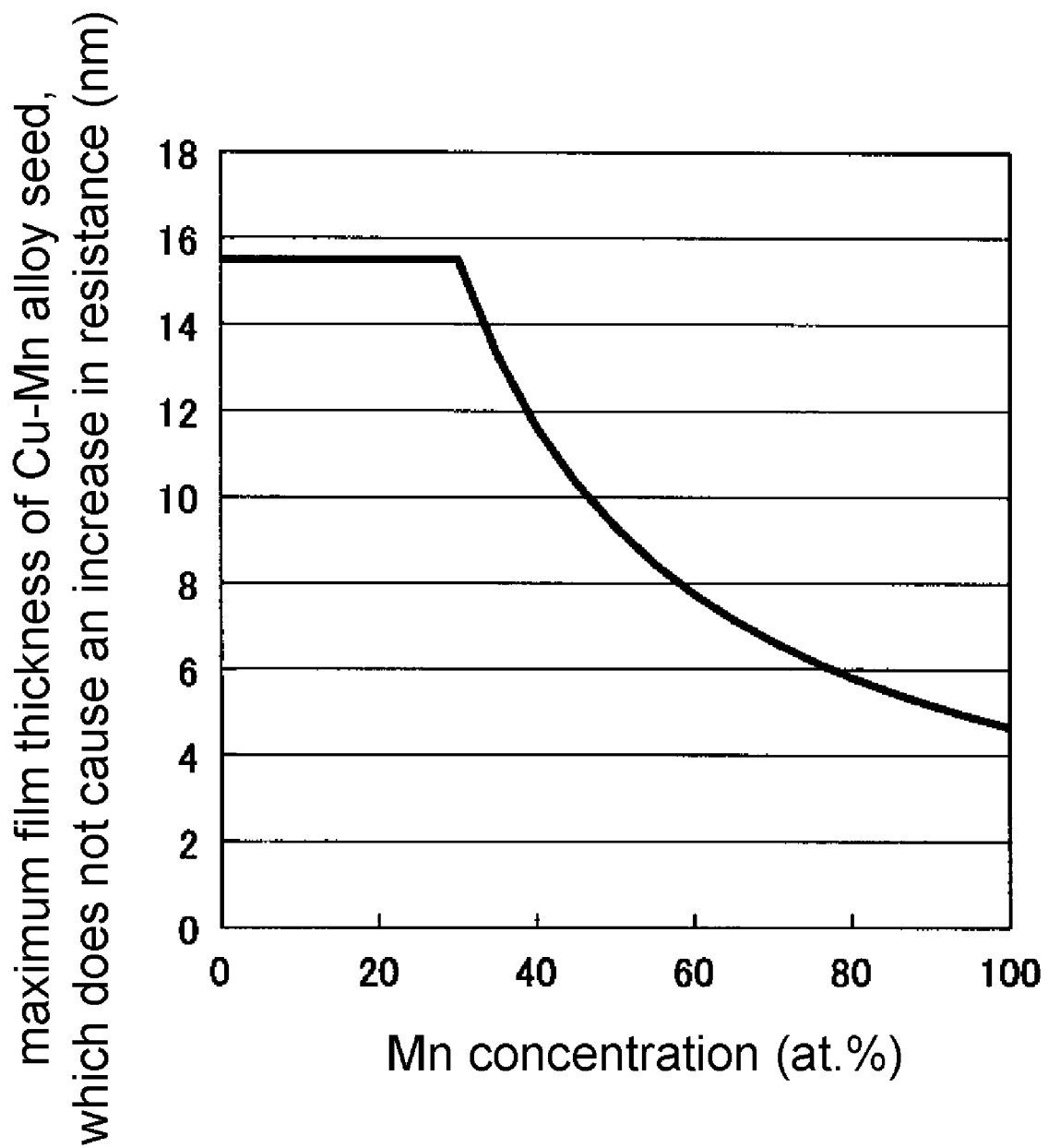
FIG. 10B is another diagram for explaining the principle of the present invention.

Consequently, as shown in FIG. 10B, the maximum film thickness y, which does not cause an increase in resistance of the above-described Cu interconnection pattern 16C, on the flat surface of the Cu—Mn alloy layer 16M is 15.489 nm or about 15 nm in the range of the Mn concentration x in the Cu—Mn alloy layer 16M of up to about 30 atomic percent. In the case where the Mn concentration in the above-described Cu—Mn alloy layer 16M exceeds the above-described concentration of about 30 atomic percent, the maximum film thickness y follows the hyperbolic relationship represented by y=465/x. Put another way, the maximum film thickness decreases following the relationship (x×y=465) which maintains the total amount (x×y) of Mn in the above-described Cu—Mn alloy layer 16M at 465 atomic percent·nm.

As is clear from this, in the above-described Cu interconnection pattern having the damascene or dual damascene structure, as shown in FIG. 1B, in which the concave portion formed in the interlayer insulating film or the insulating film 12 or 14 to 16 is filled with the Cu interconnection pattern 12C or 16C, respectively, with the high-melting point barrier metal film 12B and 16B and the Cu—Mn alloy layer 12M or 16M therebetween, in the case where the Mn concentration in the above-described Cu—Mn alloy layer 12M or 16M is 30 atomic percent or less, for example, within the concentration range of 0.2 atomic percent or more, and 30 atomic percent or less, as shown in FIGS. 6 and 7, substantially all Mn atoms in the above-described Cu—Mn alloy layer 12M or 16M can be transferred to the high-melting point barrier metal film 12B or 16B, respectively, by specifying the film thickness on a flat surface of the above-described Cu—Mn alloy layer 12M or 16M to be 15.489 nm or about 15 nm or less, for example, within the range of 1 nm to 15 nm. As a result, the Mn atom concentration in the above-described Cu—Mn alloy layer 12M or 16M is reduced to a concentration which has no influence on the resistance of Cu, and an increase in resistance of the Cu interconnection patterns 12C and 16C are avoided.

Furthermore, even in the case where the Mn atom concentration x in the above-described Cu—Mn alloy layer 12M or 16M exceeds about 30 atomic percent as well, substantially all Mn atoms in the above-described Cu—Mn alloy layer 12M or 16M can be transferred to the high-melting point barrier metal film 12B or 16B, respectively, by specifying the film thickness y, in the unit nm, on a flat surface of the above-described Cu—Mn alloy layer 12M or 16M to be less than or equal to the film thickness given by the relationship represented by $y \leq 465/x$, and an increase in resistance of the Cu interconnection patterns 12C and 16C are avoided. For example, in the case where the above-described Cu—Mn alloy layer 16M contains 50 atomic percent of Mn, it is recommended that the above-described Cu—Mn alloy layer 16M is formed in such a way as to have a film thickness measured on the flat surface of 9.3 nm or less. In the case where the above-described Cu—Mn alloy layer 16M contains 80 atomic percent of Mn, it is recommended that the above-described Cu—Mn alloy layer 16M is formed in such a way as to have a film thickness measured on the flat surface of 5.8 nm or less. In the case where the above-described Cu—Mn alloy layer 16M contains 100 atomic percent of Mn, it is recommended that the above-described Cu—Mn alloy layer 16M is formed in such a way as to have a film thickness measured on the flat surface of 4.7 nm or less. That is, in the case where the above-described Cu—Mn alloy layer 16M is formed in such a way as to have a film thickness measured on the flat surface of 4.7 nm or less, the Mn concentration in the above-described Cu—Mn alloy layer 16M can be specified to be any concentration within the range exceeding 0 atomic percent, and 100 atomic percent or less.

FIGS. 6 to 8 are related to the Cu interconnection pattern 16C having a width W of 3 μm. However, it is clear that the above-described results can be applied to interconnection patterns having other interconnection widths or via plug diameters.

As described above, the above-described barrier metal films 12B and 16B are not limited to Ta films, and may be metal films containing at least one high-melting point metal element, e.g., Ta, Ti, and furthermore, Zr and Ru.

The above-described heat treatment step is not limited to the heat treatment in the nitrogen atmosphere at 400° C., and can be executed by a heat treatment in an atmosphere of an inert gas, e.g., nitrogen or Ar, at a temperature within the range of 100° C. to 400° C.

FIG. 11 shows a structure typically obtained in the case where in the above-described structure shown in FIG. 1B, a Cu—Mn alloy layer 16M having a Mn concentration within the range of 0.2 atomic percent to 30 atomic percent and having a film thickness of 15 nm is formed, and the thus obtained structure is subjected to a heat treatment in a nitrogen atmosphere at 400° C. In FIG. 11, the elements described above are indicated by the same reference numerals as those set forth above and further explanations thereof will not be provided.

In FIG. 11, regarding the above-described Cu—Mn alloy layers 12M and 16M, as a result of the above-described heat treatment, substantially all Mn atoms in the above-described Cu—Mn alloy layer 12M and 16M are transferred to the Ta barrier metal films 12B and 16B, respectively, the Mn concentration has been reduced to a level at which no influence is exerted on the resistance. Furthermore, as a result of such elimination of Mn, the region in which the Cu—Mn alloy layer 16M was formed at first has been displaced by Cu films 12C1 and 16C1 following the above-described Cu interconnection patterns 12C and 16C.

However, as shown in FIG. 11, thin layers 12Ox and 16Ox of oxides, which have been formed by bonding of oxygen atoms to Mn atoms, remain on portions which were surfaces of the Cu—Mn alloy layers 12M and 16M at first. The above-described Cu interconnection patterns 12C and 16C are divided into the above-described regions 12c1 and 16c1 in which Cu—Mn alloy layers 12M and 16M presented at first and the regions 12c2 and 16c2 in which the Cu interconnection patterns 12C and 16C were presented at first.

Figure 12:
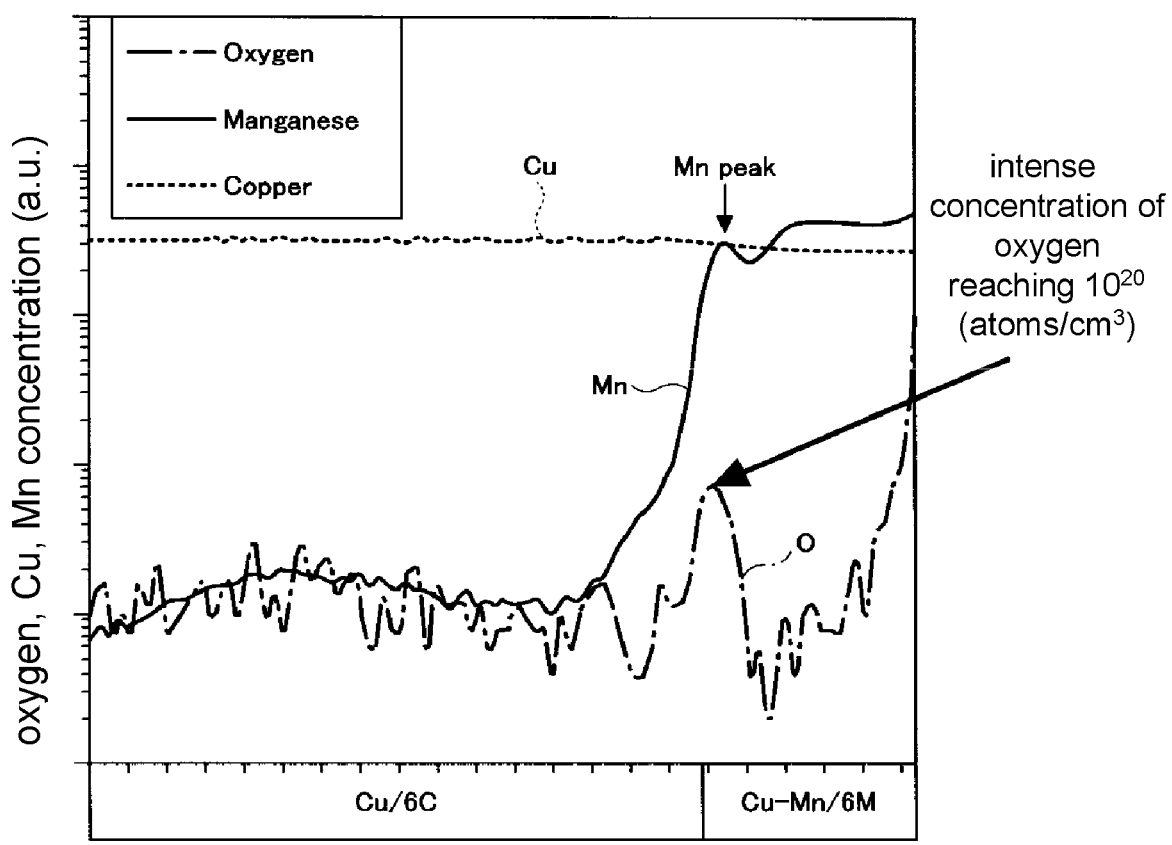
FIG. 12 is another diagram for explaining the principle of the present invention.

FIG. 12 is a secondary ion mass spectroscopy (SIMS) profile showing the distribution of Cu, Mn, and oxygen atoms. In this drawing, the profile is determined with respect to the Cu interconnection pattern 12C shown in FIG. 11 after the heat treatment, wherein the region in which the Cu—Mn alloy layer 12M presented at first is included.

As is clear from FIG. 12, intense concentration of oxygen reaching $10^{20}$ atoms/cm$^3$ is observed at a portion which was the surface of the Cu—Mn alloy layer 12M at first, and along with such concentration of oxygen, concentration of Mn occurs at the same position.

Figure 13A:
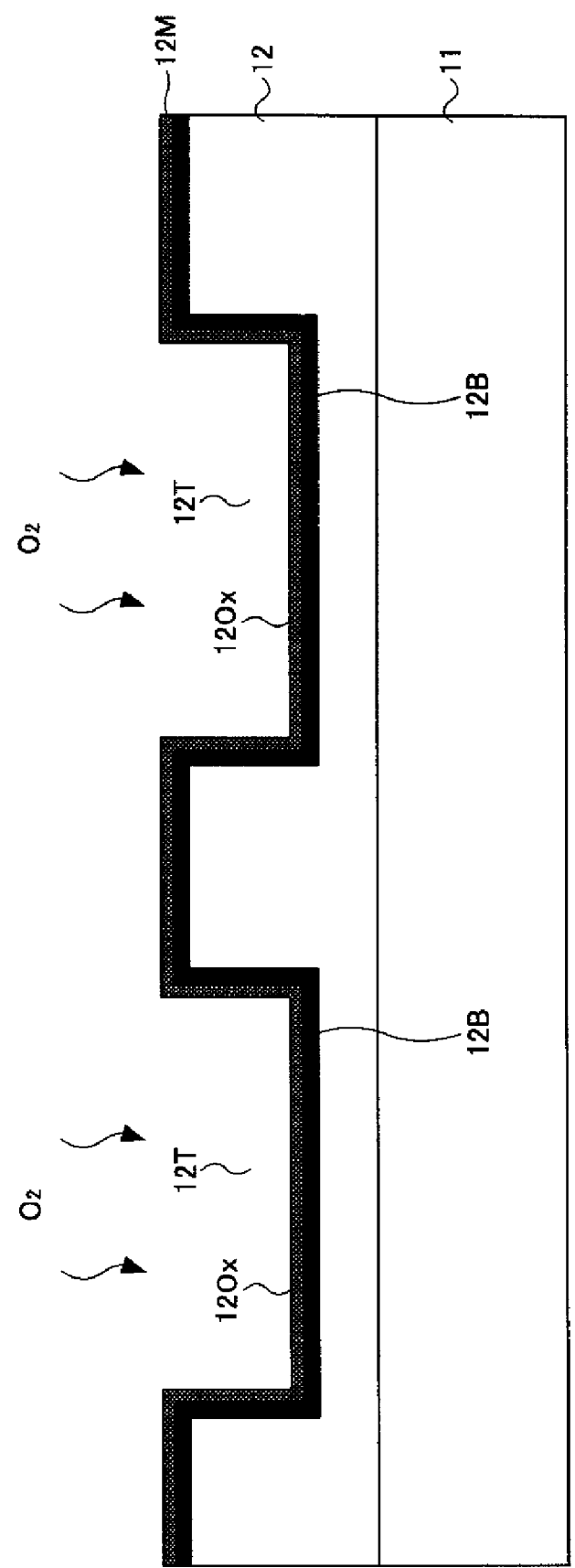
FIG. 13A is another diagram for explaining the principle of the present invention.

FIG. 13A shows a state in which regarding the structure shown in FIG. 1B, after the Ta barrier metal film 12B was formed in the interconnection groove 12T, the Cu—Mn alloy layer 12M was further formed, and this has been transferred to a Cu film formation chamber through, for example, a vacuum transfer chamber of a single wafer process equipment.

Figure 13B:
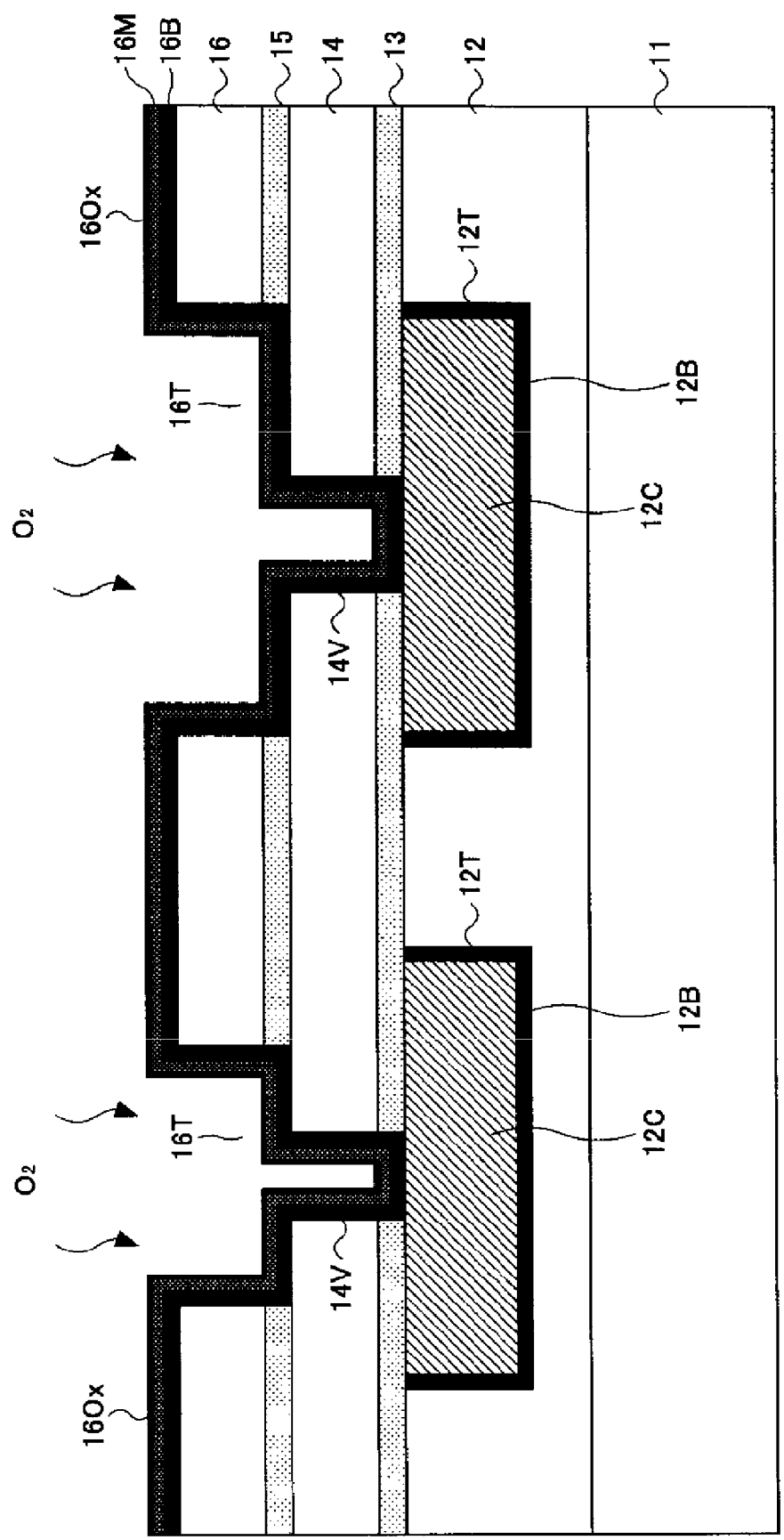
FIG. 13B is another diagram for explaining the principle of the present invention.

FIG. 13B shows a state in which regarding the structure shown in FIG. 1B, after the Ta barrier metal film 16B was formed in the interconnection groove 16T and the via hole 14V, the Cu—Mn alloy layer 16M was further formed, and this has been transferred to a Cu film formation chamber through, for example, a vacuum transfer chamber of a single wafer process equipment.

FIGS. 13A and 13B are referred to. In general, oxygen cannot be excluded completely from the vacuum transfer chamber of the single wafer process equipment even in a vacuum state, and a significant concentration of oxygen is practically contained in a vacuum atmosphere. Therefore, oxygen in the atmosphere is adsorbed by the surface of the above-described Cu—Mn alloy layers 12M and 16M and reacts with individual Mn atoms in the Cu—Mn alloy layers 12M and 16M. Consequently, the above-described thin Mn oxide layers 12Ox and 16Ox are formed on the above-described surfaces and at a distance corresponding to the film thicknesses of the above-described Cu—Mn alloy layers from the surfaces of the barrier metal films 12B and 16B, respectively. As is clear from FIG. 12, the above-described Mn oxide layers 12Ox and 16Ox remain at the original positions even when the above-described concave portions shown in FIGS. 13A and 13B are filled with the Cu interconnection patterns 12C and 16C, respectively, and thereafter, a heat treatment is conducted.

That is, the presence of the thin Mn oxide layers 12Ox and 16Ox in the Cu interconnection patterns 12C and 16C and at a distance from the surfaces of the barrier metal films 12B and 16B, respectively, shows clear traces of the process in which the Cu—Mn alloy layers 12M and 16M are formed on the barrier metal films 12B and 16B once and, furthermore, Mn atoms in the above-described Cu—Mn alloy layers 12M and 16M are transferred to the barrier metal films 12B and 16B, respectively.

In the above-described experiments, the Ta film having a film thickness of about 6 nm is formed as the above-described barrier metal films 12B and 16B. The removal of Mn atoms from the Cu—Mn alloy layers 12M and 16M to the barrier metal films 12B and 16B through the above-described mechanism operates effectively when the film thicknesses of the above-described barrier metal films 12B and 16B are in at least a range of 3 nm to 15 nm.

Figure 14:
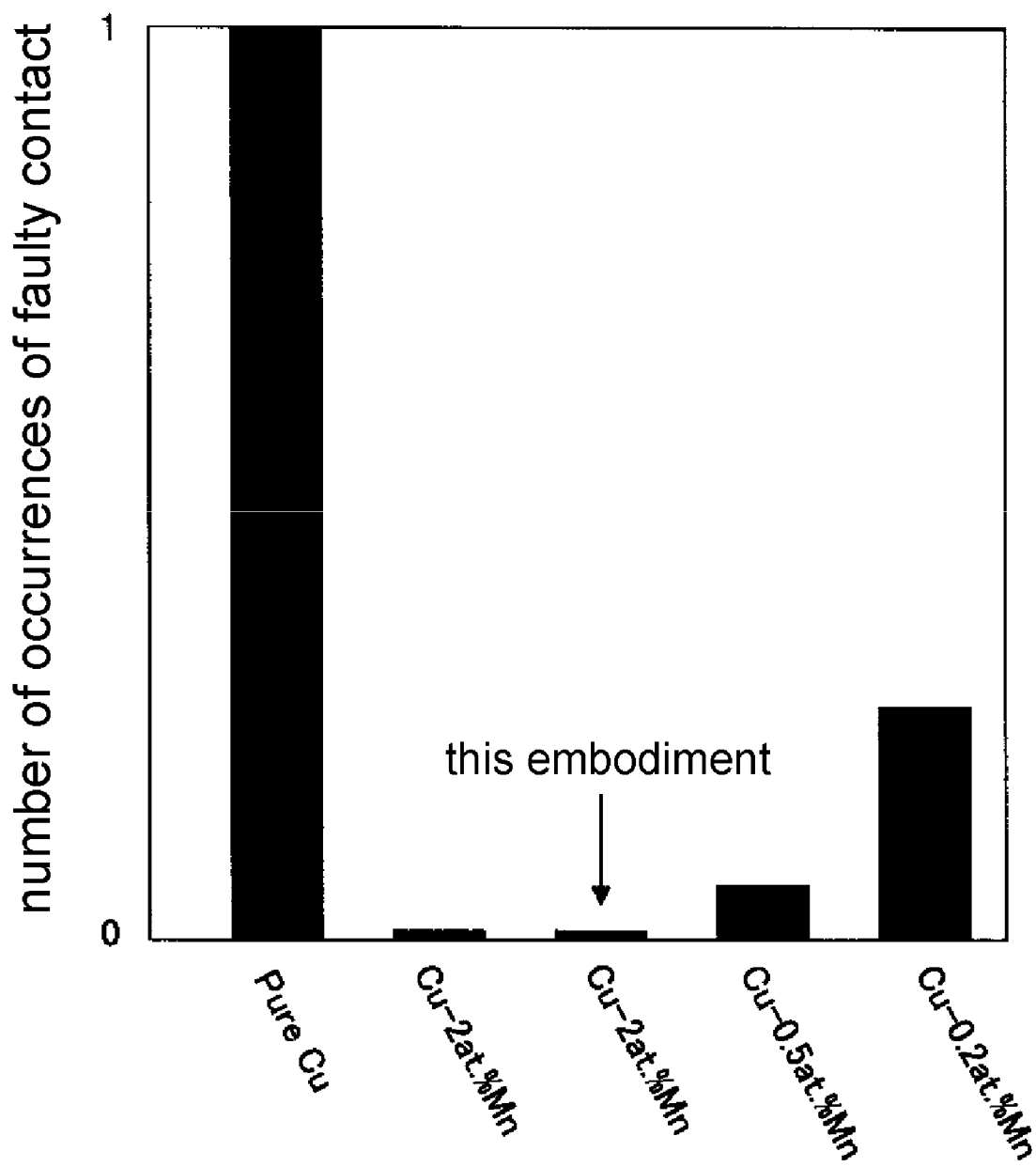
FIG. 14 is a diagram for explaining an effect of the present invention.

FIG. 14 is a graph in which the result related to the sample having the structure shown in FIG. 11 ("present invention" in the drawing) is added to the graph shown in FIG. 1A. In FIG. 14, the sample of the "present invention" is the sample in the case where the above-described Cu—Mn alloy layers 12M and 16M contain 2 atomic percent of Mn.

As is clear from FIG. 14, breaking due to stress migration can be reduced effectively by the configuration shown in FIG. 11.

Figure 15:
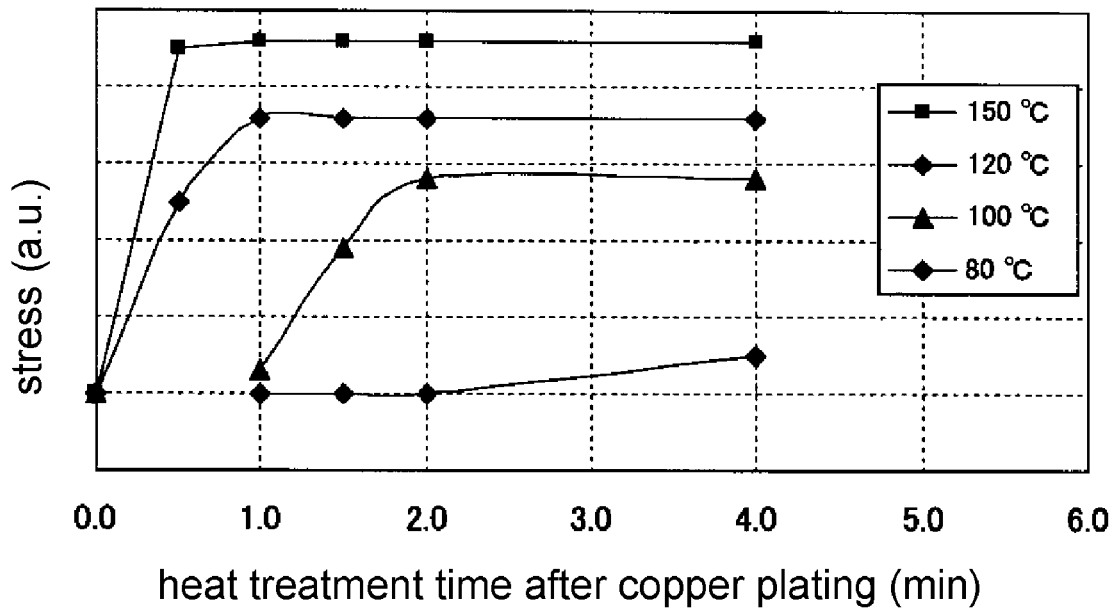
FIG. 15 is another diagram for explaining an effect of the present invention.

FIG. 15 is a graph showing the change in stress relative to the heat treatment time in the case where a copper plating film formed by an electroplating method was subjected to a heat treatment at a temperature of 150° C., 120° C., 100° C., and 80° C. In FIG. 15, the change in stress is determined by measuring warp of a wafer at ambient temperature.

As is clear from FIG. 15, a change in stress of the copper plating film occurs because of the heat treatment, but the change in stress decreases with time so that the film is stabilized. The reason for this is believed to be growth of Cu crystal grains in the Cu plating film. As is clear from the relationship shown in FIG. 15, in order to achieve stabilization of crystal grains due to stress relaxation, at least a heat treatment temperature of 80° C. or higher, and in particular 120° C. or higher is required and a treatment time of 60 seconds or more, and more preferably 90 seconds is required. It is desirable that the heat treatment is completed in a shorter time from the viewpoint of production throughput of the semiconductor device. It is clear that a heat treatment time of 250 seconds is good enough for the case where the heat treatment is conducted at a temperature of 100° C. or more. On the other hand, if the temperature is 80° C. or lower, desired film stabilization cannot be realized within a realistic time.

Figure 16:
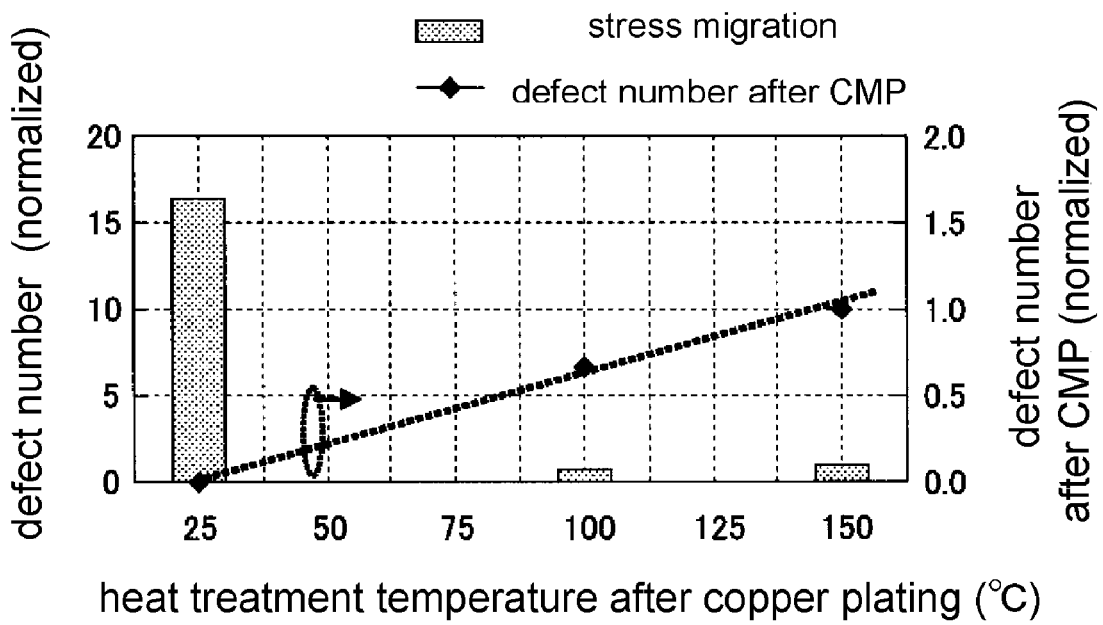
FIG. 16 is another diagram for explaining an effect of the present invention.

FIG. 16 is a diagram showing the result of the examination of the number of defects after the CMP step, as shown in FIG. 1D, of the interconnection pattern 12C and the examination of the number of defects due to stress migration of the test structure shown in FIG. 1B, in the case where the Cu—Mn alloy layers 12M and 16M in the sample shown in FIG. 1B contained Mn at any concentration, and the interconnection pattern 12C was obtained by filling a Cu layer through electroplating, conducting a heat treatment at temperatures of 150° C., 100° C., and 25° C. (in the experiment at "25° C.", no heat treatment was conducted in practice), and removing excess Cu layers by a CMP method.

As is clear from FIG. 16, the number of defects after the CMP step can be reduced as the heat treatment temperature is lowered. For example, it is clear that defects in the case where the heat treatment temperature is 150° C. can be reduced by 30% or more when the heat treatment temperature is 100° C., and by 20% or more when the heat treatment temperature is 120° C.

On the other hand, regarding the stress migration resistance, a large difference is not observed between the samples heat-treated at 150° C. and 100° C., but an improvement is slightly observed on the lower temperature side, that is, in the vicinity of 100° C. It is clear that the stress migration resistance deteriorates significantly merely in the case where a heat treatment was not conducted.

As described above, it is indicated from the results shown in FIG. 16 that in the case where the Cu—Mn alloy layers 12M and 16M in the sample shown in FIG. 1B contains Mn at any concentration, the stress migration resistance can be improved slightly and defects resulting from local dissolution of the seed layer can be reduced by 20% or more by conducting a heat treatment within a temperature range of 80° C. to 120° C. after the interconnection patterns 12C and 16C are filled through electroplating of a Cu layer.

First Embodiment

Figure 17A:
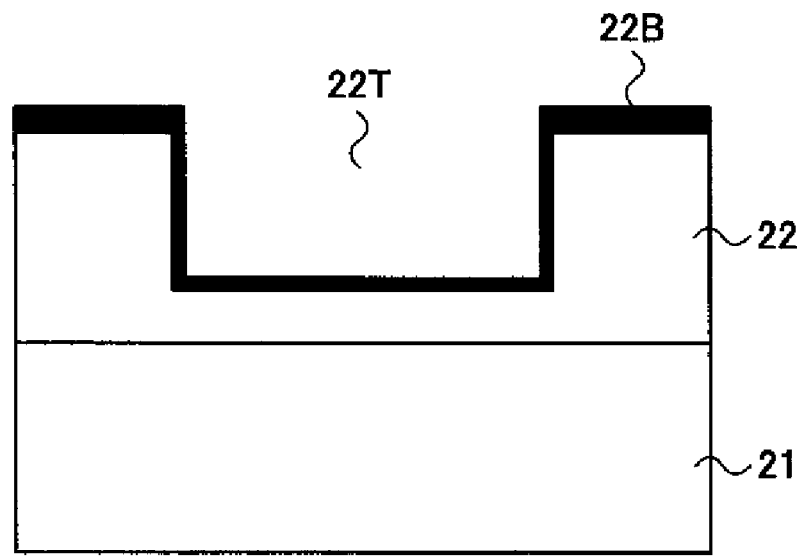
FIGS. 17A to 17P are diagrams showing a production step of a semiconductor device according to a first embodiment of the present invention.
Figure 17B:
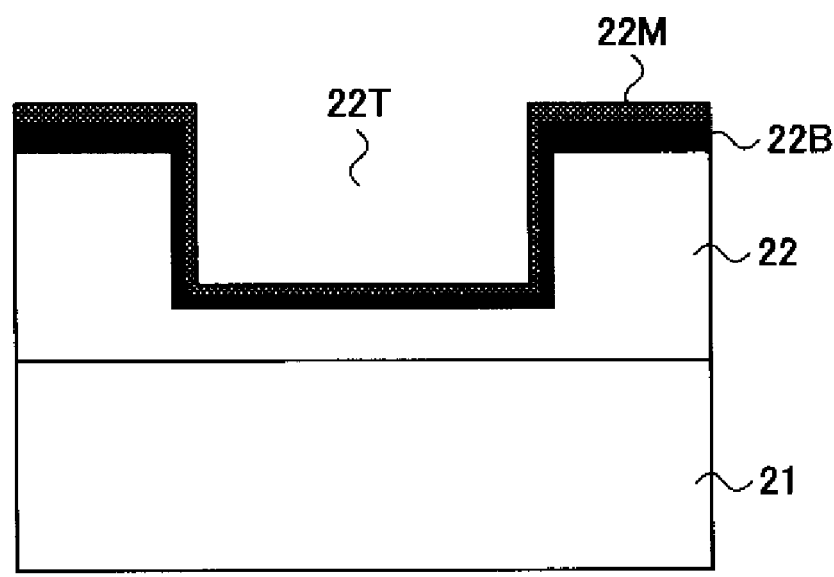
Figure 17C:
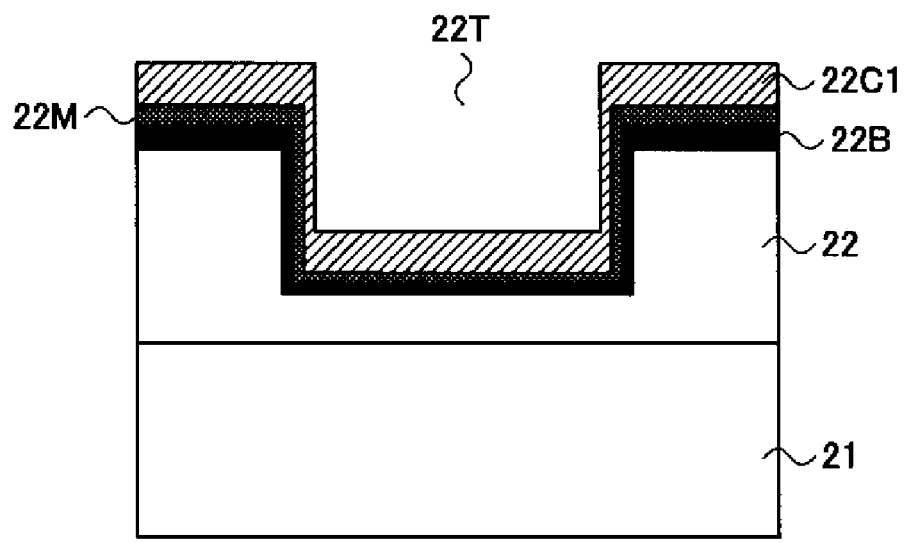
Figure 17D:
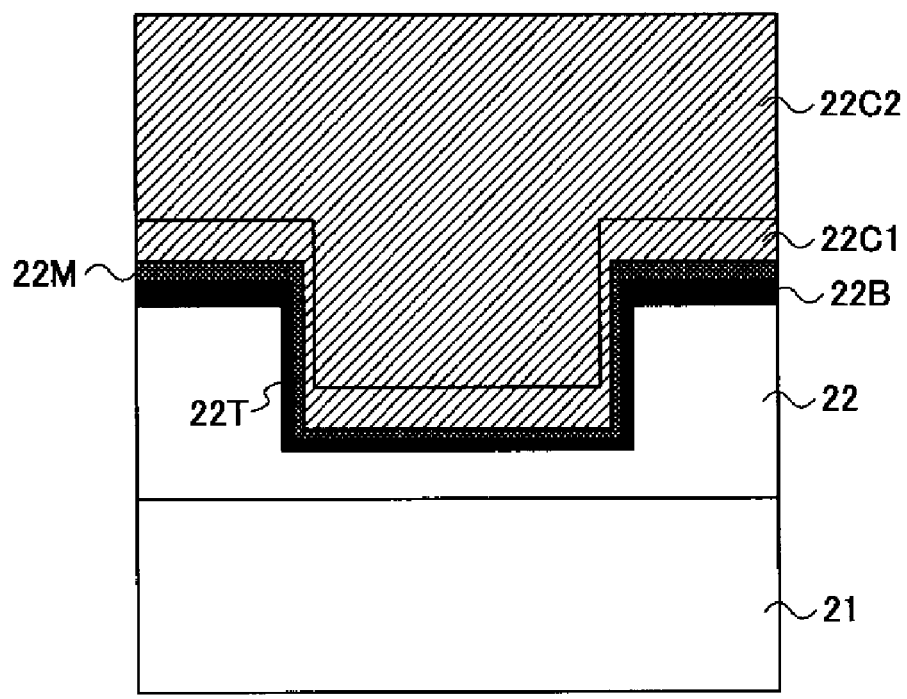
Figure 17E:
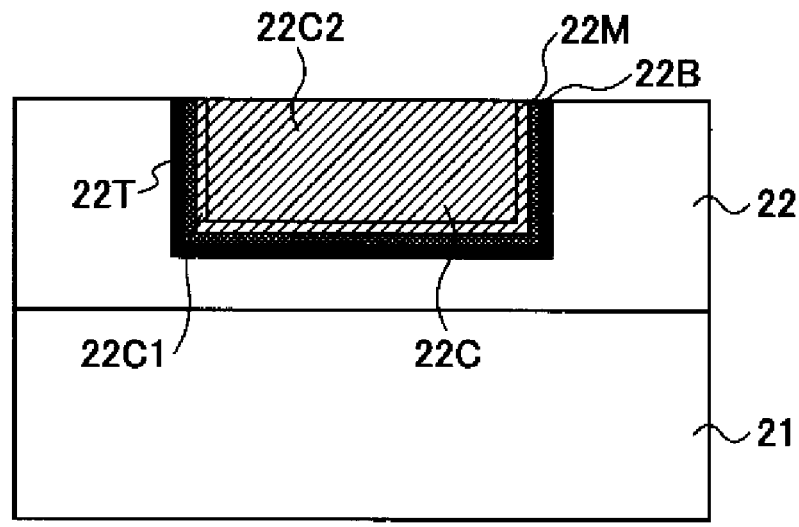
Figure 17F:
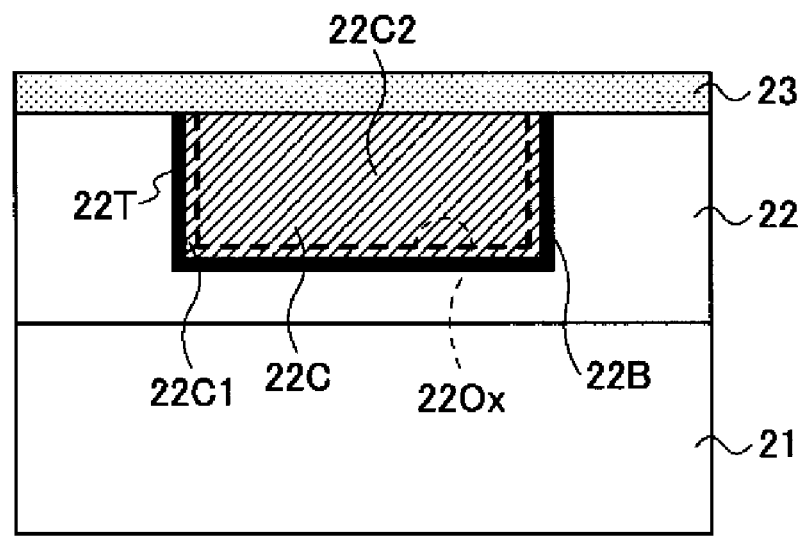
Figure 17G:
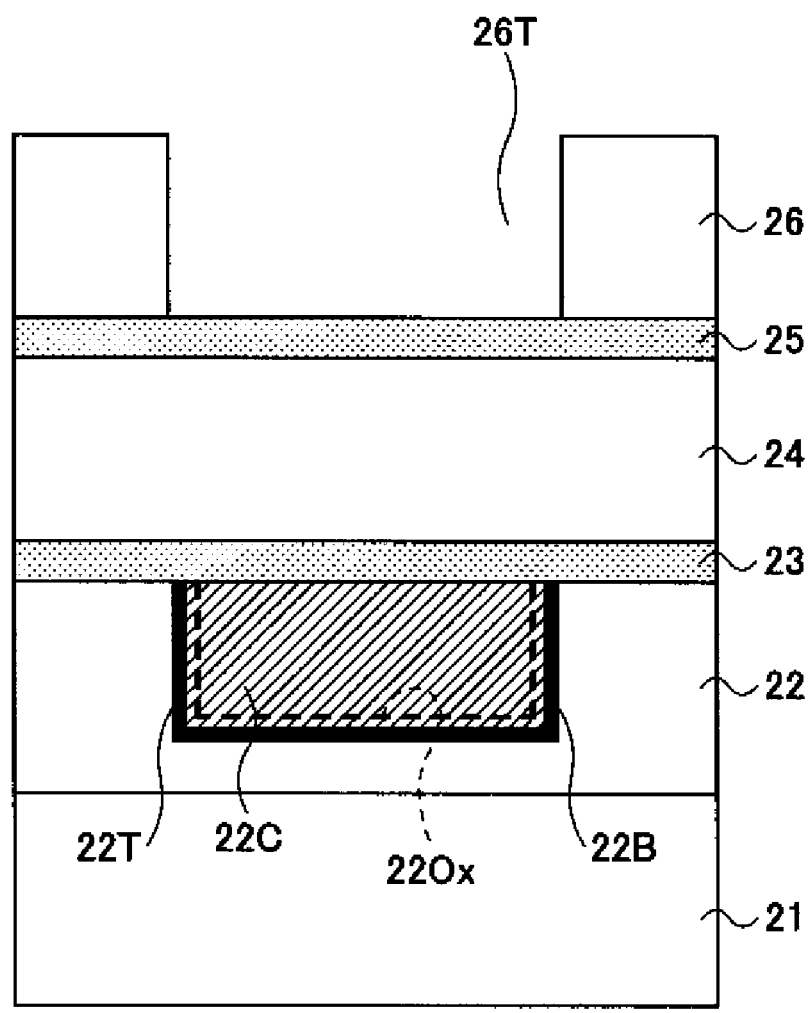
Figure 17H:
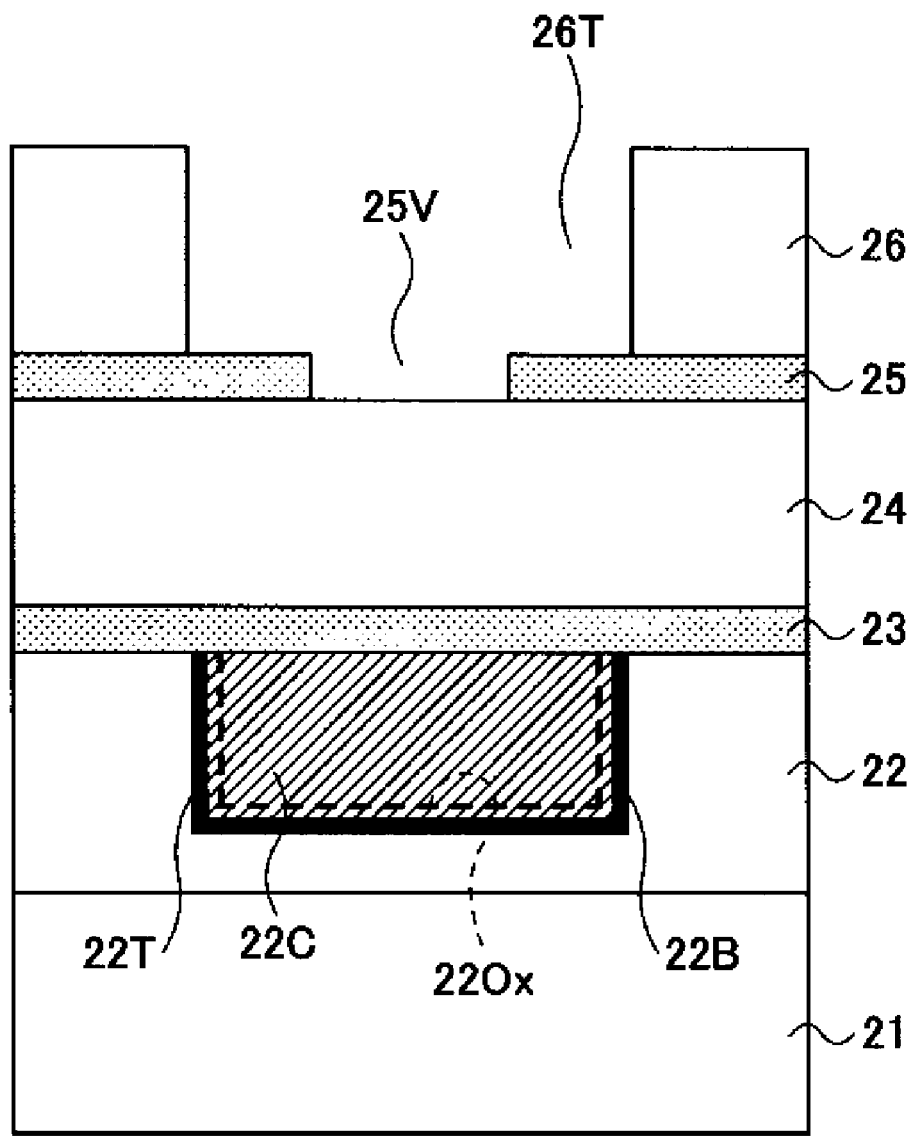
Figure 17I:
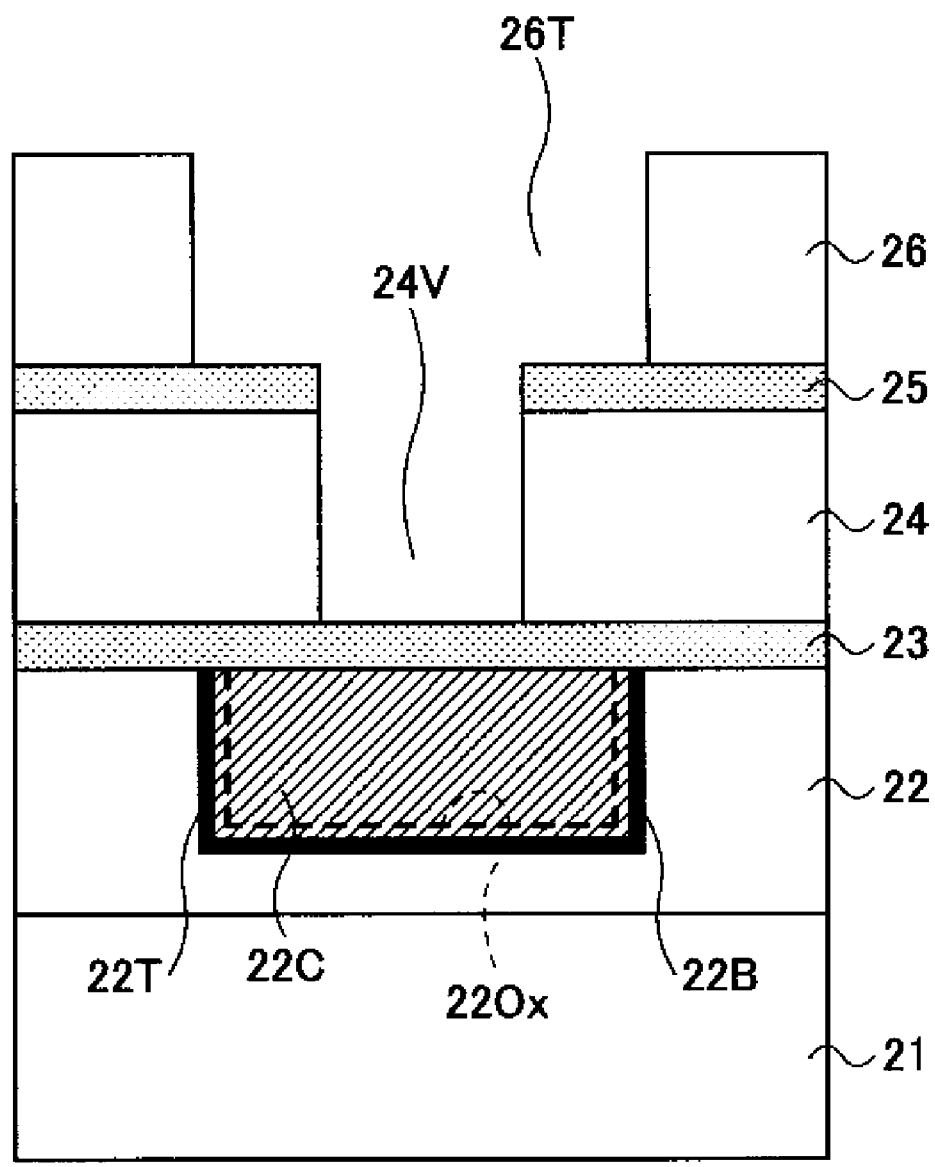
Figure 17J:
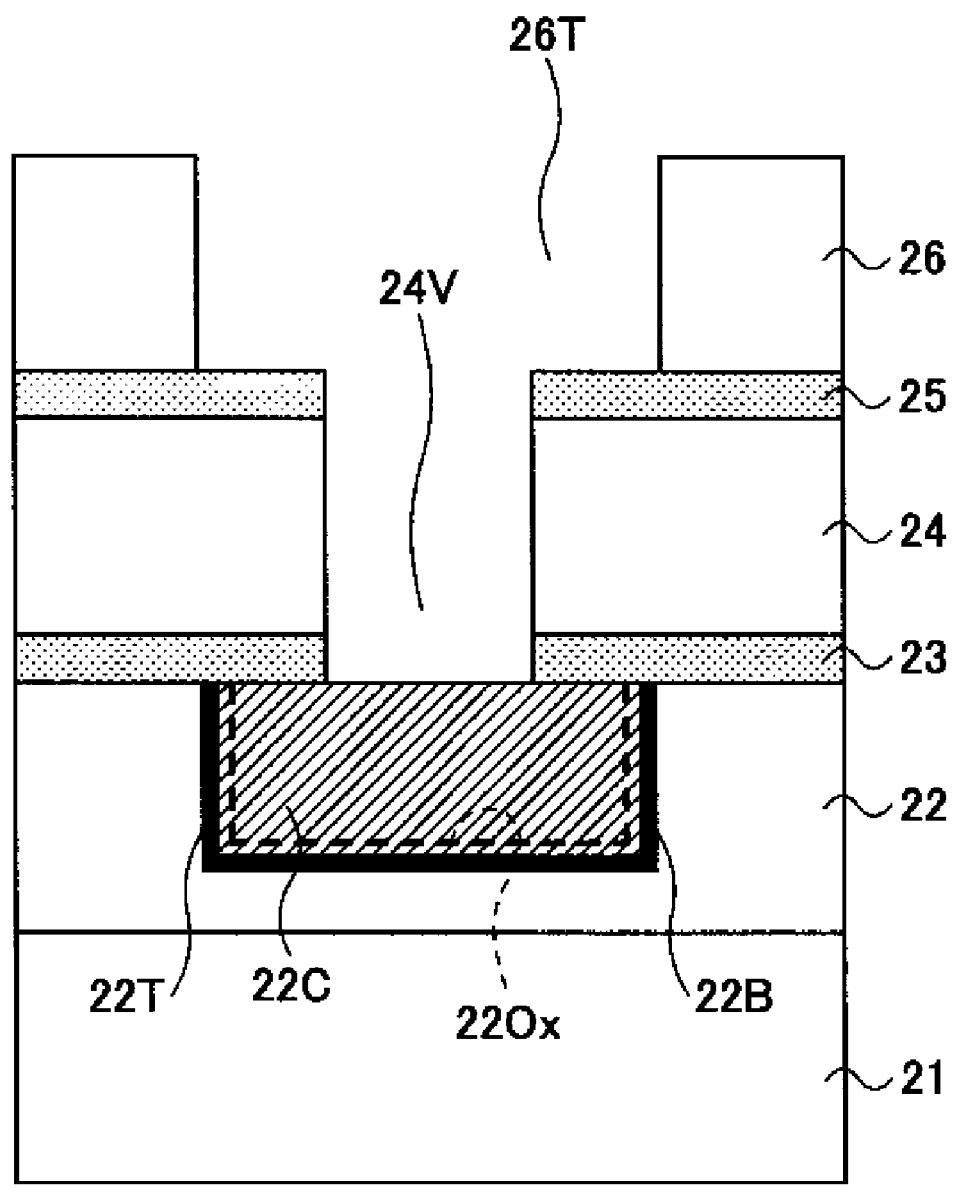
Figure 17K:
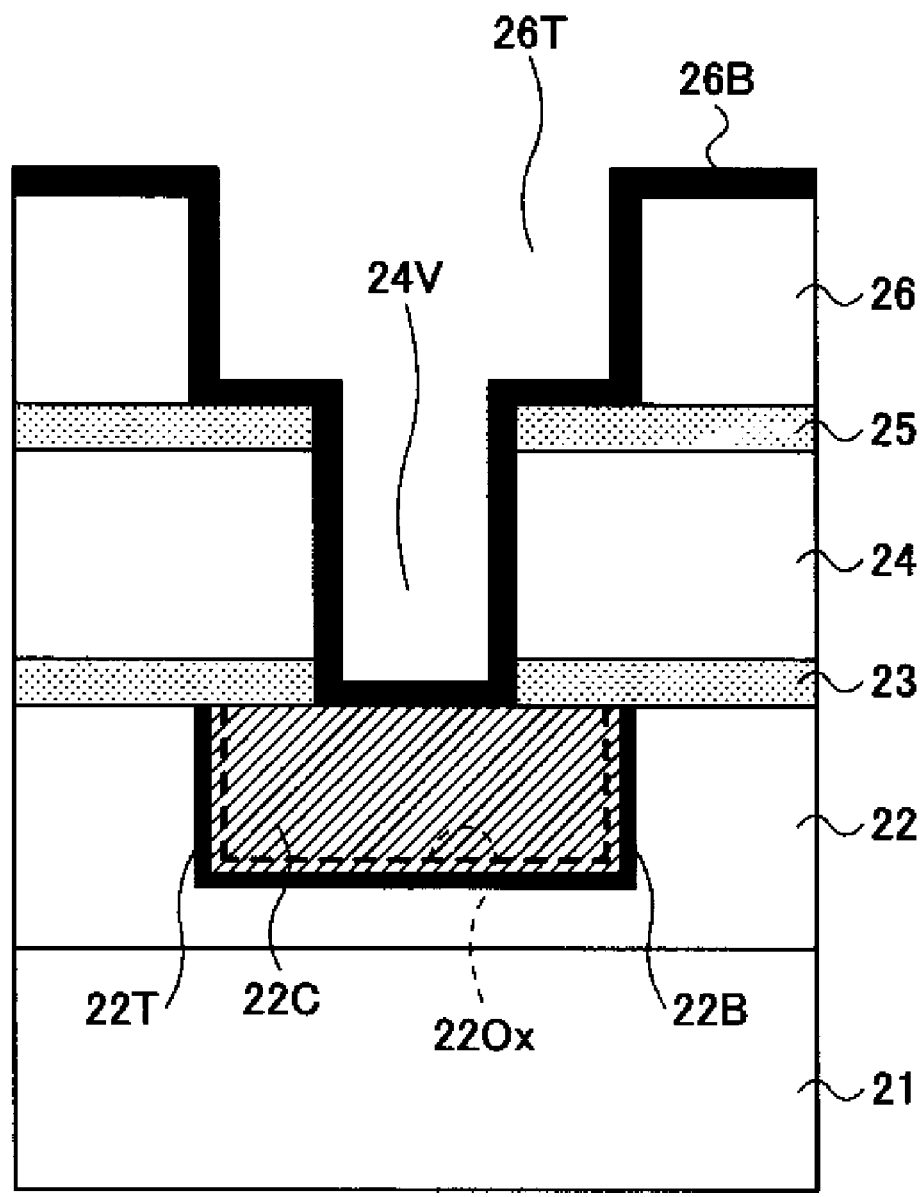
Figure 17L:
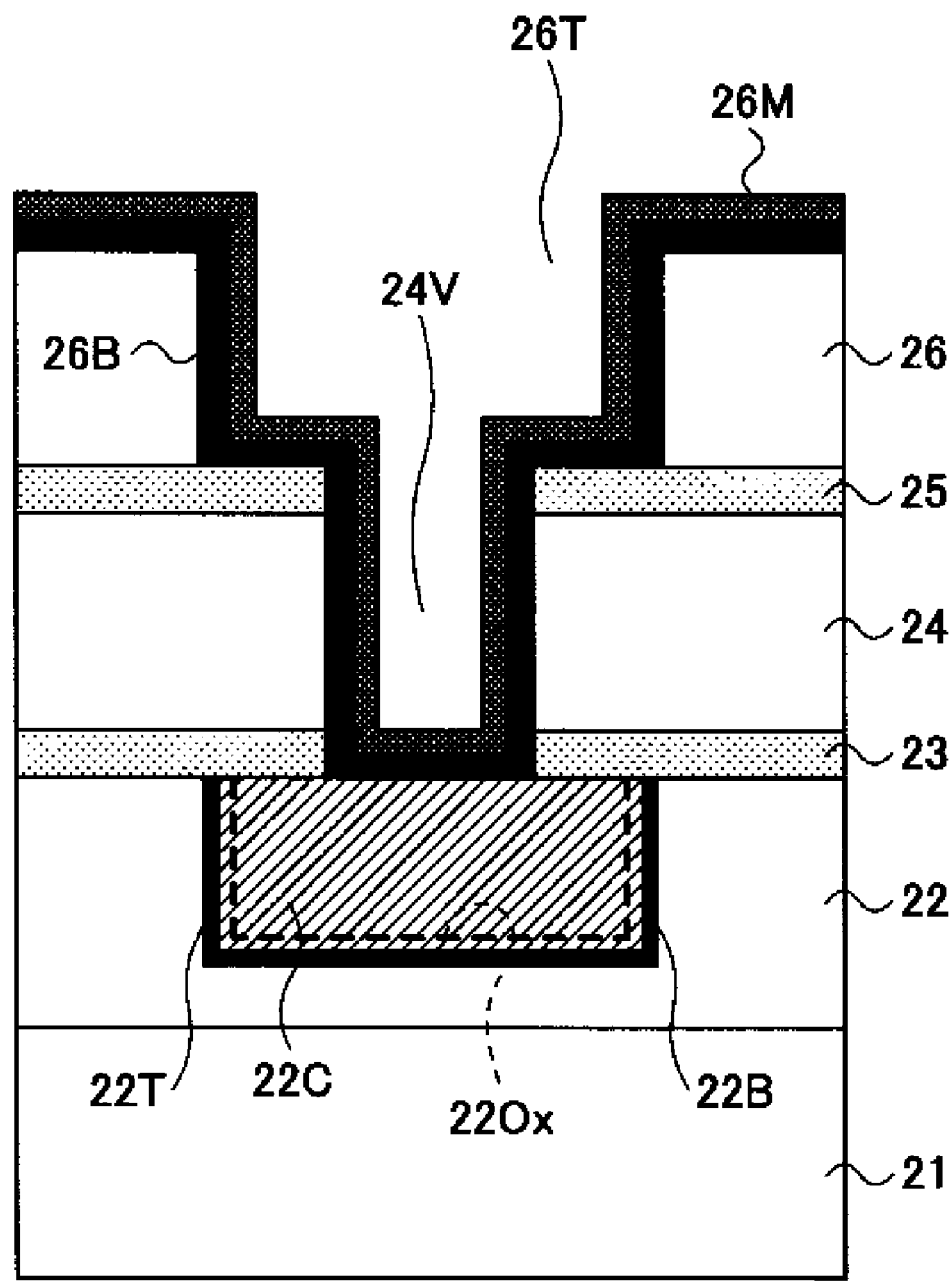
Figure 17M:
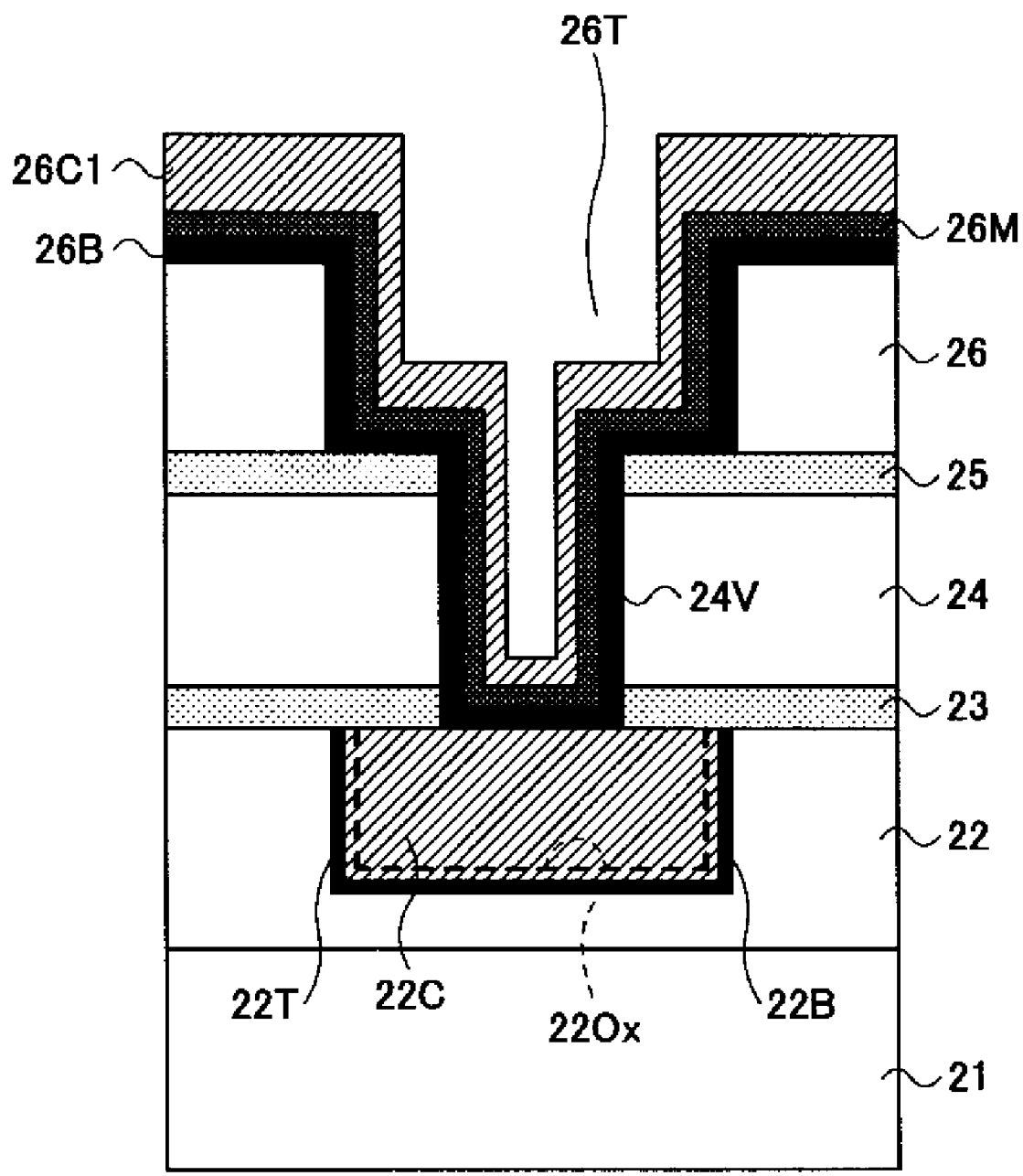
Figure 17N:
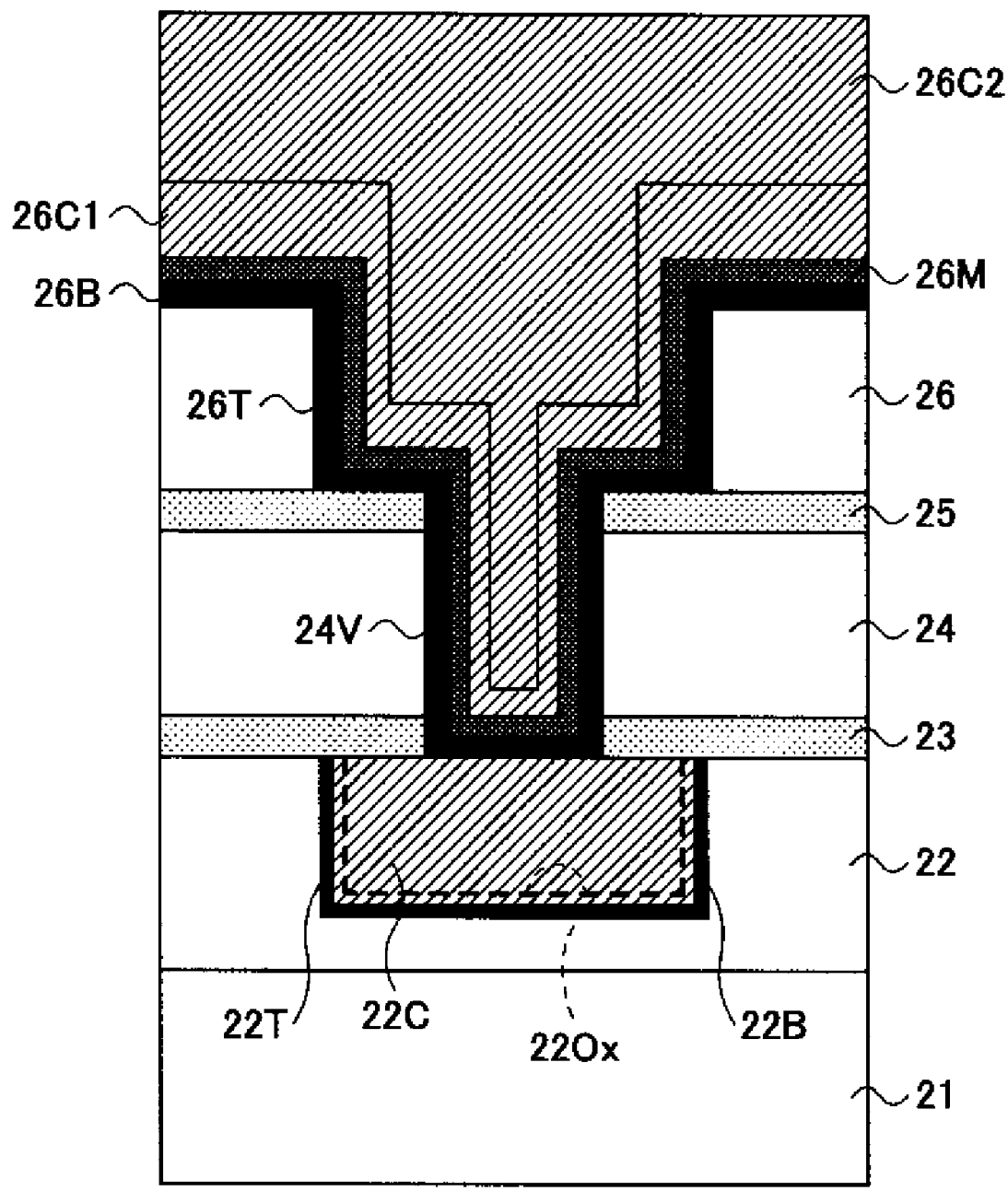
Figure 17O:
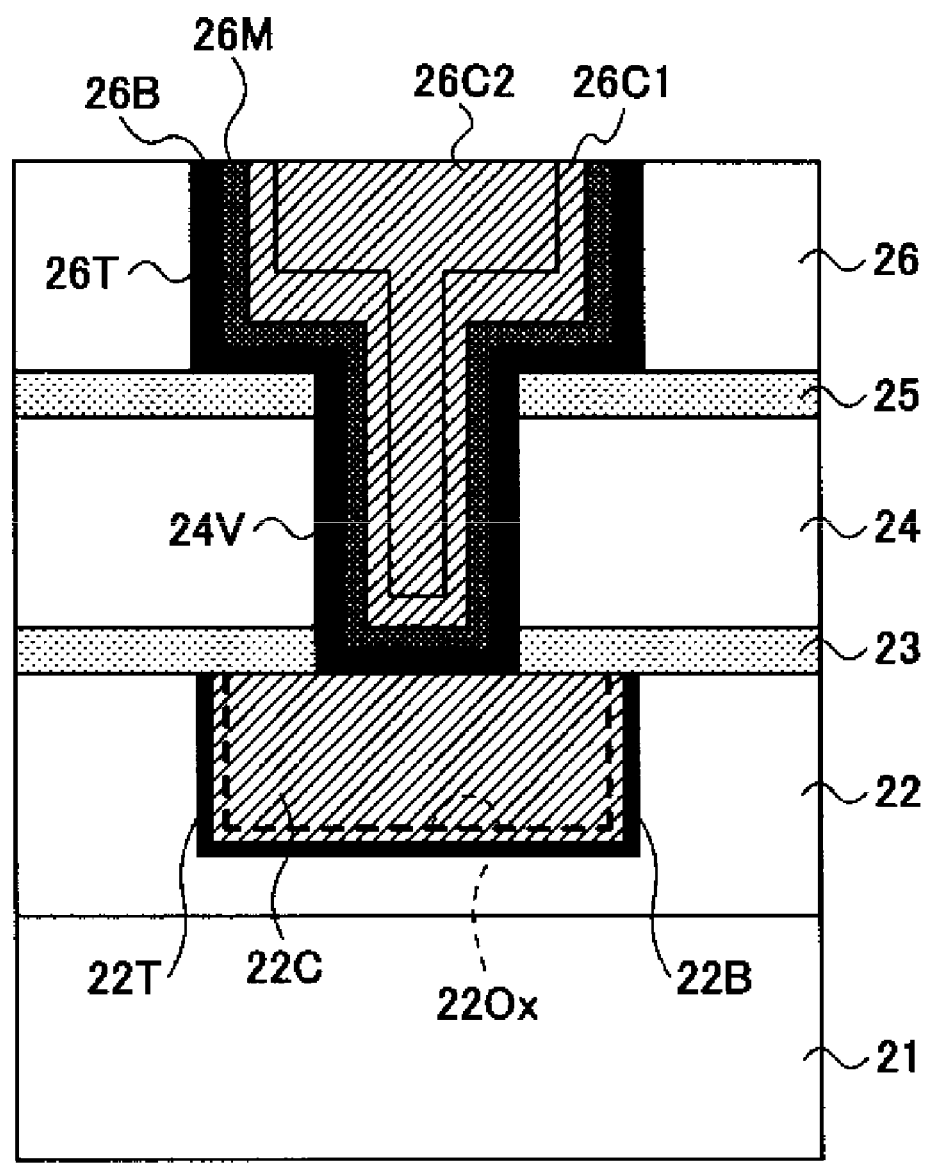
Figure 17P:
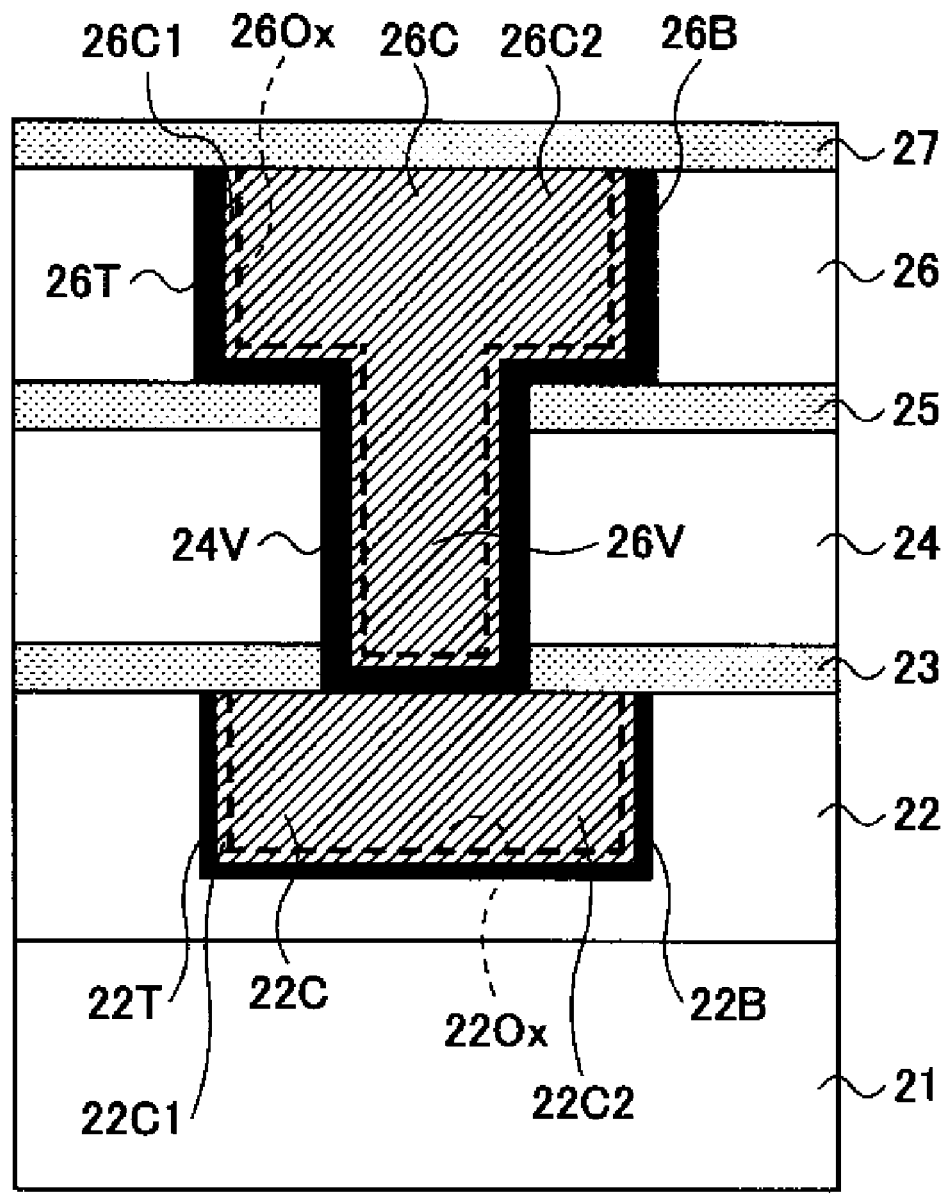

FIG. 17A to FIG. 17P are diagrams showing formation steps of a multilayer interconnection structure by using a dual damascene process according to a first embodiment of the present invention.

As shown in FIG. 17A, an interconnection groove 22T corresponding to a predetermined interconnection pattern is formed in an insulating film 22 disposed on a semiconductor substrate 21 provided with a transistor and a tungsten plug, which are not shown in the drawing. Furthermore, on the above-described insulating film 22, a barrier metal film 22B in the shape matching the cross-sectional shape of the above-described interconnection groove 22T is formed by a sputtering method, an atomic layer deposition (ALD) method, or the like, the barrier metal film 22B containing at least one high-melting point metal element, e.g., Ta, Ti, Zr, or Ru, covering the side wall surface and the bottom surface of the above-described interconnection groove 22T, and having a film thickness of 1 to 15 nm. The above-described barrier metal film 22B is not limited to the metal film, and may be an electrically conductive metal nitride film of TaN, TiN, or the like besides the metal film containing at least one metal element selected from the group consisting of Ta, Ti, Zr, and Ru.

As shown in FIG. 17B, a Mn-containing Cu—Mn alloy layer 22M in the shape matching the cross-sectional shape of the above-described interconnection groove 22T is formed on the above-described barrier metal film 22B shown in FIG. 17A by a sputtering method, in which, for example, a Cu—Mn alloy target is used, in an Ar atmosphere at $10^{-1}$ Pa and a substrate temperature lower than or equal to room temperature while 10 kW of plasma power is put in. At that time, in the case where the Mn concentration in the above-described Cu—Mn alloy layer 22M is about 30 atomic percent or less, for example, between 0.2 atomic percent and 30 atomic percent, the above-described Cu—Mn alloy layer 22M is formed to have a film thickness of about 15 nm or less on a flat surface, for example, within the range of 1 to 15 nm. On the other hand, in the case where the Mn concentration in the above-described Cu—Mn alloy layer 22M exceeds 30 atomic percent, the above-described Cu—Mn alloy layer 22M is formed in such a way that the film thickness on a flat surface becomes less than or equal to the film thickness y given by an equation y=465/x, where x represents the atomic concentration of Mn in the above-described Cu—Mn alloy layer 22M.

As shown in FIG. 17C, a Cu film 22C1 in the shape matching the cross-sectional shape of the above-described interconnection groove 22T is formed as a plating seed layer on the above-described structure shown in FIG. 17B by, for example, a sputtering method or a CVD method so as to have a film thickness of about 40 nm.

As shown in FIG. 17D, a Cu film 22C2 is formed on the above-described structure shown in FIG. 17C by using the above-described Cu film 22C1 as a plating seed layer in such a way as to fill the above-described interconnection groove 22T. Furthermore, as shown in FIG. 17E, the above-described structure shown in FIG. 17D is polished by the CMP method until a surface of the above-described insulating film 22 is exposed, so that a structure in which the above-described interconnection groove 22T is filled with the Cu interconnection pattern 22C is obtained.

As shown in FIG. 17F, an etching stopper film 23 composed of SiC is formed on the structure shown in FIG. 17 in such a way as to cover the above-described Cu interconnection pattern 22C and have a film thickness of 10 to 100 nm. Film formation of such an etching stopper film 23 is conducted typically at a temperature of 400° C. As a result, the above-described Cu film 22C1 and the Cu film 22C2 constituting the above-described Cu interconnection pattern 22C are fused and formed into a single Cu film. By the heat treatment conducted at that time, Mn atoms in the above-described Cu—Mn alloy layer 22M are transferred into the above-described barrier metal film 22B. Along with this, in the above-described Cu interconnection pattern 22C, the original Cu—Mn alloy layer 22M disappears. However, a thin layer of Mn oxide is formed at a position corresponding to the surface of the original Cu—Mn alloy layer 22M and at a distance corresponding to the film thickness of the original Cu—Mn alloy layer 82M from the surface of the above-described barrier metal film 22B, as indicated by a broken line 22Ox shown in FIG. 17F. As a result, the above-described Cu interconnection pattern 22C is formed from a region $22c1$ in which the original Cu—Mn alloy layer 22M presented and a region $22c2$ in which the original Cu films 22C1 and 22C2 presented.

As shown in FIG. 17G, an interlayer insulating film 24 having a thickness of 100 to 300 nm, an etching stopper film 25 composed of a SiC or SiN film having a thickness of 10 to 100 nm, and an interlayer insulating film 26 having a thickness of 100 to 300 nm are formed sequentially on the above-described structure shown in FIG. 17F by, for example, a plasma CVD method. Furthermore, an interconnection groove 26T for exposing the above-described etching stopper film 25 is formed in the above-described interlayer insulating film 26 by a dry etching process so as to have a desired width. The above-described interlayer insulating films 24 and 26 may be a silicon oxide film formed by a plasma CVD method by using the above-described TEOS as a raw material, or be an organic or inorganic insulating film having a relative dielectric constant of 3 or less formed by the plasma CVD method or a coating method. For example, even when an organic polymer film of registered trademark SiLK is used as the above-described interlayer insulating films 24 and 26, these films contain substantial amount of oxygen (moisture) because of damage due to etching or the like.

As shown in FIG. 17H, an opening portion 25V corresponding to a predetermined via hole is formed in the etching stopper film 25 exposed at the above-described interconnection groove 26T. Furthermore, as shown in FIG. 17I, a via hole 24V is formed in the above-described interlayer insulating film 24 by using the above-described etching stopper film 25 as a hard mask in such a way as to expose the above-described etching stopper film 23.

As shown in FIG. 17J, the above-described etching stopper film 23 at the bottom of the above-described via hole 24V is removed so as to expose the Cu interconnection pattern 22C. Thereafter, as shown in FIG. 17K, on the above-described interlayer insulating film 26, a barrier metal film 26B which is composed of Ta or Ti and which is in the shape matching the cross-sectional shape of the above-described interconnection groove 26T and the via hole 24V is formed by a sputtering method or an ALD method in such a way as to cover the side wall surface and the bottom surface of the above-described interconnection groove 26T and the side wall surface and the bottom surface of the above-described via hole 24V continuously and have a film thickness of about 1 to 15 nm. The above-described barrier metal film 26B is not limited to the metal film, and may be an electrically conductive metal nitride film of TaN, TiN, or the like besides the metal film containing at least one metal element selected from the group consisting of Ta, Ti, Zr, and Ru.

As shown in FIG. 17L, a Cu—Mn alloy layer 26M in the shape matching the cross-sectional shape of the above-described interconnection groove 26T and the via hole 24V is formed on the above-described structure shown in FIG. 17K by a sputtering method so as to cover the above-described barrier metal film 26B and have a film thickness of about 1 to 15 nm.

As shown in FIG. 17M, a Cu layer 26C1 in the shape matching the cross-sectional shape of the above-described interconnection groove 26T and the via hole 24V is formed on the above-described structure shown in FIG. 17L by a sputtering method or a CVD method so as to cover the above-described Cu—Mn alloy layer 26M and have a film thickness of 25 to 65 nm. As shown in FIG. 17N, a Cu layer 26C2 is formed on the above-described structure shown in FIG. 17M by an electroplating method by using the above-described Cu layer 26C1 as a plating seed layer so as to fill the above-described interconnection groove 26T and the via hole 24V.

As shown in FIG. 17O, the above-described Cu layers 26C1 and 26C2, the Cu—Mn alloy layer, the barrier metal film 26B on the above-described interlayer insulating film 26 are polished and removed by CMP until a surface of the above-described interlayer insulating film 26 is exposed. As shown in FIG. 17P, a cap layer composed of a SiN film or a SiC film is formed on the above-described structure shown in FIG. 17O by a plasma CVD method conducted typically at a substrate temperature of 400° C.

In the above-described interconnection groove 26T and the via hole 24V, the above-described Cu layers 26C1 and 26C2 are fused by the heat accompanying formation of the above-described cap layer 27 and formed into a single Cu interconnection pattern 26C or a Cu via plug 26V continuously extended therefrom.

Furthermore, by the heat accompanying formation of the above-described cap layer 27, Mn atoms in the above-described Cu—Mn alloy layer 26M are transferred to the above-described barrier metal film 26B and deposit stably in the form of Mn oxides on the basis of oxygen from the above-described interlayer insulating films 24 and 26 and the etching stopper films 23 and 25 in the above-described barrier metal film 26B or at an interface between the above-described barrier metal film 26B and the Cu interconnection pattern 26C or the Cu via plug 26V, an interface between the above-described barrier metal film 26B and the interlayer insulating film 24 or 26, or an interface between the above-described barrier metal film 26B and the etching stopper film 23 or 25.

In the case where a defect is present in the above-described barrier metal film 26B, such a defect is self-healed by the thus deposited Mn oxide.

Along with transfer of Mn atoms in the above-described Cu—Mn alloy layer 26M to the above-described barrier metal film 26B as described above, a Mn oxide layer 26Ox corresponding to the oxide layer formed on the surface of the above-described Cu—Mn alloy layer 26M in the above-described step shown in FIG. 17L is formed at a position corresponding to the surface of the original Cu—Mn metal alloy layer 26M and at a distance corresponding to the film thickness of the original Cu—Mn alloy layer 26M from the surface of the above-described barrier metal film 26B. As a result, as shown in FIG. 17P, the above-described Cu interconnection pattern 26C is composed of a Cu layer formed in the region 26c1 in which the original Cu—Mn alloy layer 26M presented and a Cu layer formed in a region 26c2 in which the original Cu layers 26C1 and 26C2 presented.

Figure 18:
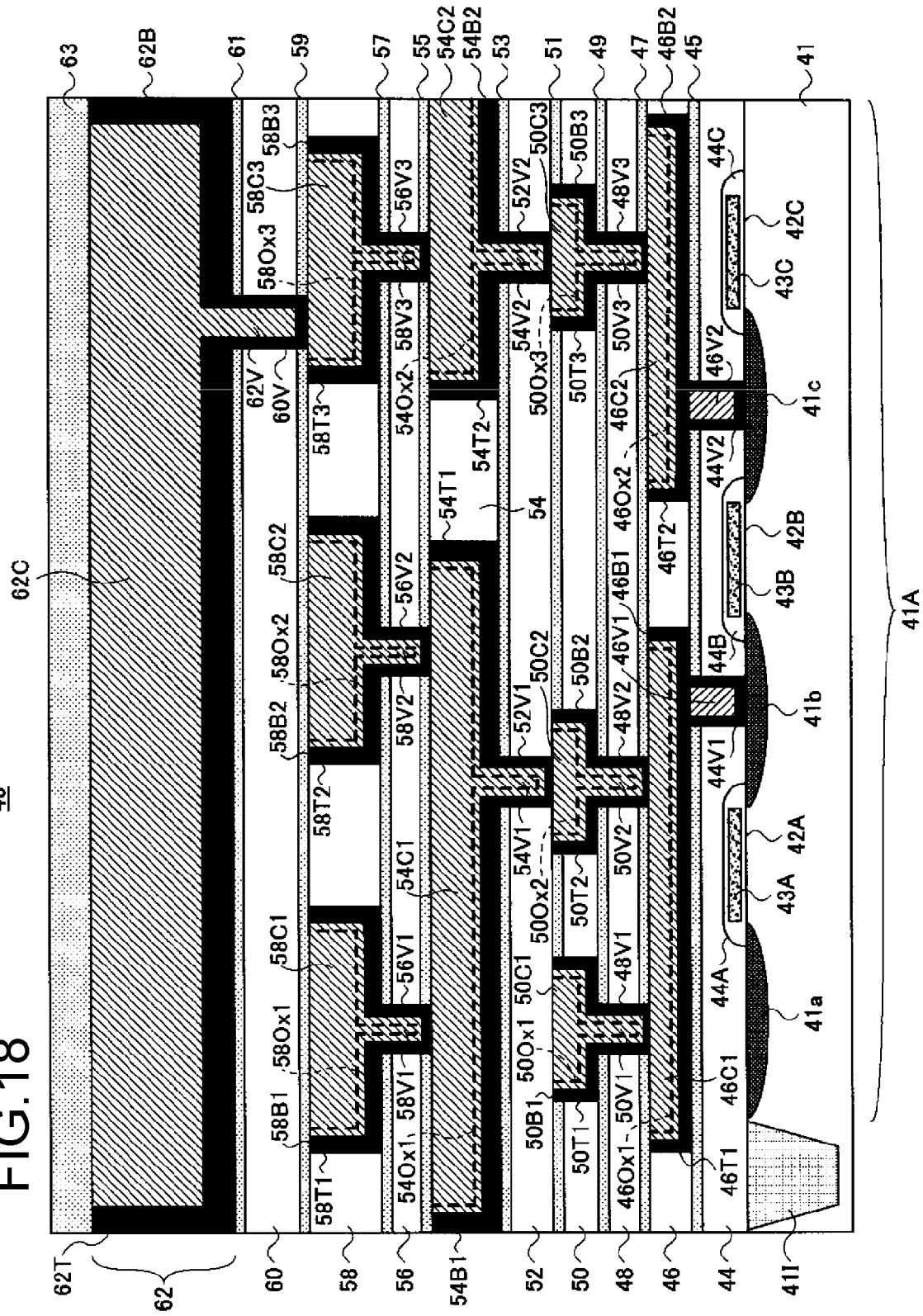
FIG. 18 is a diagram showing the configuration of a semiconductor device according to the first embodiment.

In the present invention, the above-described steps are repeated on a semiconductor substrate, e.g., a silicon substrate, provided with transistors and tungsten plugs, and thereby, a semiconductor device 40 as shown in FIG. 18 can be produced.

As shown in FIG. 18, on a silicon substrate 41, an element region 41A is ensured by separation with an element separation structure 41I. Gate electrodes 43A, 43B, and 43C are disposed on the above-described silicon substrate 41 with gate insulating films 42A, 42B, and 42C, respectively, therebetween in the above-described element region 41A.

In the above-described silicon substrate 41 in the above-described element region 41A, p-type or n-type diffusion regions 41a, 41b, and 41c are disposed adjacent to the above-described gate electrodes 43A, 43B, and 43C.

The above-described gate electrodes 43A, 43B, and 43C are covered with insulating films 44A, 44B, and 44C, respectively, composed of SiON or the like. Furthermore, an insulating film 44 composed of a silicon oxide film or the like is disposed on the above-described silicon substrate 41 in such a way as to cover the above-described gate electrodes 43A to 43C with the above-described insulating films 44A to 44C, respectively, therebetween. A via hole 44V1 which exposes the above-described diffusion region 41b and a via hole 44V2 which exposes the above-described diffusion region 41c are disposed in the above-described insulating film 44. The side wall surfaces and the bottom surfaces of these via holes 44V1 and 44V2 are continuously covered with barrier metal films 46B1 and 46B2 composed of, for example, TiN, and the above-described via holes 44V1 and 44V2 are filled with tungsten 46V1 and 46V2, respectively.

An interlayer insulating film 46 composed of an inorganic or organic insulating film including a porous film is disposed on the above-described insulating film 44 with an etching stopper film 45 composed of SiN or SiC therebetween. In the above-described interlayer insulating film 46, interconnection grooves 46T1 and 46T2 are disposed along a predetermined interconnection pattern.

The side wall surface and the bottom surface of the above-described interconnection groove 46T1 is continuously covered with the barrier metal film 46B1 containing at least one high-melting point metal element, e.g., Ta, Ti, Zr, or Ru. The above-described interconnection groove 46T1 is filled with the Cu interconnection pattern 46C1 with the above-described barrier metal film 46B1 therebetween.

Likewise, the side wall surface and the bottom surface of the above-described interconnection groove 46T2 is continuously covered with the barrier metal film 46B2 containing at least one high-melting point metal element, e.g., Ta, Ti, Zr, or Ru. The above-described interconnection groove 46T2 is filled with the Cu interconnection pattern 46C2 with the above-described barrier metal film 46B2 therebetween.

An interlayer insulating film 48 composed of an inorganic or organic insulating film including a porous film is disposed on the above-described insulating film 46 with an etching stopper film 47 composed of SiN or SiC therebetween. An interlayer insulating film 50 composed of an inorganic or organic insulating film including a porous film is disposed on the above-described insulating film 48 with an etching stopper film 49 composed of SiN or SiC therebetween.

In the above-described interlayer insulating film 50, interconnection grooves 50T1, 50T2, and 50T3 are disposed along a predetermined interconnection pattern. Furthermore, in the above-described insulating film 48, a via hole 48V1 for exposing the above-described Cu interconnection pattern 46C1 is disposed in correspondence with the above-described interconnection grooves 50T1 while penetrating the above-described etching stopper film 49. In the above-described insulating film 48, a via hole 48V2 for exposing the above-described Cu interconnection pattern 46C1 is disposed in correspondence with the above-described interconnection grooves 50T2 while penetrating the above-described etching stopper film 49. Moreover, in the above-described insulating film 48, a via hole 48V3 for exposing the above-described Cu interconnection pattern 46C2 is disposed in correspondence with the above-described interconnection grooves 50T3 while penetrating the above-described etching stopper film 49.

The side wall surfaces and the bottom surfaces of the above-described interconnection groove 50T1 and the via hole 48V1 are continuously covered with a barrier metal film 50B1 containing at least one high-melting point metal element, e.g., Ta, Ti, Zr, or Ru. The above-described interconnection groove 50T1 and the via hole 48V1 are filled with a Cu interconnection pattern 50C1 and a Cu via plug 50V1 continuously extended from the Cu interconnection pattern 50C1 with the above-described barrier metal film 50B1 therebetween.

Likewise, the side wall surfaces and the bottom surfaces of the above-described interconnection groove 50T2 and the via hole 48V2 are continuously covered with a barrier metal film 50B2 containing at least one high-melting point metal element, e.g., Ta, Ti, Zr, or Ru. The above-described interconnection groove 50T2 and the via hole 48V2 are filled with a Cu interconnection pattern 50C2 and a Cu via plug 50V2 continuously extended from the Cu interconnection pattern 50C2 with the above-described barrier metal film 50B2 therebetween.

Likewise, the side wall surfaces and the bottom surfaces of the above-described interconnection groove 50T3 and the via hole 48V3 are continuously covered with a barrier metal film 50B3 containing at least one high-melting point metal element, e.g., Ta, Ti, Zr, or Ru. The above-described interconnection groove 50T3 and the via hole 48V3 are filled with a Cu interconnection pattern 50C3 and a Cu via plug 50V3 continuously extended from the Cu interconnection pattern 50C3 with the above-described barrier metal film 50B3 therebetween.

An interlayer insulating film 52 composed of an inorganic or organic insulating film including a porous film is disposed on the above-described insulating film 50 with an etching stopper film 51 composed of SiN or SiC therebetween. An interlayer insulating film 54 composed of an inorganic or organic insulating film including a porous film is disposed on the above-described insulating film 52 with an etching stopper film 53 composed of SiN or SiC therebetween.

In the above-described interlayer insulating film 54, interconnection grooves 54T1 and 54T2 are disposed along a predetermined interconnection pattern. Furthermore, in the above-described insulating film 52, a via hole 52V1 for exposing the above-described Cu interconnection pattern 50C2 is disposed in correspondence with the above-described interconnection groove 54T1 while penetrating the above-described etching stopper film 53. In the above-described insulating film 52, a via hole 52V2 for exposing the above-described Cu interconnection pattern 50C3 is disposed in correspondence with the above-described interconnection grooves 54T2 while penetrating the above-described etching stopper film 53.

The side wall surfaces and the bottom surfaces of the above-described interconnection groove 54T1 and the via hole 52V1 are continuously covered with a barrier metal film 54B1 containing at least one high-melting point metal element, e.g., Ta, Ti, Zr, or Ru. The above-described interconnection groove 54T1 and the via hole 52V1 are filled with a Cu interconnection pattern 54C1 and a Cu via plug 54V1 continuously extended from the Cu interconnection pattern 54C1 with the above-described barrier metal film 54B1 therebetween.

Likewise, the side wall surfaces and the bottom surfaces of the above-described interconnection groove 54T2 and the via hole 52V2 are continuously covered with a barrier metal film 54B2 containing at least one high-melting point metal element, e.g., Ta, Ti, Zr, or Ru. The above-described interconnection groove 54T2 and the via hole 52V2 are filled with a Cu interconnection pattern 54C2 and a Cu via plug 54V2 continuously extended from the Cu interconnection pattern 54C2 with the above-described barrier metal film 54B2 therebetween.

An interlayer insulating film 56 composed of an inorganic or organic insulating film including a porous film is disposed on the above-described insulating film 54 with an etching stopper film 55 composed of SiN or SiC therebetween. An interlayer insulating film 58 composed of an inorganic or organic insulating film including a porous film is disposed on the above-described insulating film 56 with an etching stopper film 57 composed of SiN or SiC therebetween.

In the above-described interlayer insulating film 58, interconnection grooves 58T1 and 58T2 are disposed along a predetermined interconnection pattern. Furthermore, in the above-described insulating film 56, a via hole 56V1 for exposing the above-described Cu interconnection pattern 54C1 is disposed in correspondence with the above-described interconnection groove 58T1 while penetrating the above-described etching stopper film 57. In the above-described insulating film 56, a via hole 56V2 for exposing the above-described Cu interconnection pattern 54C1 is disposed in correspondence with the above-described interconnection groove 58T2 while penetrating the above-described etching stopper film 57. Likewise, In the above-described insulating film 56, a via hole 56V3 for exposing the above-described Cu interconnection pattern 54C2 is disposed in correspondence with the above-described interconnection groove 58T3 while penetrating the above-described etching stopper film 57.

The side wall surfaces and the bottom surfaces of the above-described interconnection groove 58T1 and the via hole 56V1 are continuously covered with a barrier metal film 58B1 containing at least one high-melting point metal element, e.g., Ta, Ti, Zr, or Ru. The above-described interconnection groove 58T1 and the via hole 56V1 are filled with a Cu interconnection pattern 58C1 and a Cu via plug 58V1 continuously extended from the Cu interconnection pattern 58C1 with the above-described barrier metal film 58B1 therebetween.

Likewise, the side wall surfaces and the bottom surfaces of the above-described interconnection groove 58T2 and the via hole 56V2 are continuously covered with a barrier metal film 58B2 containing at least one high-melting point metal element, e.g., Ta, Ti, Zr, or Ru. The above-described interconnection groove 58T2 and the via hole 56V2 are filled with a Cu interconnection pattern 58C2 and a Cu via plug 58V2 with the above-described barrier metal film 58B2 therebetween. Likewise, the side wall surfaces and the bottom surfaces of the above-described interconnection groove 58T3 and the via hole 56V3 are continuously covered with a barrier metal film 58B3 containing at least one high-melting point metal element, e.g., Ta, Ti, Zr, or Ru. The above-described interconnection groove 58T3 and the via hole 56V3 are filled with a Cu interconnection pattern 58C3 and a Cu via plug 58V3 with the above-described barrier metal film 58B3 therebetween.

Furthermore, an interlayer insulating film 60 composed of an inorganic or organic insulating film including a porous film is disposed on the above-described interlayer insulating film 58 with an etching stopper film 59 composed of SiN or SiC therebetween. Another interlayer insulating film 62 composed of $SiO_2$ or the like is disposed on the above-described interlayer insulating film 60 with an etching stopper film 61 composed of SiN or SiC therebetween.

In the above-described another interlayer insulating film 62, an interconnection groove 62T is disposed along a predetermined interconnection pattern. Furthermore, in the above-described interlayer insulating film 60, a via hole 60V for exposing the above-described Cu interconnection pattern 58C3 is disposed in correspondence with the above-described interconnection groove 62T while penetrating the above-described etching stopper film 59.

The side wall surfaces and the bottom surfaces of the above-described interconnection groove 62T and the via hole 60V are continuously covered with a barrier metal film 62B containing at least one high-melting point metal element, e.g., Ta, Ti, Zr, or Ru. The above-described interconnection groove 62T and the via hole 60V are filled with an interconnection pattern 62C composed of Al or Cu and a via plug 62V composed of Cu or Al continuously extended from the interconnection pattern 62C with the above-described barrier metal film 62B therebetween.

Furthermore, a cap film 63 composed of SiN or the like is formed on the above-described another interlayer insulating film 62 in such a way as to cover the above-described interconnection pattern 62C by a plasma CVD method or the like.

Regarding the semiconductor device 40 shown in FIG. 18, in the formation of the above-described Cu interconnection patterns 46C1, 46C2, 50C1 to 50C3, 54C1, 54C2, 58C1 to 58C3, and the like, the Cu—Mn alloy layers corresponding to the above-described Cu—Mn alloy layer 22M or 26M are formed adjacently to respective barrier metal films in such a way as to have film thicknesses and/or concentrations which enable substantially all Mn atoms in the above-described Cu—Mn alloy layers to transfer to the above-described adjacent barrier metal films. Consequently, a characteristic cross-sectional structure is obtained, in which substantially all of the above-described Mn atoms are transferred to the above-described adjacent barrier metal films in the formation of the above-described cap film 63, and thin Mn oxide layers 46Ox1, 46Ox2, 50Ox1 to 50Ox3, 54Ox1, 54Ox2, and 58Ox1 to 58Ox3 remain merely at portions corresponding to the surfaces of the original Cu—Mn alloy layers, as indicated by broken lines in FIG. 18.

Regarding the semiconductor device 40 having the above-described multilayer interconnection structure, as described above with reference to FIG. 14, the Cu—Mn alloy layer having a high Mn concentration is disposed and, thereby, the stress migration resistance is improved significantly. In addition, an increase in interconnection resistance due to Mn can be suppressed.

In the above-described step shown in FIG. 17M of the present embodiment, the above-described interconnection groove 26T and the via hole 24V can also be filled through deposition of a Cu layer at a time, or several by a MOCVD method, for example. In this case, the above-described interconnection groove 26T and the via hole 24V are filled with the Cu layer deposited by the MOCVD method and the electroplating process shown in FIG. 17N can be omitted.

In the above-described formation step of Cu—Mn alloy layer 22M or 26M shown in FIG. 17B or 17L in the present embodiment, it is clear from the above-described relationship shown in FIG. 10 that if the film thickness of the above-described Cu—Mn alloy layer 22M or 26M is specified to be 1 nm or more, and 4.5 nm or less, a Cu—Mn alloy film or a Mn film containing Mn at a concentration of 0.2 atomic percent to 100 atomic percent can be used relative to the above-described Cu—Mn alloy layer 22M or 26M.

In the present embodiment, the Cu film 22C1 in the interconnection groove 22T shown in FIG. 17C and, furthermore, the Cu layer 26C1 in the interconnection groove 26T and the via hole 24V shown in FIG. 17M are formed by the sputtering method, and after the above-described interconnection groove 22T, the interconnection groove 26T, and the via hole 24V are filled by the electroplating method, the heat treatment is conducted at 80° C. to 120° C.

Likewise, in the semiconductor device 40 shown in FIG. 18 as well, in the formation of the above-described Cu interconnection patterns 46C1, 46C2, 50C1 to 50C3, 54C1, 54C2, 58C1 to 58C3, and the like, the same heat treatment is conducted in the case where the Cu layers corresponding to the above-described Cu layer 22C1 or the Cu layer 26C1 is formed by the sputtering method and, furthermore, the Cu layer is filled by using the electroplating method.

Second Embodiment

Figure 19A:
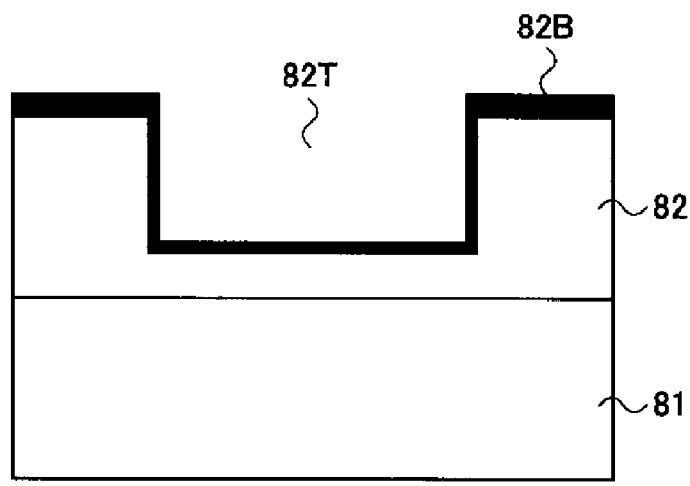
FIGS. 19A to 19P are diagrams showing a production step of a semiconductor device according to a second embodiment of the present invention.
Figure 19B:
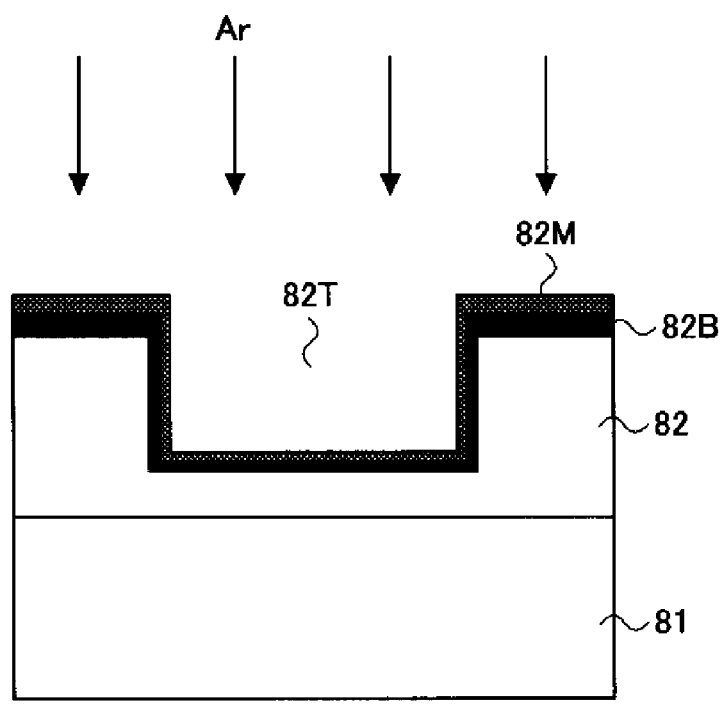
Figure 19C:
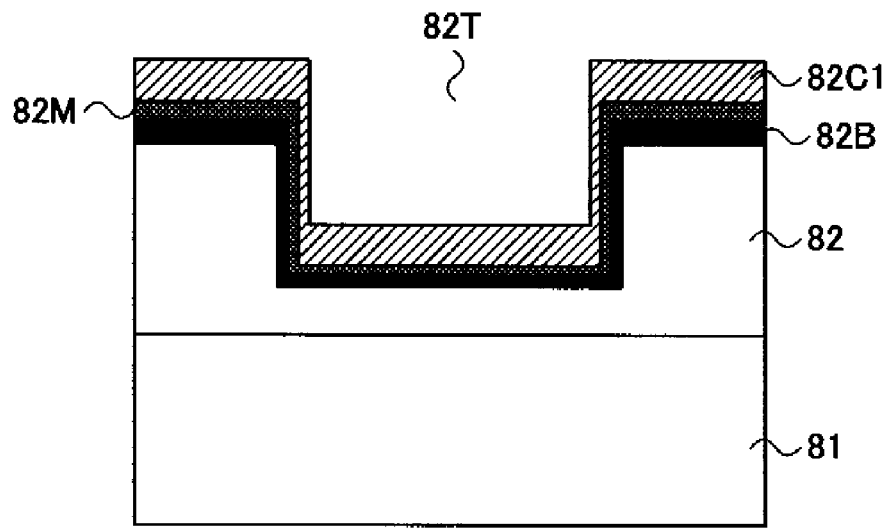
Figure 19D:
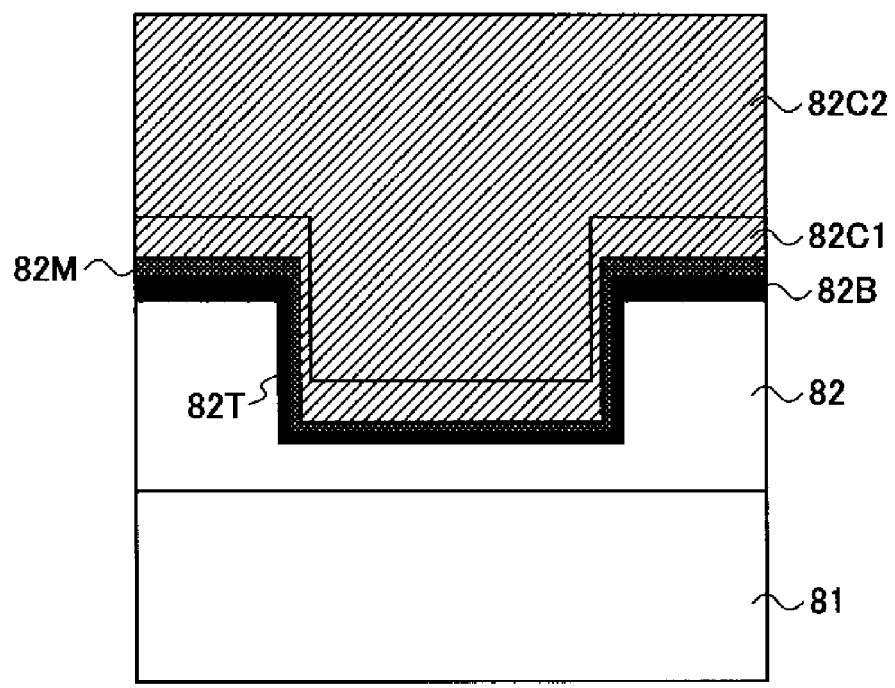
Figure 19E:
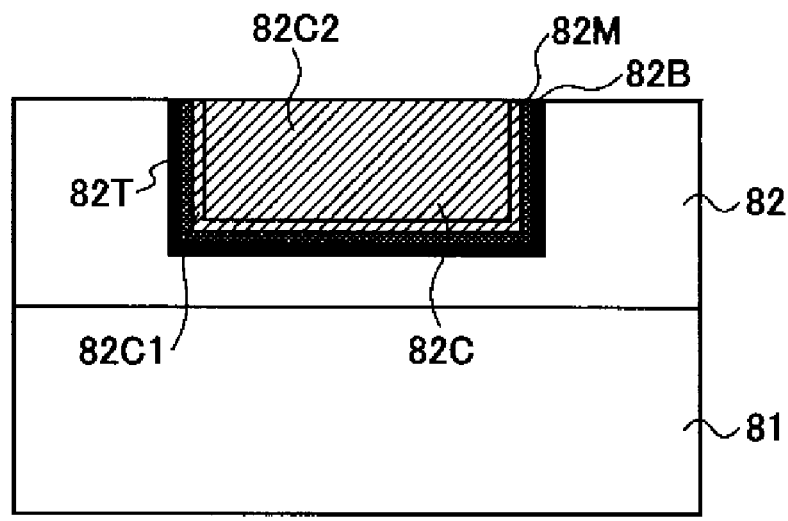
Figure 19F:
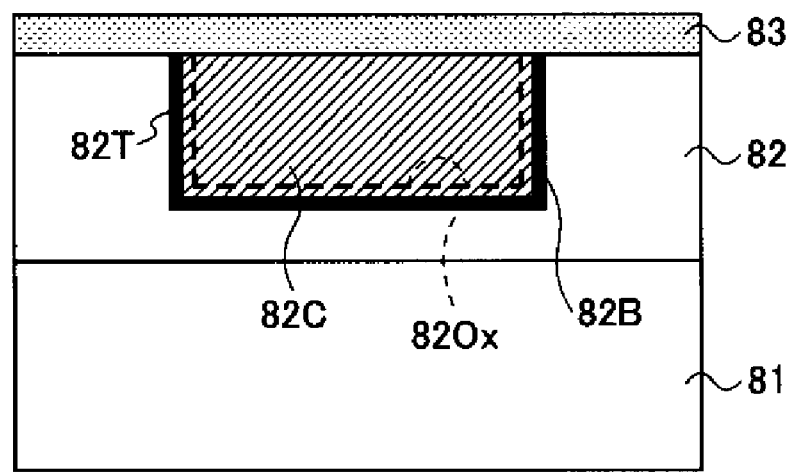
Figure 19G:
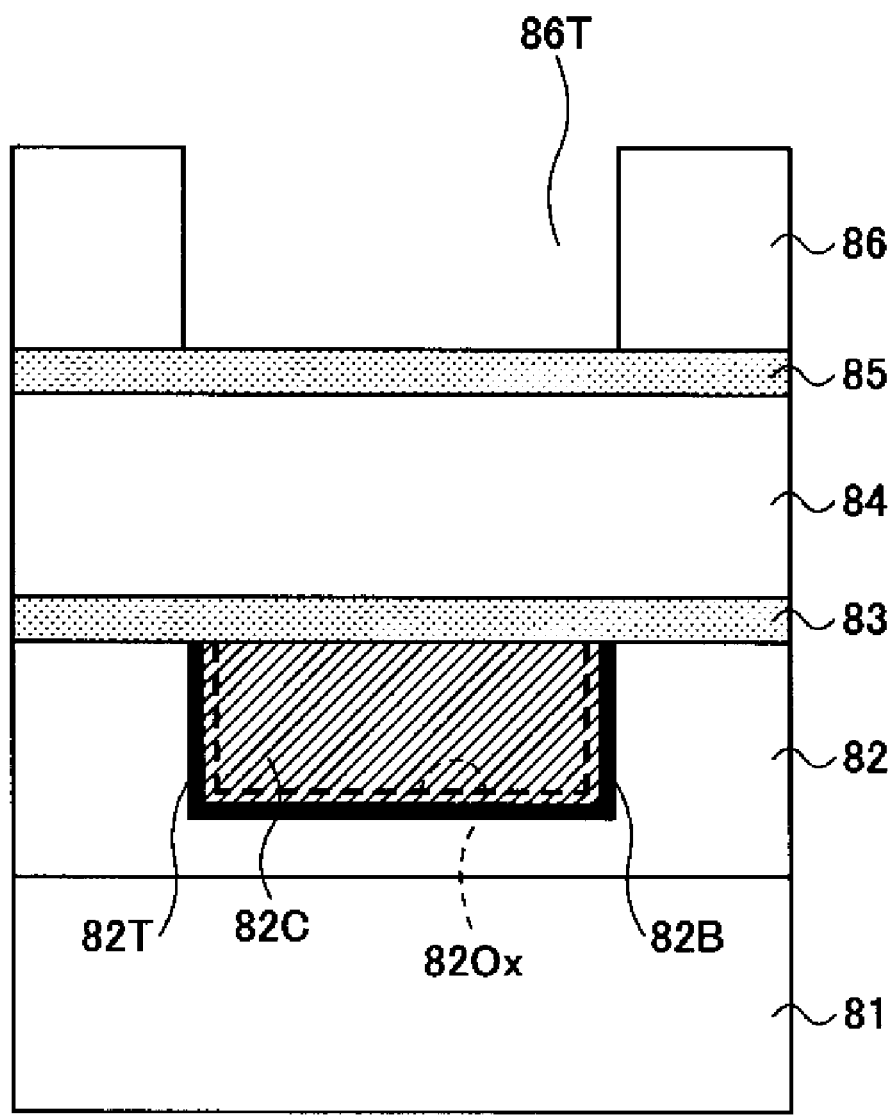
Figure 19H:
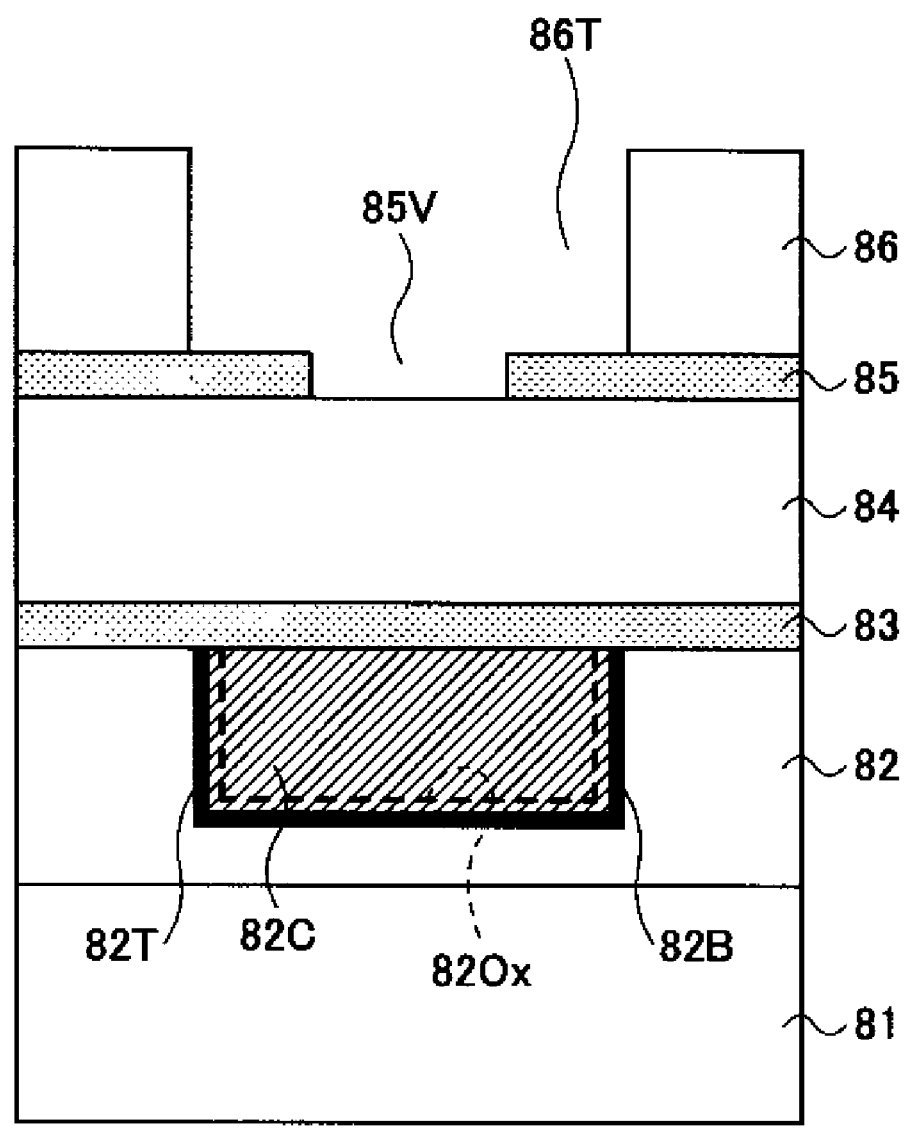
Figure 19I:
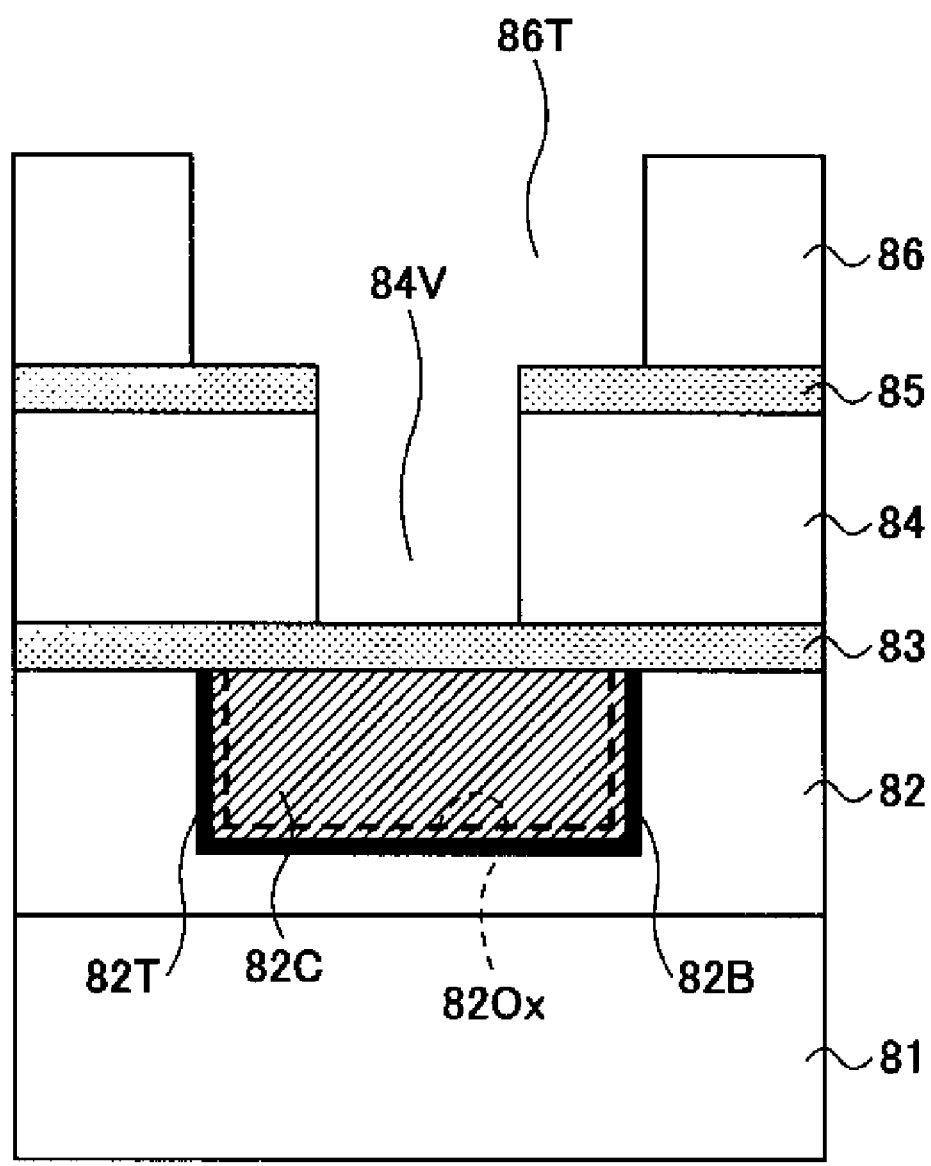
Figure 19J:
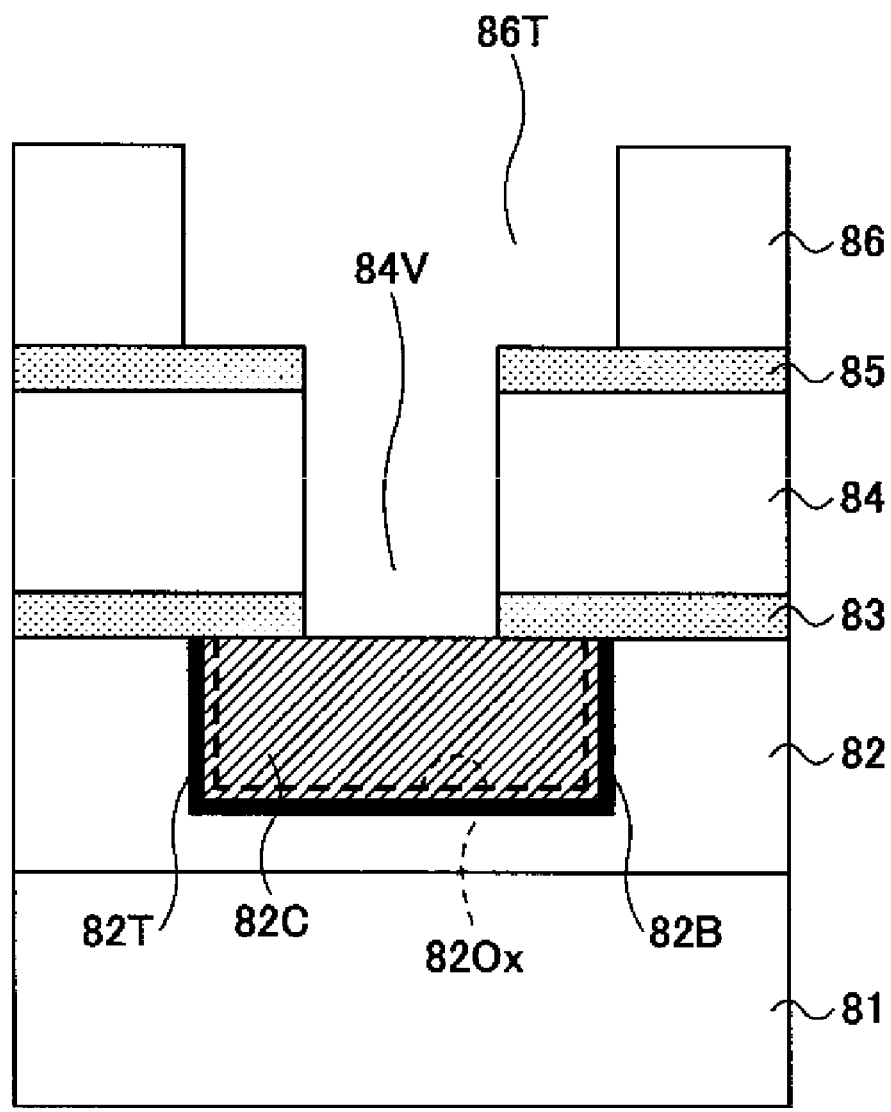
Figure 19K:
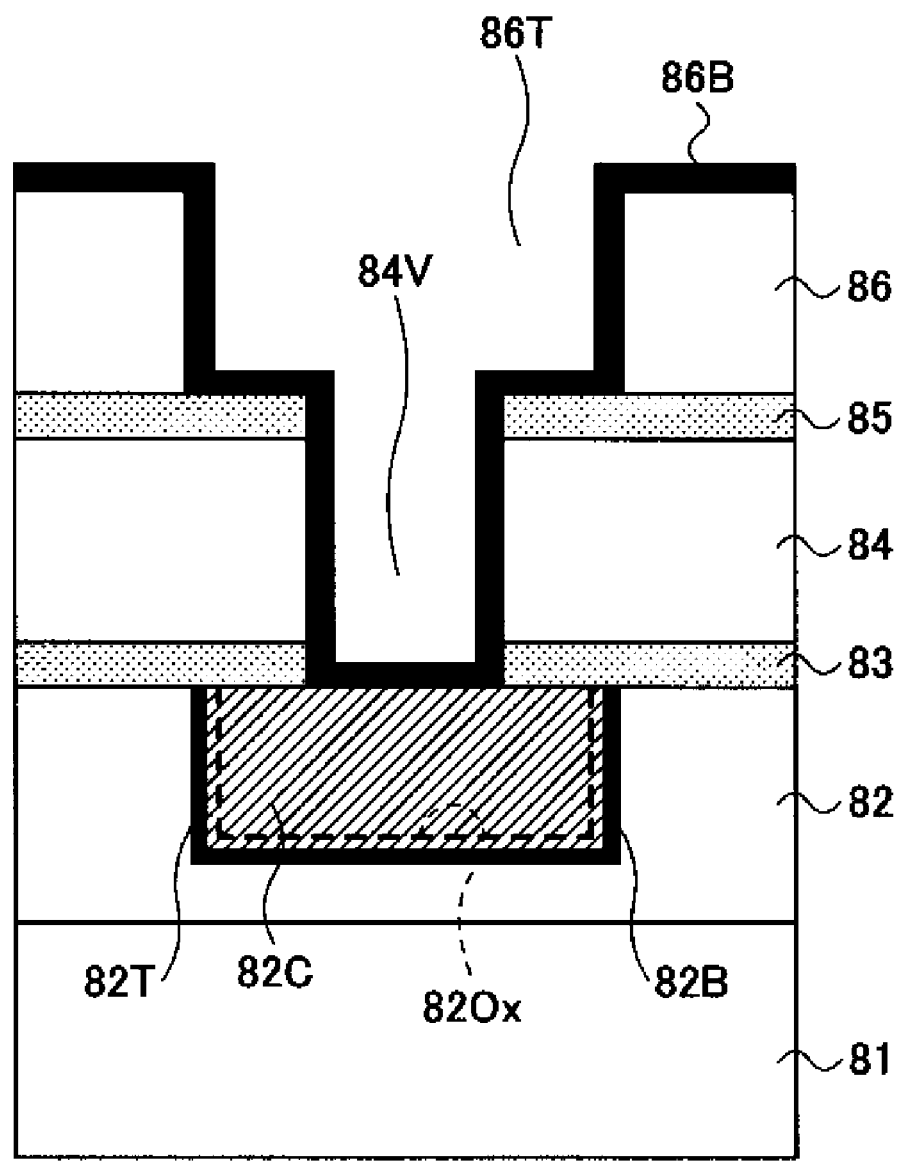
Figure 19L:
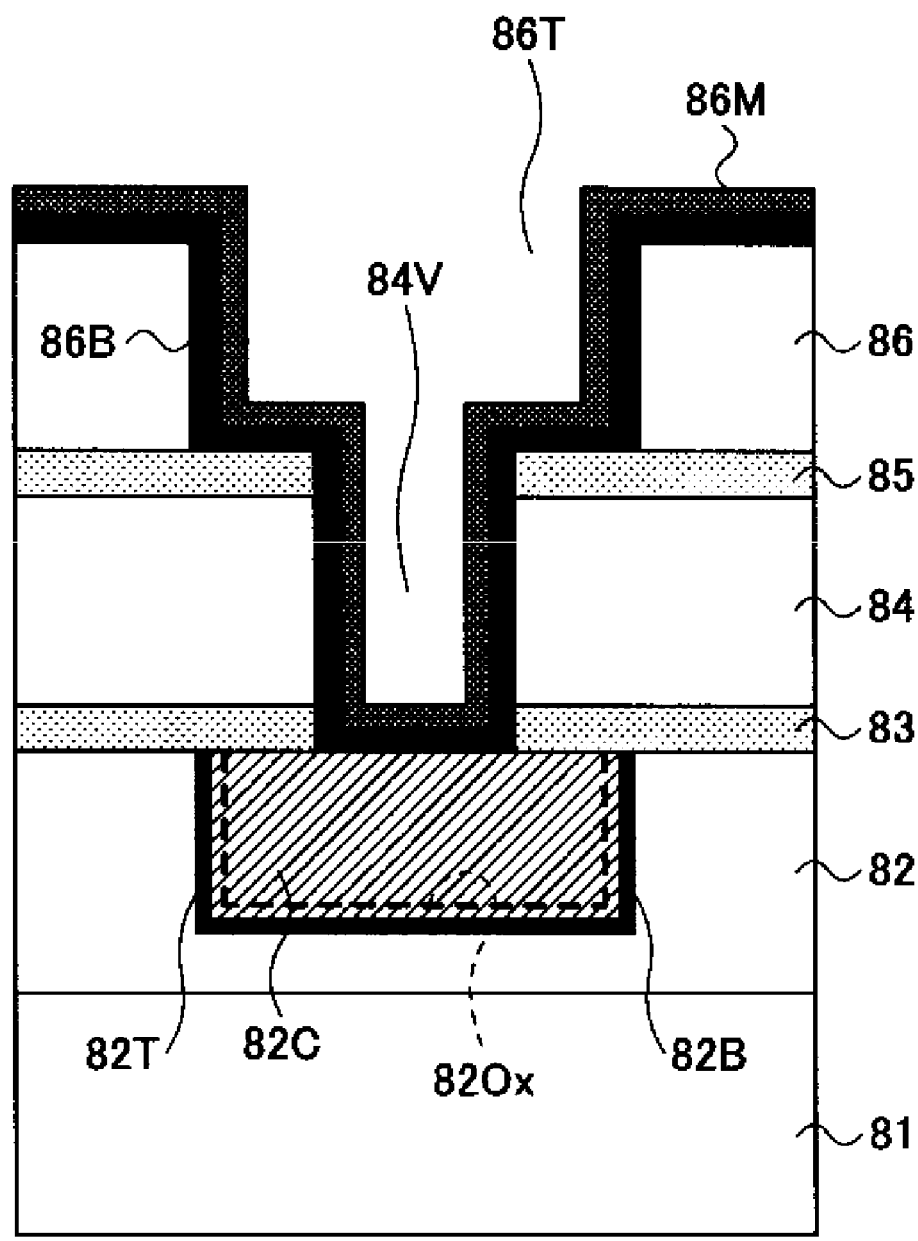
Figure 19M:
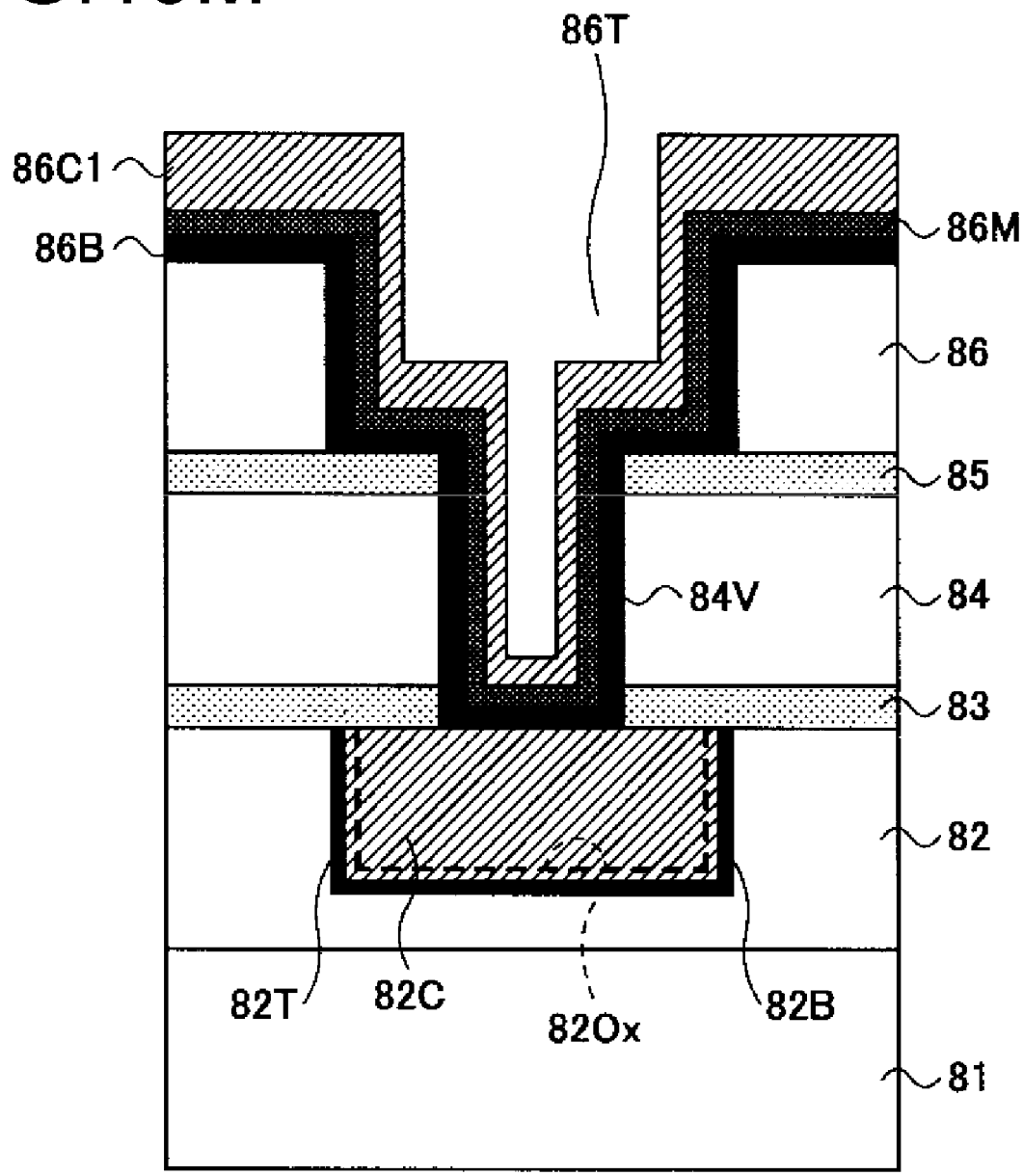
Figure 19N:
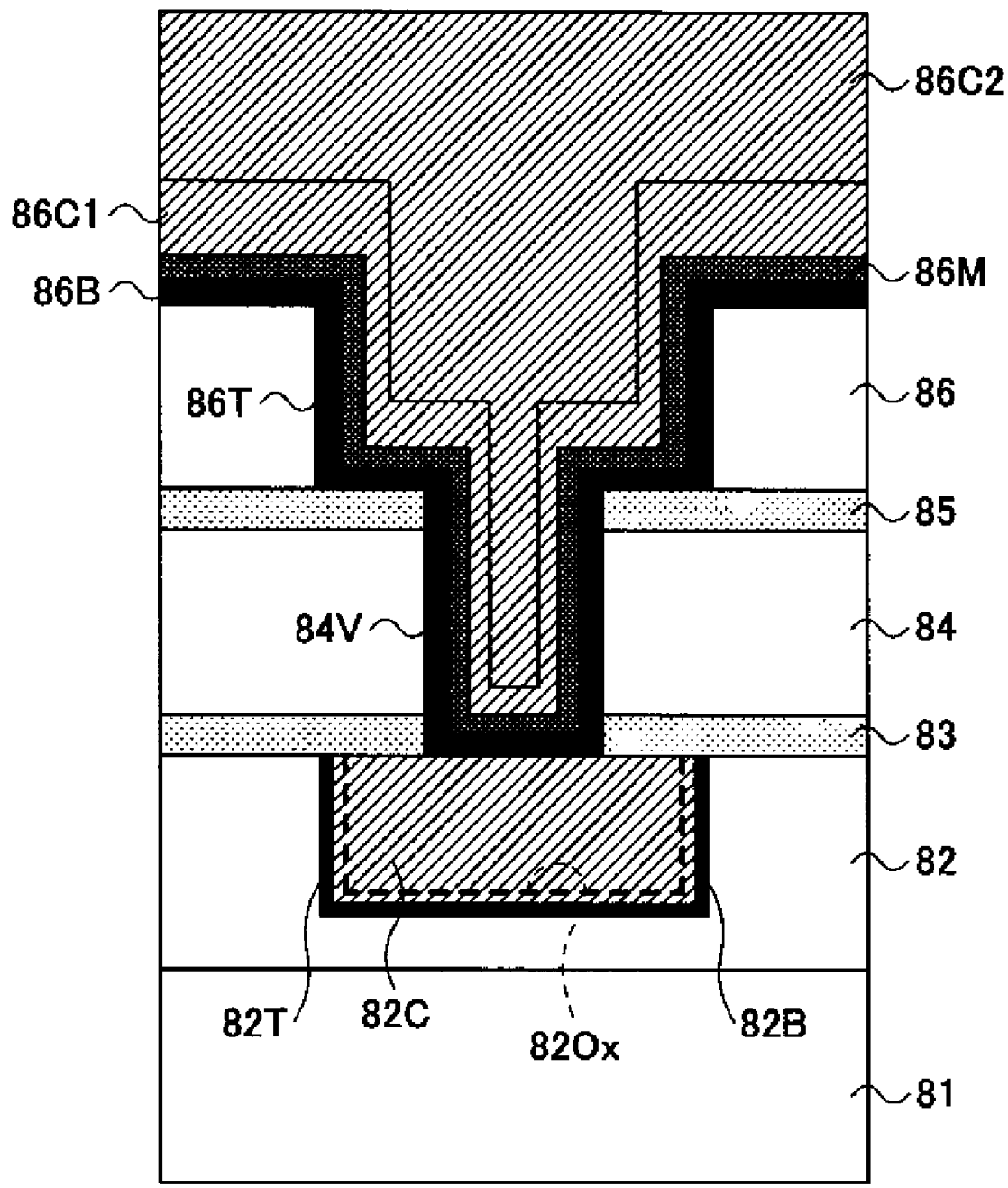
Figure 19O:
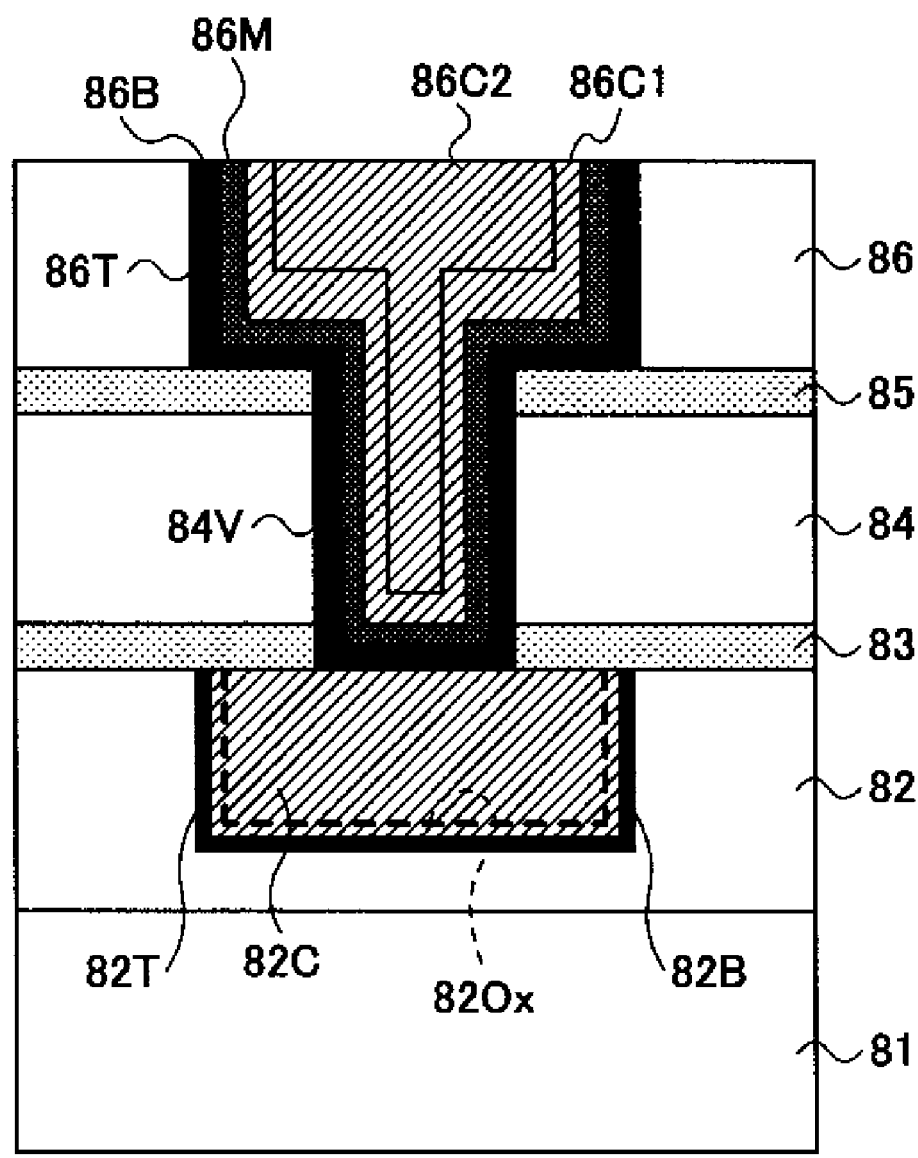
Figure 19P:
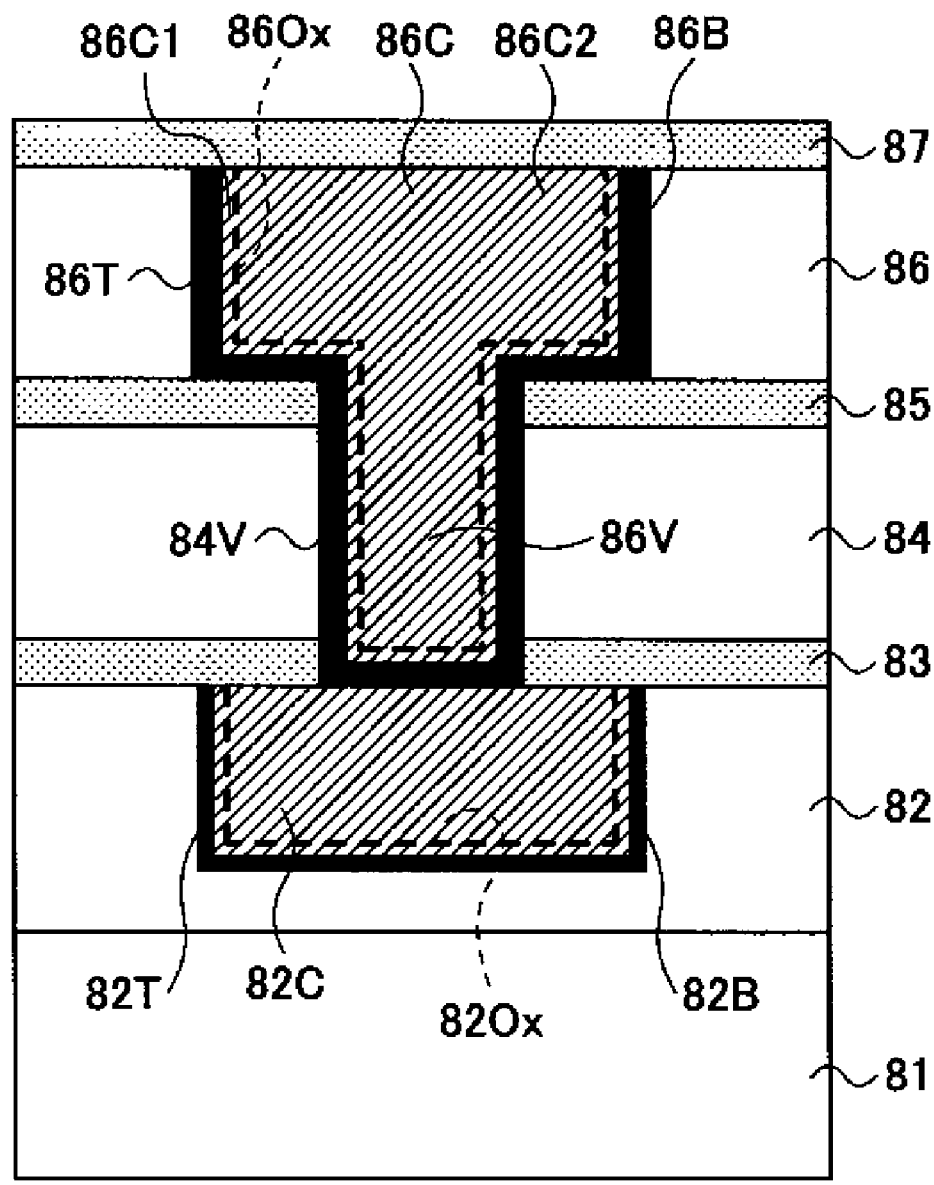

FIG. 19A to FIG. 19P are diagrams showing formation steps of a multilayer interconnection structure by using a dual damascene process, according to a second embodiment of the present invention.

As shown in FIG. 19A, an interconnection groove 82T corresponding to a predetermined interconnection pattern is formed in an insulating film 82 disposed on a semiconductor substrate 81 provided with a transistor and a tungsten plug, which are not shown in the drawing. Furthermore, on the above-described insulating film 82, a barrier metal film 82B in the shape matching the cross-sectional shape of the above-described interconnection groove 82T is formed by a sputtering method, an atomic layer deposition (ALD) method, or the like, the barrier metal film 82B containing at least one high-melting point metal element, e.g., Ta, Ti, Zr, or Ru, covering the side wall surface and the bottom surface of the above-described interconnection groove 82T, and having a film thickness of 1 to 15 nm. The above-described barrier metal film 82B is not limited to the metal film, and may be an electrically conductive metal nitride film of TaN, TiN, or the like besides the metal film containing at least one metal element selected from the group consisting of Ta, Ti, Zr, and Ru.

As shown in FIG. 19B, a Mn-containing Cu—Mn alloy layer 82M in the shape matching the cross-sectional shape of the above-described interconnection groove 82T is formed on the above-described barrier metal film 82B shown in FIG. 19A by a sputtering method, in which, for example, a Cu—Mn alloy target is used, in an Ar atmosphere at $10^{-1}$ Pa and a substrate temperature of lower than or equal to room temperature while 10 kW of plasma power is put in so as to have any thickness, for example, 30 nm.

In the step shown in FIG. 19B, in the case where the Mn concentration in the thus formed Cu—Mn alloy layer 82M is about 30 atomic percent or less, for example, between 0.2 atomic percent and 30 atomic percent, the film thickness of the above-described Cu—Mn alloy layer 82M is adjusted by an etching treatment, e.g., Ar ion etching, in such a way that the film thickness becomes about 15 nm or less on a flat surface, for example, within the range of 0 to 15 nm.

In the case where the Mn concentration in the above-described Cu—Mn alloy layer 82M exceeds 30 atomic percent, the film thickness of the above-described Cu—Mn alloy layer 82M is adjusted by the same etching treatment in such a way that the film thickness on a flat surface becomes less than or equal to the film thickness y given by an equation $y=465/x$, where x represents the atomic concentration of Mn in the above-described Cu—Mn alloy layer 82M.

As shown in FIG. 19C, a Cu film 82C1 in the shape matching the cross-sectional shape of the above-described interconnection groove 82T is formed as a plating seed layer on the above-described structure shown in FIG. 19B by, for example, a sputtering method or a CVD method so as to have a film thickness of about 40 to 80 nm.

As shown in FIG. 19D, a Cu film 82C2 is formed on the above-described structure shown in FIG. 19C by using the above-described Cu film 82C1 as a plating seed layer in such a way as to fill the above-described interconnection groove 82T. Furthermore, as shown in FIG. 19E, the above-described structure shown in FIG. 19D is polished by the CMP method until a surface of the above-described insulating film 82 is exposed. As a result, a structure in which the above-described interconnection groove 82T is filled with the Cu interconnection pattern 82C is obtained.

As shown in FIG. 19F, an etching stopper film 83 composed of SiN or SiC is formed on the structure shown in FIG. 19E in such a way as to cover the above-described Cu interconnection pattern 82C and have a film thickness of 10 to 100 nm. Film formation of such an etching stopper film 83 is conducted typically at a temperature of 400° C. As a result, the above-described Cu film 82C1 and the Cu film 82C2 constituting the above-described Cu interconnection pattern 82C are fused and formed into a single Cu film. By the heat treatment conducted at that time, Mn atoms in the above-described Cu—Mn alloy layer 82M are transferred into the above-described barrier metal film 82B. Along with this, in the above-described Cu interconnection pattern 82C, the original Cu—Mn alloy layer 82M disappears. However, a thin layer of Mn oxide is formed at a position corresponding to the surface of the original Cu—Mn alloy layer 82M and at a distance corresponding to the film thickness of the original Cu—Mn alloy layer 82M from the surface of the above-described barrier metal film 82B, as indicated by a broken line 82Ox shown in FIG. 19F. As a result, the above-described Cu interconnection pattern 82C is formed from a region 82c1 in which the original Cu—Mn alloy layer 82M presented and a region 82c2 in which the original Cu films 82C1 and 82C2 presented.

As shown in FIG. 19G, an interlayer insulating film 84 having a thickness of 100 to 300 nm, an etching stopper film

85 composed of a SiC or SiN film having a thickness of 10 to 100 nm, and an interlayer insulating film 86 having a thickness of 10 to 100 nm are formed sequentially on the above-described structure shown in FIG. 19F by, for example, a plasma CVD method. Furthermore, an interconnection groove 86T for exposing the above-described etching stopper film 85 is formed in the above-described interlayer insulating film 86 by a dry etching process so as to have a desired width. The above-described interlayer insulating films 84 and 86 may be a silicon oxide film formed by a plasma CVD method by using the above-described TEOS as a raw material, or be an organic or inorganic insulating film having a relative dielectric constant of 3 or less formed by the plasma CVD method or a coating method. For example, even when an organic polymer film of registered trademark SILK is used as the above-described interlayer insulating films 84 and 86, these films contain substantial amount of oxygen (moisture) because of damage due to etching or the like.

As shown in FIG. 19H, an opening portion 85V corresponding to a predetermined via hole is formed in the etching stopper film 85 exposed at the above-described interconnection groove 86T. Furthermore, as shown in FIG. 19I, a via hole 84V is formed in the above-described interlayer insulating film 84 by using the above-described etching stopper film 85 as a hard mask in such a way as to expose the above-described etching stopper film 83.

As shown in FIG. 19J, the above-described etching stopper film 83 at the bottom of the above-described via hole 84V is removed so as to expose the Cu interconnection pattern 82C. Thereafter, as shown in FIG. 19K, on the above-described interlayer insulating film 86, a barrier metal film 86B which is composed of Ta or Ti and which is in the shape matching the cross-sectional shape of the above-described interconnection groove 86T and the via hole 84V is formed by a sputtering method or an ALD method in such a way as to cover the side wall surface and the bottom surface of the above-described interconnection groove 86T and the side wall surface and the bottom surface of the above-described via hole 24V continuously and have a film thickness of 1 to 15 nm. The above-described barrier metal film 86B is not limited to the metal film, and may be an electrically conductive metal nitride film of TaN, TiN, or the like besides the metal film containing at least one metal element selected from the group consisting of Ta, Ti, Zr, and Ru.

As shown in FIG. 19L, a Cu—Mn alloy layer 86M in the shape matching the cross-sectional shape of the above-described interconnection groove 86T and the via hole 84V is formed on the above-described structure shown in FIG. 19K by a sputtering method so as to cover the above-described barrier metal film 86B and have a film thickness of 1 to 15 nm.

As shown in FIG. 19M, a Cu layer 86C1 in the shape matching the cross-sectional shape of the above-described interconnection groove 86T and the via hole 84V is formed on the above-described structure shown in FIG. 19L by a sputtering method or a CVD method so as to cover the above-described Cu—Mn alloy layer 86M and have a film thickness of 25 to 65 nm. As shown in FIG. 19N, a Cu layer 86C2 is formed on the above-described structure shown in FIG. 19M by an electroplating method by using the above-described Cu layer 86C1 as a plating seed layer so as to fill the above-described interconnection groove 86T and the via hole 84V.

As shown in FIG. 19O, the above-described Cu layers 86C1 and 86C2, the Cu—Mn alloy layer 86M, and the barrier metal film 86B on the above-described interlayer insulating film 86 are polished and removed by CMP until a surface of the above-described interlayer insulating film 86 is exposed. As shown in FIG. 19P, a cap layer composed of a SiN film or a SiC film is formed on the structure shown in FIG. 19O by a plasma CVD method conducted typically at a substrate temperature of 400° C.

In the above-described interconnection groove 86T and the via hole 84V, the above-described Cu layers 86C1 and the Cu layer 86C2 are fused by the heat accompanying formation of the above-described cap layer 87 and formed into a single Cu interconnection pattern 86C or a Cu via plug 86V continuously extended therefrom.

Furthermore, by the heat accompanying formation of the above-described cap layer 87, Mn atoms in the above-described Cu—Mn alloy layer 86M are transferred to the above-described barrier metal film 86B. The thus transferred Mn atoms deposit stably in the form of Mn oxides on the basis of oxygen from the above-described interlayer insulating films 84 and 86 and the etching stopper films 83 and 85 in the above-described barrier metal film 86B or at an interface between the above-described barrier metal film 86B and the Cu interconnection pattern 86C or the Cu via plug 86V, an interface between the above-described barrier metal film 86B and the interlayer insulating film 84 or 86, or an interface between the above-described barrier metal film 86B and the etching stopper film 83 or 85.

In the case where a defect is present in the above-described barrier metal film 86B, such a defect is self-restored by the thus deposited Mn oxide.

Along with transfer of Mn atoms in the above-described Cu—Mn alloy layer 86M to the above-described barrier metal film 86B as described above, a Mn oxide layer 86Ox corresponding to the oxide layer formed on the surface of the above-described Cu—Mn alloy layer 86M in the above-described step shown in FIG. 19L is formed at a position corresponding to the surface of the original Cu—Mn metal alloy layer 86M and at a distance corresponding to the film thickness of the original Cu—Mn alloy layer 86M from the surface of the above-described barrier metal film 86B. As a result, as shown in FIG. 19P, the above-described Cu interconnection pattern 86C is composed of a Cu layer formed in the region 86c1 in which the original Cu—Mn alloy layer 86M presented and a Cu layer formed in a region 86c2 in which the original Cu layers 86C1 and 86C2 presented.

In the present embodiment as well, the above-described steps are repeated on a semiconductor substrate, e.g., a silicon substrate, provided with transistors and tungsten plugs, and thereby, the above-described semiconductor device 40 as shown in FIG. 18 can be produced.

In the above-described step shown in FIG. 19M of the present embodiment, the above-described interconnection groove 86T and the via hole 84V can also be filled through deposition of a Cu layer at a time, or several by a MOCVD method, for example. In this case, the above-described interconnection groove 86T and the via hole 84V are filled with the Cu layer deposited by the MOCVD method and the electroplating step shown in FIG. 19N can be omitted.

In the above-described formation step of Cu—Mn alloy layer 82M or 86M shown in FIG. 19B or 19L in the present embodiment, it is clear from the above-described relationship shown in FIG. 10 that if the film thickness of the above-described Cu—Mn alloy layer 82M or 86M is specified to be 1 nm or more, and 4.5 nm or less, a Cu—Mn alloy film or a Mn film containing Mn at a concentration of 0.2 atomic percent to 100 atomic percent can be used relative to the above-described Cu—Mn alloy layer 82M or 86M.

Figure 20A:
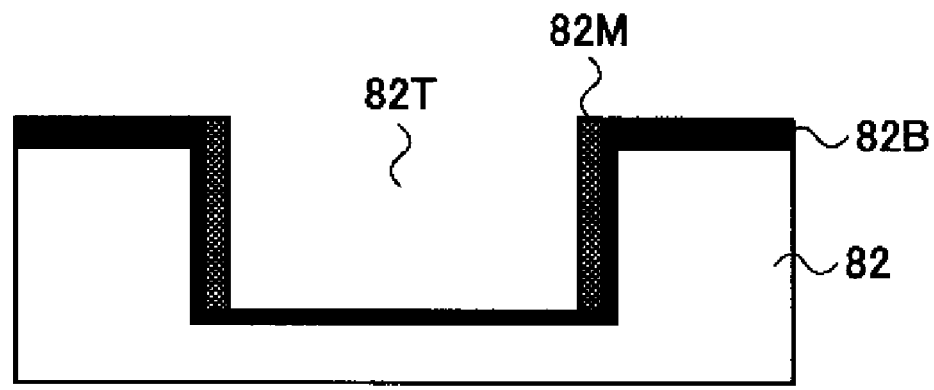
FIGS. 20A to 20B are diagrams showing a modified example of the second embodiment of the present invention.

In the present embodiment, it is also possible to execute the etching step shown in FIG. 19B until the barrier metal film 82B is exposed at the bottom of the above-described interconnection groove 82T, as shown in FIG. 20A.

In this case, the Cu—Mn alloy layer 82M is removed from the bottom of the above-described interconnection groove 82T. In the case where the Mn concentration in the film is 0.2 atomic percent or more, and 30 atomic percent or less, the Cu—Mn alloy layer 82M having the above-described film thickness of 1 to 15 nm is formed merely on the side wall surface of the interconnection groove 82T. In the case where the Mn concentration in the above-described Cu—Mn alloy layer 82M exceeds 30 atomic percent, the above-described Cu—Mn alloy layer 82M is formed in such a way that the film thickness on the above-described side wall surface becomes less than or equal to the film thickness specified by the above-described relationship shown in FIG. 10B, for example, a film thickness within the range of 1 nm or more, and 4.5 nm or less.

Figure 20B:
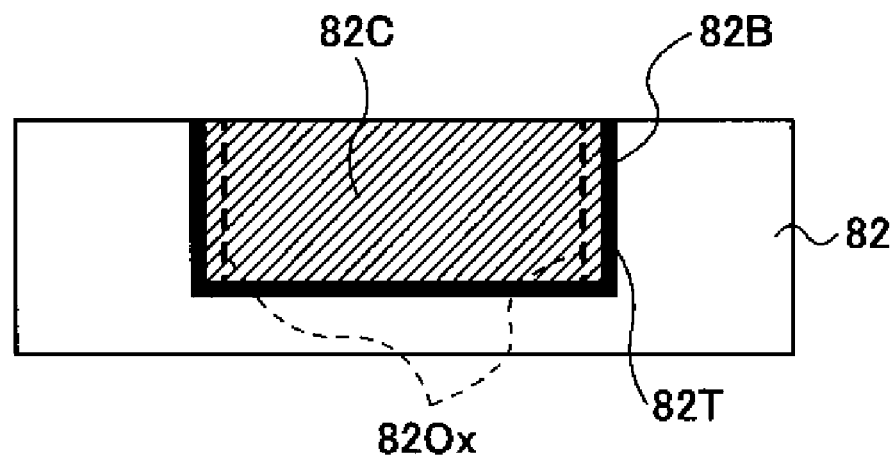

Consequently, in the case where the heat treatment shown in FIG. 19F is conducted, a Mn oxide layer 82Ox showing a trace of presence of the original Cu—Mn alloy layer 82M is formed along the side wall surface of the above-described interconnection groove 82T at a distance corresponding to the film thickness of the above-described Cu—Mn alloy layer 82M from the above-described barrier metal film 82B, as shown in FIG. 20B. The present invention also includes such a structure.

Furthermore, in the present embodiment, the seed Cu film 82C1 in the interconnection groove 82T shown in FIG. 19C and the Cu layer 86C1 in the interconnection groove 86T and the via hole 84V shown in FIG. 19M are formed by the sputtering method. Moreover, in the case where the above-described interconnection groove 82T, the interconnection groove 86T, and the via hole 84V are filled by the electroplating method, the heat treatment at 80° C. to 120° C. is conducted following the plating.

Up to this point, the preferred embodiments of the present invention has been described. However, the present invention is not limited to these specific embodiments. Various modifications and changes can be made within the gist described in Claims.

What is claimed is:

1. A method for manufacturing a semiconductor device, the method comprising:
    forming a transistor having at least a gate electrode and a source and drain region on a semiconductor substrate;
    forming an insulating film containing oxygen over the semiconductor substrate;
    forming a concave portion in the insulating film;
    forming a metal film containing Cu—Mn alloy on an inner wall and a bottom surface of the concave portion and on the insulating film;
    etching the metal film to thin said metal film formed on the inner wall while removing the metal film formed on the insulating film and on the bottom surface of the concave portion;
    forming a copper containing film over the metal film, the copper containing film filling the concave portion; and
    conducting a heat treatment after formation of the film containing copper.

2. The method for manufacturing a semiconductor device according to claim 1, wherein the Mn concentration in the metal film is 0.2 atomic percent to 30 atomic percent and the film thickness is within the range of 1 nm to 15 nm.

3. The method for manufacturing a semiconductor device according to claim 1, wherein the Mn concentration in the metal film is 0.2 atomic percent to 100 atomic percent and the film thickness is 1 nm to 4.5 nm.

4. The method for manufacturing a semiconductor device according to claim 1, further comprising forming a seed film containing copper on the metal film.

5. The method for manufacturing a semiconductor device according to claim 1, wherein the metal film is formed by a sputtering method.

6. The method for manufacturing a semiconductor device according to claim 1, wherein the formation of the copper-containing film filling the concave portion comprises the steps of forming the copper-containing film filling the concave portion by an electroplating method and conducting a heat treatment at a temperature of 80° to 120° after formation of the copper-containing film by the electroplating method.

7. The method for manufacturing a semiconductor device according to claim 1, further comprising forming a diffusion preventing film for preventing a diffusion of copper between the insulating film and the metal film.

8. The method for manufacturing a semiconductor device according to claim 7, wherein the diffusion preventing film is a high-melting point metal film containing at least one element selected from the group consisting of Ta, Ti, Zr, and Ru.

9. The method for manufacturing a semiconductor device according to claim 1, wherein the Mn concentration in the metal film is 0.2 atomic percent to 30 atomic percent and the film thickness is less than or equal to 15 nm.

10. The method for manufacturing a semiconductor device according to claim 9, comprising the step of conducting etching so as to achieve a predetermined film thickness after film formation of the metal film.

11. A method for manufacturing a semiconductor device, the method comprising:
    forming a transistor having a gate electrode and a source and drain region on a semiconductor substrate;
    forming an oxygen-containing insulating film over the semiconductor substrate;
    forming a concave portion in the insulating film;
    forming a metal film containing Cu—Mn alloy on an inner wall and a bottom surface of the concave portion and the insulating film;
    etching the metal film to thin said metal film formed on the inner wall while removing the metal film formed on the insulating film and on the bottom surface of the concave portion;
    forming a copper containing film over the metal film, the copper containing film filling the concave portion; and
    conducting a heat treatment after formation of the copper-containing film,
    wherein the film thickness of the metal film is specified to be 15 nm or less in the case where the Mn concentration x in terms of atomic percent in the metal film is within the range of 0 atomic percent<x<30 atomic percent, and the film thickness is specified to be equal to or less than the film thickness y (nm), where y is given by a formula y=465 (atomic percent·nm)/x in the case where the Mn concentration x is within the range of 30 atomic percent $\leq x \leq$ 100 atomic percent.

12. The method for manufacturing a semiconductor device according to claim 11, wherein the formation of the copper-containing film filling the concave portion comprises the steps of forming the copper-containing film filling the concave portion by an electroplating method and conducting a heat treatment at a temperature of 80° C. to 120° C. after formation of the copper-containing film by the electroplating method.

13. The method for manufacturing a semiconductor device according to claim 11, wherein the heat treatment is conducted for 60 to 250 seconds.

* * * * *